US012685009B2

(12) United States Patent
Park et al.

(10) Patent No.: US 12,685,009 B2
(45) Date of Patent: Jul. 14, 2026

(54) ORGANIC ELECTRONIC DEVICE COMPRISING A SUBSTRATE, AN ANODE LAYER, A CATHODE LAYER, AT LEAST ONE FIRST EMISSION LAYER, AND A HOLE INJECTION LAYER THAT COMPRISES A METAL COMPLEX

(71) Applicant: Novaled GmbH, Dresden (DE)

(72) Inventors: Moo Jin Park, Dresden (DE); Thomas Rosenow, Dresden (DE); Regina Luschtinetz, Dresden (DE); Vladimir Uvarov, Dresden (DE); Jens Angermann, Dresden (DE); Kai Gilge, Dresden (DE); Steffen Runge, Dresden (DE); Annette Steudel, Dresden (DE)

(73) Assignee: Novaled GmbH, Dresden (DE)

( * ) Notice: Subject to any disclaimer, the term of this patent is extended or adjusted under 35 U.S.C. 154(b) by 968 days.

(21) Appl. No.: 17/912,675

(22) PCT Filed: Mar. 19, 2021

(86) PCT No.: PCT/EP2021/057069
§ 371 (c)(1),
(2) Date: Sep. 19, 2022

(87) PCT Pub. No.: WO2021/186023
PCT Pub. Date: Sep. 23, 2021

(65) Prior Publication Data
US 2023/0217677 A1 Jul. 6, 2023

(30) Foreign Application Priority Data
Mar. 20, 2020 (EP) .................................... 20164640

(51) Int. Cl.
*H01L 51/50* (2006.01)
*H10K 50/11* (2023.01)
(Continued)

(52) U.S. Cl.
CPC ........... *H10K 85/371* (2023.02); *H10K 50/11* (2023.02); *H10K 50/17* (2023.02); *H10K 50/814* (2023.02);
(Continued)

(58) Field of Classification Search
CPC ........ H10K 50/10; H10K 50/15; H10K 50/30; H10K 50/113; H10K 50/622;
(Continued)

(56) References Cited

U.S. PATENT DOCUMENTS

2011/0031876 A1* 2/2011 Park .................... H10K 59/876 313/504
2017/0263884 A1 9/2017 Li et al.
(Continued)

FOREIGN PATENT DOCUMENTS

CN 108511628 A 9/2018
EP 3133663 A1 2/2017
(Continued)

OTHER PUBLICATIONS

Dewydari et. al., Wrok Function Measurements on (100) and (110) Surfaces of Silver; Physical Stat. sol. 27, 223 (1975) (Year: 1975).*
(Continued)

*Primary Examiner* — Gregory D Clark
(74) *Attorney, Agent, or Firm* — Eversheds Sutherland (US) LLP

(57) ABSTRACT

The present invention relates to an organic electronic device comprising a substrate (110), an anode layer (120), a cathode layer (190), at least one first emission layer (150), and a hole injection layer (130), wherein •—the hole injection layer comprises a metal complex, wherein •—the metal complex comprises at least one electropositive metal atom having an electro-negativity value according to Allen of less than 2.4, and •—the metal complex comprises at least one anionic
(Continued)

ligand comprising at least 4 covalently bound atoms; •—the anode layer comprises a first anode sub-layer (121) and a second anode sub-layer (122), wherein •—the first anode sub-layer comprises a first metal having a work function in the range of >4 and <6 eV, and •—the second anode sub-layer comprises a transparent conductive oxide; wherein •—the hole injection layer is arranged between the first emission layer and the anode layer, •—the first anode sub-layer is arranged closer to the substrate, and the second anode sub-layer is arranged closer to the hole injection layer.

27 Claims, 6 Drawing Sheets

(51) Int. Cl.

| | |
|---|---|
| ***H10K 50/17*** | (2023.01) |
| ***H10K 50/814*** | (2023.01) |
| ***H10K 50/818*** | (2023.01) |
| ***H10K 85/30*** | (2023.01) |
| ***H10K 85/60*** | (2023.01) |
| *H10K 50/82* | (2023.01) |
| *H10K 101/30* | (2023.01) |
| *H10K 102/10* | (2023.01) |

(52) U.S. Cl.
CPC ........... *H10K 50/818* (2023.02); *H10K 85/30* (2023.02); *H10K 85/381* (2023.02); *H10K 85/631* (2023.02); *H10K 85/633* (2023.02); *H10K 85/636* (2023.02); *H10K 85/6572* (2023.02); *H10K 85/6574* (2023.02); *H10K 50/82* (2023.02); *H10K 2101/30* (2023.02); *H10K 2102/103* (2023.02)

(58) Field of Classification Search
CPC .. H10K 50/631; H10K 50/155; H10K 50/852; H10K 50/342; H10K 85/342; H10K 85/636; H10K 85/6574; H10K 85/6572
See application file for complete search history.

(56) References Cited

U.S. PATENT DOCUMENTS

| | | | |
|---|---|---|---|
| 2018/0331308 A1 | 11/2018 | Kessler et al. |
| 2019/0181354 A1 | 6/2019 | Shin et al. |

FOREIGN PATENT DOCUMENTS

| | | | |
|---|---|---|---|
| JP | 2014504454 | A | 2/2014 |
| JP | 2018515835 | A | 6/2018 |
| KR | 20160083874 | A | 7/2016 |
| TW | 201936615 | A | 9/2019 |
| WO | 2018047853 | A1 | 3/2018 |

OTHER PUBLICATIONS

Winter; Web Elements Periodic Table Copper electronegativity (2025): The University of Sheffield). (Year: 2025).*

International Search Report and Written Opinion issued in international application No. PCT/EP2021/057069, mailed Apr. 28, 2021, 55 pp.

Anonymous: CuPc, Copper(II) Phthalocyanine | CAS 147-14-8 | Buy Online | Ossila, Nov. 26, 2020, Retrieved from the Internet: URL: https://www.ossila.com/products/cupc?variant=7182931585.

C. Finazzo et al., Matrix effects on copper(ii)phthalocyanine complexes. A combined continuous wave and pulse EPR and DFT study, Physical Chemistry Chemical Physics, vol. 8, No. 16, Mar. 15, 2006, pp. 1942.

Communication pursuant to Article 94(3) EPC issued in European application No. 21712526.9, dated Jun. 26, 2025 (8 pages).

Karthikeyan, Chedarampet S. et al., Key aspects of individual layers in solid-state dye-sensitized solar cells and novel concepts to improve their performance, Inorganica Chimica Acta 361 (2008) 635-655.

Lee, Sang-Mok et al., Asymmetric ITO/Ag/ZTO and ZTO/Ag/ITO anodes prepared by roll-to-roll sputtering for flexible organic light-emitting diodes, Surface & Coatings Technology 343 (2018) 115-120.

International Preliminary Report on Patentability issued in international application No. PCT/EP2021/057069, mailed Sep. 20, 2022, 12 pp.

* cited by examiner

ORGANIC ELECTRONIC DEVICE COMPRISING A SUBSTRATE, AN ANODE LAYER, A CATHODE LAYER, AT LEAST ONE FIRST EMISSION LAYER, AND A HOLE INJECTION LAYER THAT COMPRISES A METAL COMPLEX

CROSS-REFERENCE TO RELATED APPLICATIONS

This application is a U.S. national phase application of PCT/EP2021/057069, filed Mar. 19, 2021, which claims priority to European Patent Application No. 20164640.3, filed Mar. 20, 2020. The content of these applications is incorporated herein by reference.

TECHNICAL FIELD

The present invention relates to an organic electronic device comprising a substrate, an anode layer, a cathode layer, at least a first emission layer, and a hole injection layer that comprises a metal complex.

BACKGROUND ART

Organic electronic devices, such as organic light-emitting diodes OLEDs, which are self-emitting devices, have a wide viewing angle, excellent contrast, quick response, high brightness, excellent operating voltage characteristics, and color reproduction. A typical OLED comprises an anode layer, a hole injection layer HIL, a hole transport layer HTL, an emission layer EML, an electron transport layer ETL, and a cathode layer, which are sequentially stacked on a substrate. In this regard, the HIL, the HTL, the EML, and the ETL are thin films formed from organic compounds.

When a voltage is applied to the anode and the cathode, holes injected from the anode move to the EML, via the HIL and HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has low operating voltage, excellent efficiency and/or a long lifetime.

Performance of an organic light emitting diode may be affected by characteristics of the hole injection layer, and among them, may be affected by characteristics of the hole transport compound and the metal complexes which are contained in the hole injection layer.

WO2017029370 relates to metal amides of general Formula Ia and for their use as hole injection layer (HIL) for an Organic light-emitting diode (OLED), and a method of manufacturing Organic light-emitting diode (OLED) comprising an hole injection layer containing a defined metal amide.

WO2017029366 relates to a hole injection layer for an OLED comprising a triarylamine compound doped with a charge neutral metal amide compound, characterized in that the hole injection layer has a thickness of at least about ≥20 nm to about ≤1000 nm and a defined charge neutral metal amide compound.

WO2017102861 relates to an organic electronic component comprising at least one organic layer, which has a fluorinated sulphonamide metal salt of the following formula 1: (1) wherein M is either a bivalent or higher-order metal having an atomic mass of greater than 26 g/mol or a monovalent metal having an atomic mass of greater than or equal to 39 g/mol, wherein 1≤n≤7, and wherein R1, R2 are selected independently of each other and from a group comprising a fluoride-substituted aryl radical, a fluoride-substituted alkyl radical, and a fluoride-substituted arylalkyl radical.

There remains a need to improve performance of organic electronic devices by providing hole injection layers with improved performance, in particular to achieve improved operating voltage through improving the characteristics of the hole injection layer and the organic electronic device.

Further there remains a need to provide hole injection layers which enable injection into adjacent layers comprising compounds with a HOMO level further away from vacuum level.

It is a further objective to provide a hole injection layer comprising compounds which can be deposited through vacuum thermal evaporation under conditions suitable for mass production.

DISCLOSURE

An aspect of the present invention provides an organic electronic device comprising a substrate, an anode layer, a cathode layer, at least one first emission layer, and a hole injection layer, wherein

- the hole injection layer comprises a metal complex, wherein
  - the metal complex comprises at least one electropositive metal atom having an electro-negativity value according to Allen of less than 2.4, and
  - the metal complex comprises at least one anionic ligand comprising at least 4 covalently bound atoms;
- the anode layer comprises a first anode sub-layer and a second anode sub-layer, wherein
  - the first anode sub-layer comprises a first metal having a work function in the range of ≥4 and ≤6 eV, and
  - the second anode sub-layer comprises a transparent conductive oxide (TCO);

wherein

- the hole injection layer is arranged between the first emission layer and the anode layer,
- the first anode sub-layer is arranged closer to the substrate, and
- the second anode sub-layer is arranged closer to the hole injection layer.

According to one embodiment the organic electronic device comprising a substrate, an anode layer, a cathode layer, at least one first emission layer, and a hole injection layer, wherein

- the hole injection layer comprises a metal complex, wherein
  - the metal complex comprises at least one electropositive metal atom having an electro-negativity value according to Allen of less than 2.4, and
  - the metal complex comprises at least one anionic ligand comprising at least 4 covalently bound atoms;
- the anode layer comprises a first anode sub-layer and a second anode sub-layer, wherein
  - the first anode sub-layer comprises a first metal having a work function in the range of ≥4 and ≤6 eV, and
  - the second anode sub-layer comprises a transparent conductive oxide (TCO);

wherein

- the hole injection layer is arranged between the first emission layer and the anode layer, the first anode sub-layer is arranged closer to the substrate, and the second anode sub-layer is arranged closer to the hole injection layer; and wherein the anode layer of the organic electronic device comprises in addition a third anode sub-layer; wherein the third anode sub-layer comprises preferably a transparent conductive oxide, wherein the third anode sub-layer is optional arranged between the substrate and the first anode sub-layer.

According to one embodiment of the organic electronic device, wherein the hole injection layer of the organic electronic device is free of metal phthalocyanine or CuPc, or the layers of the organic electronic device are free of metal phthalocyanine or CuPc. Preferably, the hole injection layer is free of ionic liquids, metal phthalocyanine, CuPc, HAT-CN, Pyrazino[2,3-f][1,10]phenanthroline-2,3-dicarbonitrile, $F_4TCNQ$, metal fluoride and/or metal oxides, wherein the metal in the metal oxide is selected from Re and/or Mo.

Definitions

It should be noted that throughout the application and the claims any $A^n$, $Ar^n$, $R^n$, $T^n$ etc. always refer to the same moieties, unless otherwise noted.

In the present specification, when a definition is not otherwise provided, "substituted" refers to one substituted with a deuterium, $C_1$ to $C_{12}$ alkyl and $C_1$ to $C_{12}$ alkoxy.

In the present specification, when a definition is not otherwise provided, a substituted aryl group with at least 6 C-ring atoms can be substituted with 1, 2, 3, 4 or 5 substituents. For example a substituted $C_6$ aryl group may have 1, 2, 3, 4 or 5 phenyl substituents.

However, in the present specification "aryl substituted" refers to a substitution with one or more aryl groups, which themselves may be substituted with one or more aryl and/or heteroaryl groups.

Correspondingly, in the present specification "heteroaryl substituted" refers to a substitution with one or more heteroaryl groups, which themselves may be substituted with one or more aryl and/or heteroaryl groups.

In the present specification, when a definition is not otherwise provided, a substituted heteroaryl group with at least 2 C-ring atoms can be substituted with one or more substituents. For example a substituted $C_2$ heteroaryl group may have 1 or 2 substituents.

In the present specification, when a definition is not otherwise provided, an "alkyl group" refers to a saturated aliphatic hydrocarbyl group. The alkyl group may be a $C_1$ to $C_{12}$ alkyl group. More specifically, the alkyl group may be a $C_1$ to $C_{10}$ alkyl group or a $C_1$ to $C_6$ alkyl group. For example, a $C_1$ to $C_4$ alkyl group includes 1 to 4 carbons in alkyl chain, and may be selected from methyl, ethyl, propyl, iso-propyl, n-butyl, iso-butyl, sec-butyl, and tert-butyl.

Specific examples of the alkyl group may be a methyl group, an ethyl group, a propyl group, an iso-propyl group, a butyl group, an iso-butyl group, a sec-butyl group, a tert-butyl group, a pentyl group, a branched pentyl group, a hexyl group.

The term "cycloalkyl" refers to saturated hydrocarbyl groups derived from a cycloalkane by formal abstraction of one hydrogen atom from a ring atom comprised in the corresponding cycloalkane. Examples of the cycloalkyl group may be a cyclopropyl group, a cyclobutyl group, a cyclopentyl group, a cyclohexyl group, a methyl cyclohexyl group, an adamantly group and the like.

The term "hetero" is understood the way that at least one carbon atom, in a structure which may be formed by covalently bound carbon atoms, is replaced by another polyvalent atom. Preferably, the heteroatoms are selected from B, Si, N, P, O, S; more preferably from N, P, O, S.

Preferred examples of the hole transport compounds, which can be covalent hole transport compounds, are organic compounds, consisting substantially from covalently bound C, H, O, N, S, which may optionally comprise also covalently bound B, P or Si. In one embodiment, the hole transport compounds, which can be a covalent compound, is free of metal atoms and majority of its skeletal atoms may be selected from C, O, S, N. Alternatively, the covalent compound is free of metal atoms and majority of its skeletal atoms may be selected from C and N.

In the present specification, "aryl group" and "aromatic rings" refers to a hydrocarbyl group which can be created by formal abstraction of one hydrogen atom from an aromatic ring in the corresponding aromatic hydrocarbon. Aromatic hydrocarbon refers to a hydrocarbon which contains at least one aromatic ring or aromatic ring system. Aromatic ring or aromatic ring system refers to a planar ring or ring system of covalently bound carbon atoms, wherein the planar ring or ring system comprises a conjugated system of delocalized electrons fulfilling Hückel's rule. Examples of aryl groups include monocyclic groups like phenyl or tolyl, polycyclic groups which comprise more aromatic rings linked by single bonds, like biphenyl, and polycyclic groups comprising fused rings, like naphthyl or fluorenyl.

Analogously, under "heteroaryl" and "heteroaromatic", it is especially where suitable understood a group derived by formal abstraction of one ring hydrogen from a heterocyclic aromatic ring in a compound comprising at least one such ring.

The term "non-heterocycle" is understood to mean a ring or ring-system comprising no hetero-atom as a ring member.

The term "heterocycle" is understood to mean that the heterocycle comprises at least one ring comprising one or more hetero-atoms. A heterocycle comprising more than one ring means that all rings comprising a hetero-atom or at least one ring comprising a hetero atom and at least one ring comprising C-atoms only and no hetero atom.

Under heterocycloalkyl, it is especially where suitable understood a group derived by formal abstraction of one ring hydrogen from a saturated cycloalkyl ring in a compound comprising at least one such ring.

The term "fused aryl rings" or "condensed aryl rings" is understood the way that two aryl rings are considered fused or condensed when they share at least two common sp2-hybridized carbon atoms.

The term "fused ring system" is understood to mean a ring system wherein two or more rings share at least two atoms.

The term "5-, 6- or 7-member ring" is understood to mean a ring comprising 5, 6 or 7 atoms. The atoms may be selected from C and one or more hetero-atoms.

In the present specification, the single bond refers to a direct bond.

In the present specification, when a definition is not otherwise provided, "substituted" refers to one substituted with a H, deuterium, $C_1$ to $C_{12}$ alkyl, unsubstituted $C_6$ to $C_{18}$ aryl, and unsubstituted $C_3$ to $C_{18}$ heteroaryl.

In the present specification, when a substituent is not named, the substituent can be a H.

In the context of the present invention, "different" means that the compounds do not have an identical chemical structure.

The term "free of", "does not contain", "does not comprise" does not exclude impurities which may be present in the compounds prior to deposition. Impurities have no technical effect with respect to the object achieved by the present invention.

The term "contacting sandwiched" refers to an arrangement of three layers whereby the layer in the middle is in direct contact with the two adjacent layers.

The terms "light-absorbing layer" and "light absorption layer" are used synonymously. The terms "light-emitting layer", "light emission layer" and "emission layer" are used synonymously.

The terms "OLED", "organic light-emitting diode" and "organic light-emitting device" are used synonymously.

The terms anode, anode layer and anode electrode are used synonymously.

The term "at least two anode sub-layers" is understood to mean two or more anode sub-layers, for example two or three anode sub-layers. The terms cathode, cathode layer and cathode electrode are used synonymously.

The term "hole injection layer" is understood to mean a layer which improves charge injection from the anode layer into further layers in the organic electronic device or from further layers of the organic electronic device into the anode.

The term "hole transport layer" is understood to mean a layer which transports holes between the hole injection layer and further layers arranged between the hole injection layer and the cathode layer.

The operating voltage U is measured in Volt.

In the context of the present specification the term "essentially non-emissive" or "non-emissive" means that the contribution of the matrix compound of formula (II) or formula (III), metal complex and/or layer, such as hole injection layer, to the visible emission spectrum from an organic electronic device, such as OLED or display device, is less than 10%, preferably less than 5% relative to the visible emission spectrum. The visible emission spectrum is an emission spectrum with a wavelength of about ≥380 nm to about ≤780 nm.

In the specification, hole characteristics refer to an ability to donate an electron to form a hole when an electric field is applied and that a hole formed in the anode may be easily injected into the emission layer and transported in the emission layer due to conductive characteristics according to a highest occupied molecular orbital (HOMO) level.

In addition, electron characteristics refer to an ability to accept an electron when an electric field is applied and that electrons formed in the cathode may be easily injected into the emission layer and transported in the emission layer due to conductive characteristics according to a lowest unoccupied molecular orbital (LUMO) level.

The term "HOMO level" is understood to mean the highest occupied molecular orbital and is determined in eV (electron volt).

The term "HOMO level further away from vacuum level" is understood to mean that the absolute value of the HOMO level is higher than the absolute value of the HOMO level of the reference compound. For example, the term "further away from vacuum level than the HOMO level of N2,N2,N2',N2', N7,N7,N7',N7'-octakis (4-methoxyphenyl)-9,9'-spirobi[fluorene]-2,2',7,7'-tetraamine is understood to mean that the absolute value of the HOMO level of the matrix compound of the hole injection layer is higher than the HOMO level of N2,N2,N2',N2', N7,N7,N7',N7'-octakis (4-methoxyphenyl)-9,9'-spirobi[fluorene]-2,2',7,7'-tetraamine.

The term "absolute value" is understood to mean the value without the "-" symbol. According to one embodiment of the present invention, the HOMO level of the matrix compound of the hole injection layer may be calculated by quantum mechanical methods.

The work function of the first metal is measured in eV (electron volt). Tabulated values of work functions can be found for example in CRC Handbook of Chemistry and Physics version 2008, p. 12-114. Further, tabulated values of work functions can be found for example at https://en.wikipedia.org/wiki/Work_function#cite_note-12.

Advantageous Effects

Surprisingly, it was found that the organic electronic device according to the invention solves the problem underlying the present invention by enabling organic electronic devices, such as organic light-emitting diodes, in various aspects superior over the organic electronic devices known in the art, in particular with respect to operating voltage.

Additionally, it was found that the problem underlying the present invention can be solved by providing compounds which may be suitable for deposition through vacuum thermal evaporation under conditions suitable for mass production. In particular, the rate onset temperature of the metal complex and the matrix compound of the present invention may be in a range suitable for mass production.

According to another embodiment the organic electronic device comprising a substrate, an anode layer comprising at least two anode sublayers or more, a cathode layer, at least one first emission layer, and a hole injection layer, wherein the hole injection layer comprises a metal complex, wherein the metal complex has the formula (I):

$$M^{n\oplus}(L^{\ominus})_n \quad \text{(I)}.$$

wherein

M is a metal ion, n is the valency of M,

L is a ligand comprising at least 4 covalently bound atoms, wherein at least two atoms are selected from carbon atoms, n is an integer from 1 to 4, and wherein the charge neutral form of M has an electro-negativity value according to Allen of less than 2.4;

the anode layer comprises a first anode sub-layer and a second anode sub-layer, wherein the first anode sub-layer comprises a first metal having a work function in the range of ≥4 and <6 eV, the second anode sub-layer comprises a transparent conductive oxide (TCO);

wherein the hole injection layer is arranged between the first emission layer and the anode layer, the first anode sub-layer is arranged closer to the substrate, and the second anode sub-layer is arranged closer to the hole injection layer.

It should be noted that the ligand L have a negative charge.

According to one embodiment the negative charge of the Ligand L may correspond to the valency of the metal ion M.

According to another embodiment the organic electronic device comprising a substrate, an anode layer comprising at least two anode sublayers or more, a cathode layer, at least one first emission layer, and a hole injection layer, wherein the hole injection layer comprises a metal complex, wherein the metal complex has the formula (I):

$$M^{n\oplus}(L^{\ominus})_n \quad \text{(I)}.$$

wherein

M is a metal ion, n is the valency of M,

L is a ligand comprising at least 4 covalently bound atoms, wherein at least two atoms are selected from carbon atoms, n is an integer from 1 to 4, and wherein the charge neutral form of M has an electro-negativity value according to Allen of less than 2.4;

the anode layer comprises a first anode sub-layer and a second anode sub-layer, wherein the first anode sub-layer comprises a first metal having a work function in the range of ≥4 and ≤6 eV, the second anode sub-layer comprises a transparent conductive oxide (TCO);

wherein the hole injection layer is arranged between the first emission layer and the anode layer, the first anode sub-layer is arranged closer to the substrate, and the second anode sub-layer is arranged closer to the hole injection layer; and wherein the anode layer of the organic electronic device comprises in addition a third anode sub-layer; wherein the third anode sub-layer comprises preferably a transparent conductive oxide, wherein the third anode sub-layer is optional arranged between the substrate and the first anode sub-layer.

According to one embodiment of the organic electronic device, wherein the hole injection layer of the organic electronic device is free of Cu phthalocyanine or the layers of the organic electronic device are free of Cu phthalocyanine. Preferably, the hole injection layer is free of ionic liquids, metal phthalocyanine, CuPc, HAT-CN, Pyrazino[2,3-f][1,10]phenanthroline-2,3-dicarbonitrile, $F_4TCNQ$, metal fluoride and/or metal oxides, wherein the metal in the metal oxide is selected from Re and/or Mo.

First Anode Sub-Layer

According to one embodiment, the first metal of the first anode sub-layer may have a work function in the range of ≥4.2 and ≤6 eV. The first metal may be selected from a metal or a metal alloy.

According to one embodiment, wherein the first metal of the first anode sub-layer may be selected from the group comprising Ag, Mg, Al, Cr, Pt, Au, Pd, Ni, Nd, Ir, preferably Ag, Au or Al, and more preferred Ag.

The first anode sub-layer may have a thickness in the range of 5 to 200 nm, alternatively 8 to 180 nm, alternatively 8 to 150 nm, alternatively 100 to 150 nm.

The first anode sub-layer may formed by depositing the first metal via vacuum thermal evaporation.

It is to be understood that the first anode layer is not part of the substrate.

Second Anode Sub-Layer

According to one embodiment, the transparent conductive oxide may be selected from the group comprising indium tin oxide (ITO) or indium zinc oxide (IZO), more preferred indium tin oxide (ITO). preferably ITO or IZO.

The first anode sub-layer may have a thickness in the range of 3 to 200 nm, alternatively 3 to 180 nm, alternatively 3 to 150 nm, alternatively 3 to 20 nm.

The second anode sub-layer may be formed by sputtering of the transparent conductive oxide.

Third Anode Sub-Layer

According to one embodiment the anode layer of the organic electronic device may comprises at least three anode sub-layers of a first anode sub-layer, a second anode sub-layer and third anode sub-layer. According to one embodiment the anode layer of the organic electronic device may comprises in addition to the first and second anode sub-layers a third anode sub-layer, wherein the third anode sub-layer comprises a transparent conductive oxide, wherein the third anode sub-layer may be arranged between the substrate and the first anode sub-layer.

The third anode sub-layer may have a thickness in the range of 3 to 200 nm, alternatively 3 to 180 nm, alternatively 3 to 150 nm, alternatively 3 to 20 nm.

The third anode sub-layer may be formed by sputtering of the transparent conductive oxide.

It is to be understood that the third anode layer is not part of the substrate.

Anode Layer

According to one embodiment, the anode layer may comprise a first anode sub-layer comprising or consisting of Ag or Au, a second anode-sub-layer comprising or consisting of ITO or IZO and optionally a third anode sub-layer comprising or consisting of ITO or IZO. Preferably the first anode sub-layer may comprises or consists of Ag, the second anode-sublayer may comprises or consists of ITO and the third anode sub-layer may comprises or consists of ITO. Preferably, the transparent conductive oxide in the second and third anode sub-layer may be selected the same.

According to one embodiment, the anode layer may comprise a first anode sub-layer comprising Ag or Au having a thickness of 100 to 150 nm, a second anode-sub-layer comprising ITO or IZO having a thickness of 3 to 20 nm and a third anode sub-layer comprising ITO or IZO having a thickness of 3 to 20 nm.

M of the Metal Complex of Formula (I)

The metal complex according to formula (I) is non-emissive. In the context of the present specification the term "essentially non-emissive" or "non-emissive" means that the contribution of the metal complex according to formula (II) to the visible emission spectrum from an organic electronic device, such as OLED or display device, is less than 10%, preferably less than 5% relative to the visible emission spectrum. The visible emission spectrum is an emission spectrum with a wavelength of about ≥380 nm to about ≤780 nm.

According to one embodiment of the present invention, the valency n of M of the metal complex according to formula (I) is 1 or 2.

The term "electronegativity value according to Allen" especially refers to Allen, Leland C. (1989). "Electronegativity is the average one-electron energy of the valence-shell electrons in ground-state free atoms". Journal of the American Chemical Society 111 (25): 9003-9014.

According to one embodiment, wherein M of the metal complex of formula (I) may be selected from a metal ion wherein the corresponding metal has an electronegativity value according to Allen of less than 2.4, preferably M may be selected from an alkali, alkaline earth, rare earth, transition metal, a metal with an atomic mass ≥24 Da. Preferably M may be selected from a metal with an atomic mass ≥24 Da and M has an oxidation number ≥2. Further preferred, M may be selected from an alkali metal, alkaline earth metal, transition metal, or group III or V metal.

The alkali metals may be selected from the group comprising Li, Na, K or Rb. The alkaline earth metals may be selected from the group comprising Mg, Ca, Sr or Ba. The transition metals may be selected from Sc, Y, La, Ti, Zr, V, Nb, Ta, Cr, Mo, W, Mn, Re, Fe, Co, Ni, Cu, Ag. Au or Zn. The group III and V metal may be selected from the group comprising Bi and Al.

According to one embodiment of the present invention, M is selected from Li, Na, K. Mg, Mn, Cu, Zn, Ag. Bi and Mo; preferably M is selected from Na, K, Mg. Mn, Cu, Zn, Ag and Bi; also preferred M is selected from Na, K, Mg, Mn, Cu, Zn, Ag and Bi, wherein if M is Cu, n is 2.

According to one embodiment, wherein the metal complex of formula (I) may be an Bi(III) metal complex or an Al(III) metal complex, preferably a Bi(III) complex.

According to one embodiment, wherein the metal complex of formula (I) may be a Cu(II) metal complex, a Ag(I) metal complex or a Zn(II) metal complex, preferably a Cu(II) metal complex or a Ag(I) metal complex.

According to one embodiment of the present invention, M is selected from an alkali, alkaline earth, rare earth or transition metal, alternatively M is selected from alkali, alkaline earth, transition or a group III metal.

According to one embodiment of the present invention, M is not Li. According to one embodiment of the present invention, M is not Ag. According to one embodiment of the present invention, M is not Cu.

According to one embodiment, wherein the metal complex of formula (I) may have a molecular weight Mw of ≥287 g/mol and ≤2000 g/mol, preferably a molecular weight Mw of ≥400 g/mol and ≤1500 g/mol, further preferred a molecular weight Mw of ≥580 g/mol and ≤1500 g/mol, in addition preferred a molecular weight Mw of ≥580 g/mol and ≤1400 g/mol Ligand L of Formula (I)

According to one embodiment, wherein the ligand L in compound of formula (I) may be selected from a group comprising:

- at least three carbon atoms, alternatively at least four carbon atoms, and/or
- at least two oxygen atoms or one oxygen and one nitrogen atom, two to four oxygen atoms, two to four oxygen atoms and zero to two nitrogen atoms, and/or
- at least one or more groups selected from halogen, F, CN, substituted or unsubstituted $C_1$ to $C_6$ alkyl, substituted or unsubstituted $C_1$ to $C_6$ alkoxy, alternatively two or more groups selected from halogen, F, CN, substituted or unsubstituted $C_1$ to $C_6$ alkyl, substituted or unsubstituted $C_1$ to $C_6$ alkoxy, at least one or more groups selected from halogen, F, CN, substituted $C_1$ to $C_6$ alkyl, substituted $C_1$ to $C_6$ alkoxy, alternatively two or more groups selected from halogen, F, CN, perfluorinated $C_1$ to $C_6$ alkyl, perfluorinated $C_1$ to $C_6$ alkoxy, one or more groups selected from substituted or unsubstituted $C_1$ to $C_6$ alkyl, substituted or unsubstituted $C_6$ to $C_{12}$ aryl, and/or substituted or unsubstituted $C_3$ to $C_{12}$ heteroaryl,
  - wherein the substituents are selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^3$, $COOR^3$, halogen, F or CN;
    - wherein $R^3$ may be selected from $C_6$ aryl, $C_3$ to $C_6$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

According to one embodiment, wherein the metal complex according to formula (I) is non-emissive.

According to one embodiment, wherein n in formula (I) is an integer from 1 to 4, preferably 1 to 3, also preferred 2 or 3.

According to one embodiment, wherein the ligand L of formula (I) may be selected from G1 to G66:

(G1)

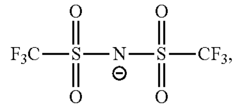

(G2)

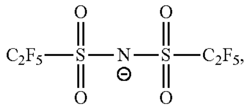

(G3)

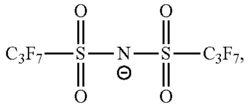

(G4)

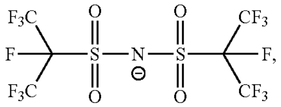

(G5)

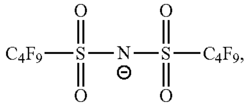

(G6)

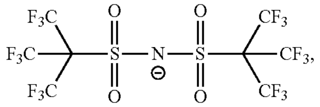

(G7)

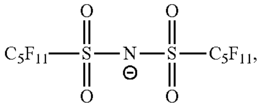

(G8)

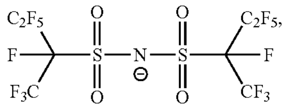

(G9)

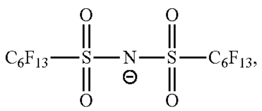

(G10)

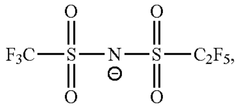

(G11)

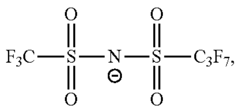

-continued
(G12)
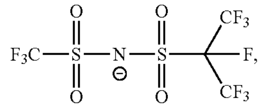
(G13)
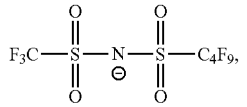
(G14)
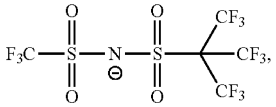
(G15)
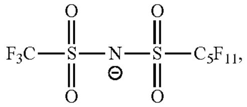
(G16)
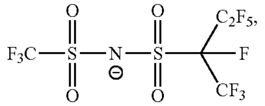
(G17)
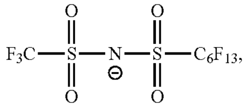
(G18)
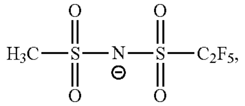
(G19)
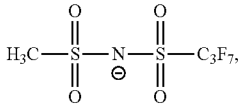
(G20)
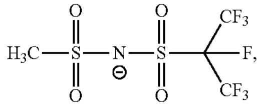
(G21)
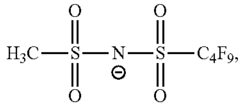
(G22)
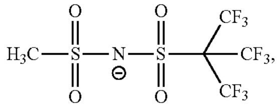
(G23)
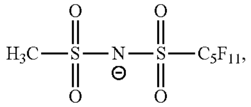
(G24)
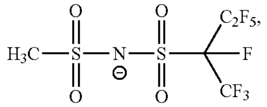
-continued
(G25)
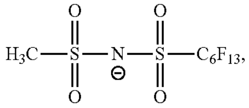
(G26)
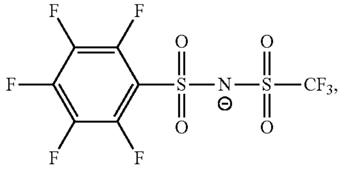
(G27)
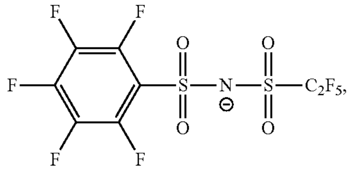
(G28)
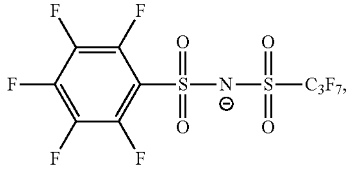
(G29)
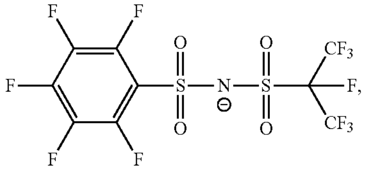
(G30)
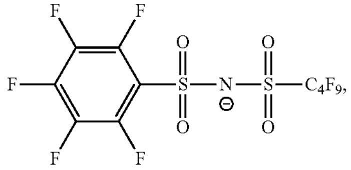
(G31)
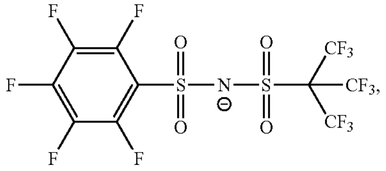
(G32)
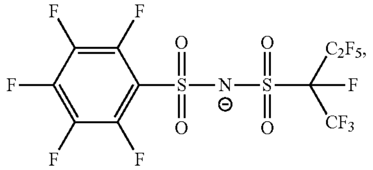
(G33)
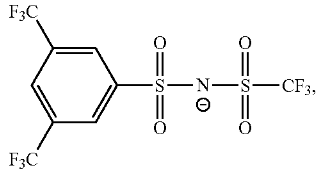

-continued
(G34)
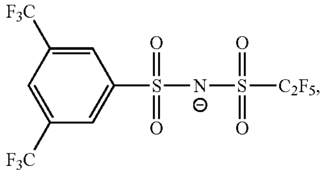
(G35)
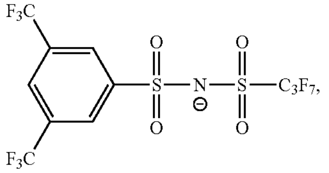
(G36)
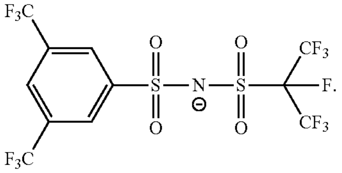
(G37)
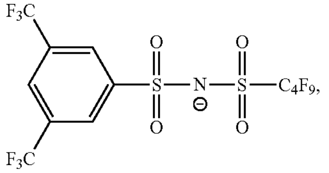
(G38)
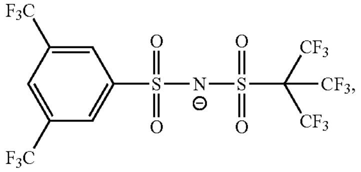
(G39)
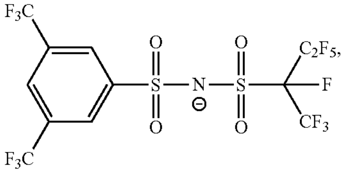
(G40)
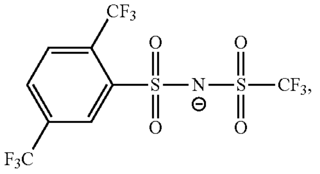
(G41)
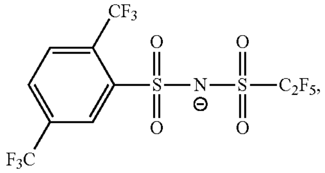
-continued
(G42)
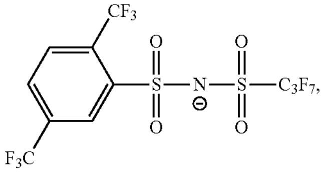
(G43)
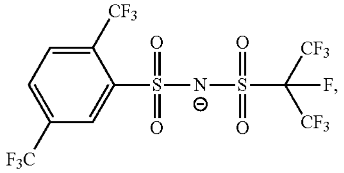
(G44)
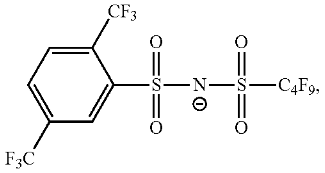
(G45)
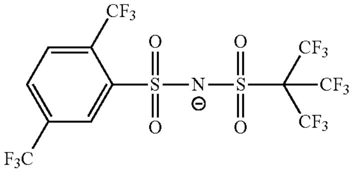
(G46)
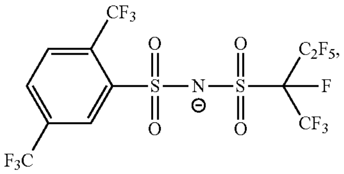
(G47)
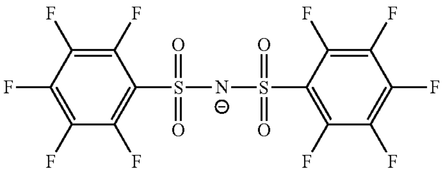
(G48)
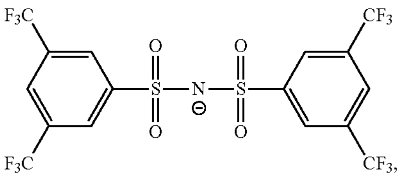
(G49)
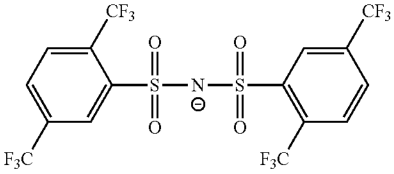

-continued (G50)

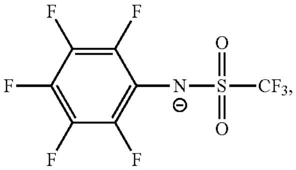

(G51)

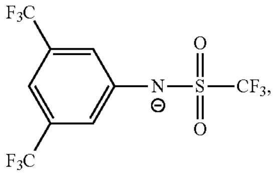

(G52)

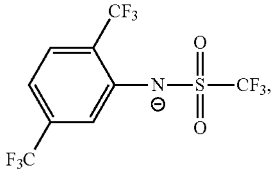

(G53)

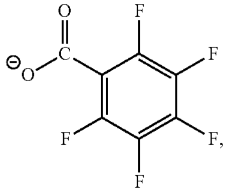

(G54)

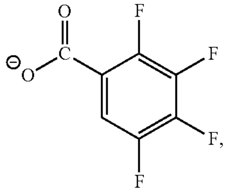

(G55)

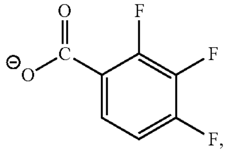

(G56)

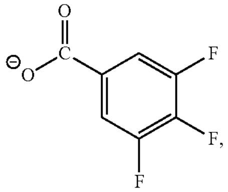

(G57)

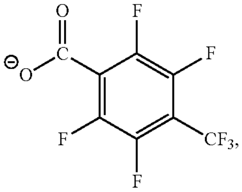

-continued (G58)

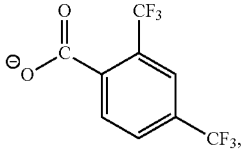

(G59)

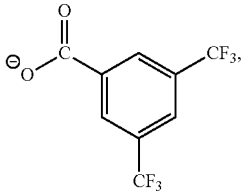

(G60)

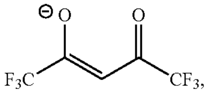

(G61)

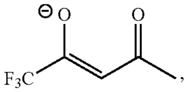

(G62)

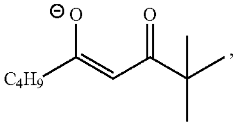

(G63)

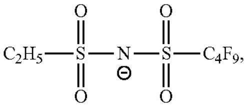

(G64)

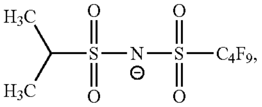

(G65)

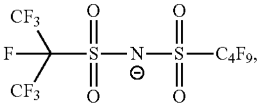

(G66)

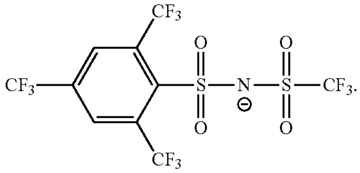

According to one embodiment, L of formula (I) is selected from (G1) to (G59), preferably from (G2) to (G59).

According to one embodiment, L of formula (I) is selected from (G1) to (G52), preferably from (G2) to (G52).

According to one embodiment, L of formula (I) is selected from (G1) to (G49), preferably from (G2) to (G49).

According to one embodiment, L of formula (I) is selected from (G50) to (G52).

According to one embodiment, L of formula (I) is selected from (G53) to (G59).

According to one embodiment, L of formula (I) is selected from (G2) to (G49) and (G63) to (G66).

According to one embodiment, wherein the metal complex of the hole injection layer may be selected from the following formulas (Ia) to (Id):

(Ia)

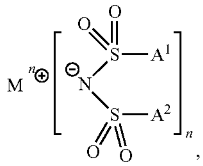, (Ib)

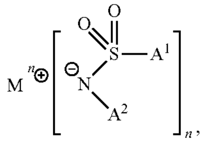

(Ic)

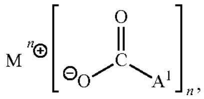

(Id)

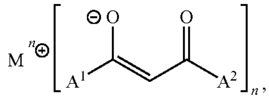

wherein

M is a metal ion;

n is the valency of M;

$A^1$ and $A^2$ may be independently selected from substituted or unsubstituted $C_1$ to $C_{12}$ alkyl, substituted or unsubstituted $C_6$ to $C_{12}$ aryl, substituted or unsubstituted $C_3$ to $C_{12}$ heteroaryl;

wherein the substituents of $A^1$ and $A^2$ may be independently selected from D, $C_6$ aryl, $C_3$ to Co heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^1$, $COOR^1$, halogen, F or CN, wherein $R^1$ may be selected from $C_6$ aryl, $C_3$ to Co heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

According to one embodiment, wherein $A^1$ and $A^2$ may be selected different.

The negative charge in compounds of formulas (I), (Ia) to (Id), may be delocalised partially or fully over the $N(SO_2)_2$ group, $NSO_2$ group or $CO_2$ group or CO group and optionally also over the $A^1$ and $A^2$ groups.

According to one embodiment of the present invention, the substituents on $A^1$ and $A^2$ are independently selected from halogen, with F especially preferred, $C_1$ to $C_3$ perhalogenated, especially perfluorinated alkyl or alkoxy, or $-(O)_1-C_mH_{2m}-C_nHal_{n2n+1}$ with 1=0 or 1, especially 0, m=1 or 2, especially 1 and n=1 to 3, especially n=1 or 2 and Hal=halogen, especially F.

According to one embodiment of the present invention, at least one of $A^1$ and $A^2$ is substituted alkyl and the substituents of the alkyl moiety are fluorine with the number $n_F$ (of fluorine substituents) and $n_H$ (of hydrogens) follow the equation: $n_F > n_H + 2$.

According to one embodiment of the present invention, at least one of $A^1$ and $A^2$ is selected from perfluorinated $C_1$ to $C_6$ alkyl and/or phenyl substituted with F or $CF_3$.

According to one embodiment of the present invention, at least one of $A^1$ and $A^2$ is selected from perfluorinated alkyl or aryl.

According to one embodiment of the present invention, the sum of $A^1$ and $A^2$ comprise ≥3 carbon atoms and ≤25 carbon atoms, or ≥4 carbon atoms and ≤24 carbon atoms, or ≥5 carbon atoms and ≤18 carbon atoms.

According to one embodiment of the present invention, at least one of $A^1$ and $A^2$ is substituted $C_3$ to $C_6$ alkyl.

According to one embodiment of the present invention, at least one of $A^1$ and $A^2$ is substituted $C_3$ to $C_6$ linear or cyclic alkyl.

According to one embodiment of the present invention, compound of formula (I) is free of alkoxy, $COR^1$ and/or $COOR^1$ groups.

According to one embodiment of the present invention, $A^2$ is aryl or heteroaryl, whereby the substituents of the aryl and/or heteroaryl moiety are selected from hydrogen, halogen, F, CN or trifluoro methyl.

According to one embodiment of the present invention $A^2$ is phenyl or six-membered heteroaryl, which is substituted with 1 to 5 F atoms.

According to one embodiment of the present invention, $A^1$ is substituted or unsubstituted $C_1$ to $C_6$ alkyl or substituted phenyl and $A^2$ is substituted $C_3$ to $C_6$ alkyl; alternatively, $A^1$ is substituted or unsubstituted $C_1$ to $C_4$ alkyl or substituted phenyl and $A^2$ is substituted $C_3$ to $C_4$ alkyl or substituted phenyl.

According to one embodiment, wherein the metal complex of the hole injection layer may be selected from the following formulas (Ia) to (Id), wherein at least one of $A^1$ and $A^2$ may comprises a substituent, wherein at least one of the substituents of $A^1$ and $A^2$ may be independently selected from $C_3$ to $C_9$ heteroaryl, $C_1$ to $C_6$ alkoxy, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkoxy, $COR^1$, $COOR^1$, halogen, F or CN; preferably at least one of $A^1$ and $A^2$ may comprises at least two substituents, wherein the substituents on $A^1$ and $A^2$ may be independently selected from $C_3$ to $C_9$ heteroaryl, $C_1$ to $C_6$ alkoxy, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkoxy, $COR^1$, $COOR^1$, halogen, F or CN; and further preferred $A^1$ and $A^2$ comprise at least one substituent independently selected from halogen, F, $CF_3$, $C_2F_5$, $C_3F_7$, $C_4F_9$, $OCF_3$, $OC_2F_5$, or CN; and in addition preferred $A^1$ and $A^2$ may comprise at least two substituents independently selected from halogen, F, $CF_3$, $C_2F_5$, $C_3F_7$, $C_4F_9$, $OCF_3$, $OC_2F_5$ or CN.

According to one embodiment, wherein the metal complex of the hole injection layer may be selected from the following formulas (Ia), wherein M is selected from Cu and n is 2 and/or M is Ag and n is 1; $A^1$ and $A^2$ may be independently selected from substituted or unsubstituted Cito $C_{12}$ alkyl, substituted or unsubstituted $C_6$ to $C_{12}$ aryl, substituted or unsubstituted $C_3$ to $C_{12}$ heteroaryl; wherein at least one of $A^1$ and $A^2$ may comprises a substituent, wherein at least one of the substituents of $A^1$ and $A^2$ may be independently selected from $C_3$ to $C_6$ heteroaryl, $C_1$ to $C_6$ alkoxy, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkoxy, $COR^1$, $COOR^1$, halogen, F or CN; preferably at least one of $A^1$ and $A^2$ may comprises at least two substituents, wherein the substituents on $A^1$ and $A^2$ may be independently selected from $C_3$ to $C_9$ heteroaryl, $C_1$ to $C_6$ alkoxy, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkoxy, $COR^1$, $COOR^1$, halogen, F or CN; and further preferred $A^1$ and $A^2$ comprise at least one substituent independently selected from halogen, F, $CF_3$, $C_2F_5$, $C_3F_7$, $C_4F_9$, $OCF_3$, $OC_2F_5$, or CN; and in addition preferred $A^1$ and $A^2$ may comprise at least two substituents independently selected from halogen, F, $CF_3$, $C_2F_5$, $C_3F_7$, $C_4F_9$, $OCF_3$, $OC_2F_5$ or CN.

Preferably, the sum of $A^1$ and $A^2$ comprise ≥3 carbon atoms and ≤25 carbon atoms.

According to one embodiment, wherein the metal complex of formula (I) is selected from: Li TFSI, K TFSI, Cs TFSI, Ag TFSI, $Mg(TFSI)_2$, $Mn(TFSI)_2$, $Sc(TFSI)_3$, $Mg[N(SO_2{}^iC_3F_7)_2]_2$. $Zn[N(SO_2{}^iC_3F_7)_2]_2$, $Ag[N(SO_2{}^iC_3F_7)_2]$, $Ag[N(SO_2C_3F_7)_2]$. $Ag[N(SO_2C_4F_9)_2]$. $Ag[N(SO_2CF_3)(SO_2C_4F_9)]$, $Cs[N(SO_2C_4F_9)_2]$, $Mg[N(SO_2C_4F_9)_2]_2$. $Ca[N(SO_2C_4F_9)_2]_2$, $Ag[N(SO_2C_4F_9)_2]$, $Cu[N(SO_2{}^iC_3P_7)_2]_2$, $Cu[N(SO_2C_3F_7)_2]_2$, $Cu[N(SO_2CF_3)(SO_2C_4F_9)]_2$. $Mg[N(SO_2CF_3)(SO_2C_4F_9)]_2$, $Mn[N(SO_2CF_3)(SO_2C_4F_9)]_2$, $Cu[N(SO_2CH_3)(SO_2C_4F_9)]_2$. $Ag[N(SO_2CH_3)(SO_2C_4F_9)]$,

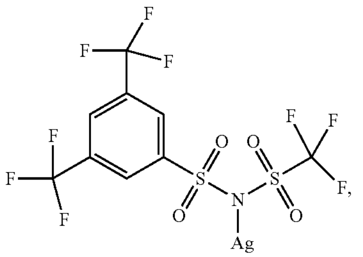

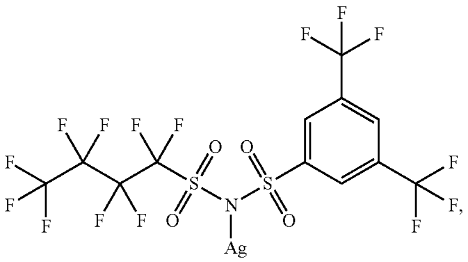

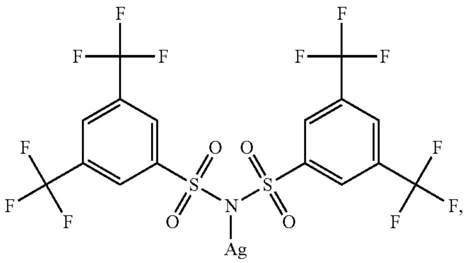

-continued

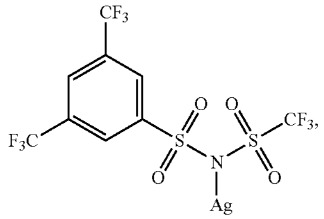

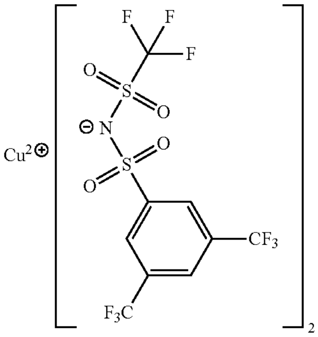

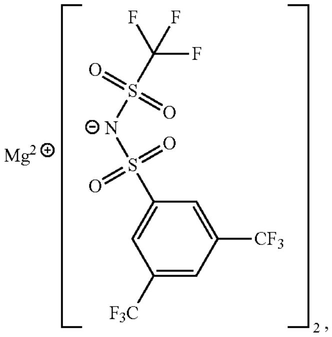

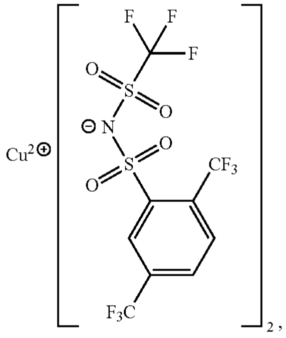

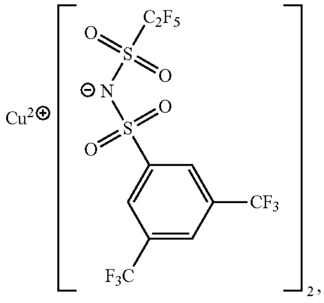

-continued

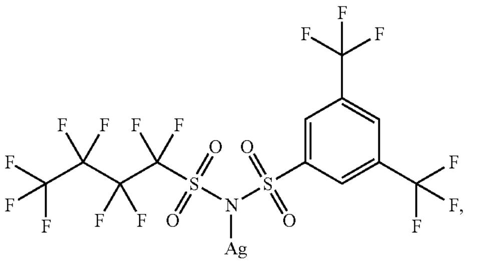

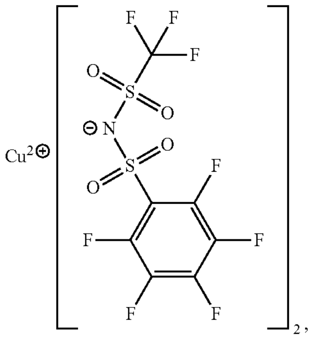

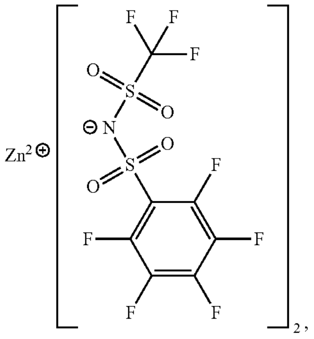

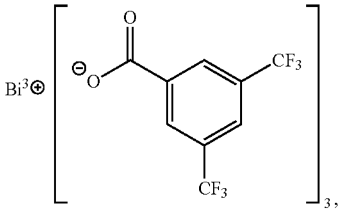

$Cu[N(SO_2C_2H_5)(SO_2C_4F_9)]_2$, $Cu[N(SO_2{}^{i}C_3H_7)(SO_2C_4F_9)]_2$, $Cu[N(SO_2{}^{i}C_3P_7)(SO_2C_4F_9)]_2$,

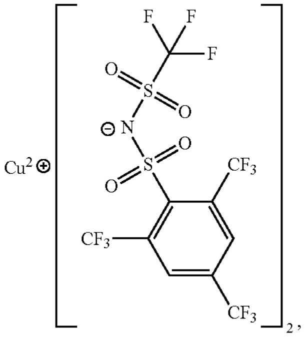

-continued

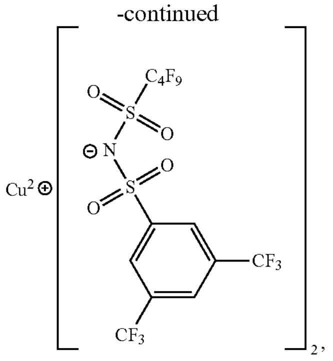

wherein "$^i$" denotes "iso". For example, "$^iC_3F_7$" denotes iso-heptafluoropropyl.

Matrix Compound of the Hole Injection Layer

The hole injection layer may further comprises a substantially covalent matrix compound. According to one embodiment the substantially covalent matrix compound of the hole injection layer may be selected from at least one organic compound. The substantially covalent matrix may consists substantially from covalently bound C, H, O, N, S, which optionally comprise in addition covalently bound B, P, As and/or Se.

According to one embodiment of the organic electronic device, the hole injection layer further comprises a matrix compound, wherein the matrix compound of the hole injection layer may be selected from organic compounds consisting substantially from covalently bound C, H, O, N, S, which optionally comprise in addition covalently bound B, P, As and/or Se.

Organometallic compounds comprising covalent bonds carbon-metal, metal complexes comprising organic ligands and metal salts of organic acids are further examples of organic compounds that may serve as substantially covalent matrix compounds of the hole injection layer.

In one embodiment, the substantially covalent matrix compound lacks metal atoms and majority of its skeletal atoms may be selected from C, O, S, N. Alternatively, the substantially covalent matrix compound lacks metal atoms and majority of its skeletal atoms may be selected from C and N.

According to one embodiment, the substantially covalent matrix compound of the hole injection layer may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

In one embodiment, the HOMO level of the substantially covalent matrix compound may be more negative than the HOMO level of N2,N2,N2',N2',N7,N7,N7',N7'-octakis (4-methoxyphenyl)-9,9'-spirobi[fluorene]-2,2',7,7'-tetraamine (CAS 207739-72-8) when determined under the same conditions.

In one embodiment, the HOMO level of the substantially covalent matrix compound, when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, may be more negative than −4.27 eV, preferably more negative than −4.3 eV, alternatively more negative than −4.5 eV, alternatively more negative than −4.6 eV, alternatively more negative than −4.65 eV.

In one embodiment, the HOMO level of the substantially covalent matrix compound may be more negative than the HOMO level of N2,N2,N2',N2',N7,N7,N7',N7'-octakis (4-methoxyphenyl)-9,9'-spirobi[fluorene]-2,2',7,7'-tetraamine (CAS 207739-72-8) and more positive than the HOMO level of N-([1,1'-biphenyl]-4-yl)-N-(2-(9,9-diphenyl-9H-fluoren-4-yl)phenyl)-9,9-dimethyl-9H-fluoren-2-amine when determined under the same conditions.

In one embodiment of the present invention, the substantially covalent matrix compound may be free of alkoxy groups.

In one embodiment, the HOMO level of the substantially covalent matrix compound, when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, may be selected in the range of <−4.27 eV and ≥−4.84 eV, alternatively in the range of <−4.3 eV and ≥−4.84 eV, alternatively in the range of <−4.5 eV and ≥−4.84 eV, alternatively in the range of <−4.5 eV and ≥−4.84 eV, alternatively in the range of <−4.6 eV and ≥−4.84 eV.

Preferably, the substantially covalent matrix compound comprises at least one arylamine moiety, alternatively a diarylamine moiety, alternatively a triarylamine moiety.

Preferably, the matrix compound of the hole injection layer is free of metals and/or ionic bonds.

Compound of Formula (II) or a Compound of Formula (III)

According to another aspect of the present invention, the at least one matrix compound, also referred to as "substantially covalent matrix compound", of the hole injection layer may comprises at least one arylamine compound, diarylamine compound, triarylamine compound, a compound of formula (II) or a compound of formula (III):

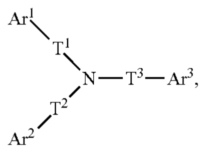

(II)

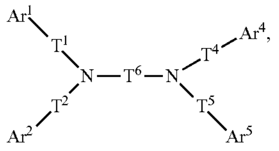

(III)

wherein:

$T^1$, $T^2$, $T^3$, $T^4$ and $T^5$ are independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, Art and $Ar^5$ are selected the same or different from the group comprising H, D, F, $C(—O)R^2$, CN, $Si(R^2)_3$, $P(—O)(R^2)_2$, $OR^2$, $S(—O)R^2$, $S(—O)_2R^2$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R^2$ may be selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to Cis aryl or $C_3$ to $C_{18}$ heteroaryl.

According to an embodiment of the organic electronic device, wherein the matrix compound of the hole injection layer comprises a compound of formula (II) or formula (III):

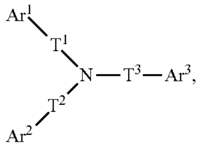

(II)

-continued (III)

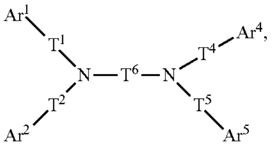

wherein $T^1$, $T^2$, $T^3$, $T^4$ and $T^5$ may be independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$. $Ar^3$, $Ar^4$ and $Ar^5$ may be independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$. $Ar^2$, $Ar^3$, $Ar^4$ and $Ar^5$ are selected the same or different from the group comprising H, straight-chain alkyl having 1 to 20 carbon atoms, branched alkyl having 1 to 20 carbon atoms, cyclic alkyl having 3 to 20 carbon atoms, alkenyl or alkynyl groups having 2 to 20 carbon atoms, alkoxy groups having 1 to 20 carbon atoms, $C_6$ to $C_{18}$ aryl, $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle.

Preferably, the substituents of $Ar^1$, $Ar^2$, $Ar^3$, $Ar^4$ and $Ar^5$ are selected the same or different from the group comprising H, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, alkoxy groups having 1 to 6 carbon atoms, $C_6$ to Cis aryl, $C_3$ to $C_{18}$ heteroaryl, a fused ring system comprising 2 to 4 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle; more preferred the substituents are selected the same or different from the group consisting of H, straight-chain alkyl having 1 to 4 carbon atoms, branched alkyl having 1 to 4 carbon atoms, cyclic alkyl having 3 to 4 carbon atoms and/or phenyl. Thereby, the compound of formula (II) or (III) may have a rate onset temperature suitable for mass production.

According to an embodiment of the organic electronic device, wherein the matrix compound of the hole injection layer comprises a compound of formula (II) or formula (III):

(II)

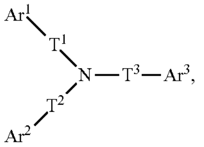

(III)

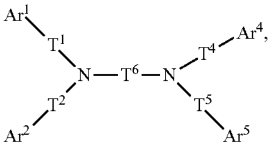

wherein $T^1$, $T^2$, $T^3$, $T^4$ and $T^5$ may be independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ may be independently selected from unsubstituted $C_6$ to $C_{20}$ aryl, or unsubstituted $C_3$ to $C_{20}$ heteroarylene, unsubstituted biphenylene, unsubstituted fluorene, substituted 9-fluorene, substituted 9,9-fluorene, unsubstituted naphthalene, unsubstituted anthracene, unsubstituted phenanthrene, unsubstituted pyrene, unsubstituted perylene, unsubstituted unsubstituted dibenzofurane, unsubstituted dibenzothiophene, unsubstituted xanthene, unsubstituted carbazole, substituted 9-phenylcarbazole, unsubstituted azepine, unsubstituted dibenzo[b,f]azepine, unsubstituted 9,9'-spirobi[fluorene], unsubstituted spiro[fluorene-9,9'-xanthene], or a unsubstituted aromatic fused ring system comprising at least three unsubstituted aromatic rings selected from the group comprising unsubstituted non-hetero, unsubstituted hetero 5-member rings, unsubstituted 6-member rings and/or unsubstituted 7-member rings, unsubstituted fluorene, or a fused ring system comprising 2 to 6 unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle.

According to an embodiment of the organic electronic device, wherein the matrix compound of the hole injection layer comprises a compound of formula (II) or formula (III):

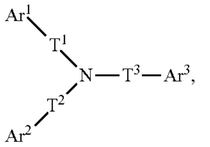

(II)

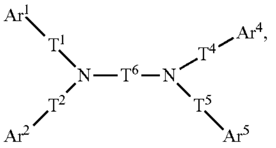

(III)

wherein $T^1$, $T^2$, $T^3$, $T^4$ and $T^5$ may be independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ may be independently selected from unsubstituted $C_6$ to $C_{20}$ aryl, or unsubstituted $C_3$ to $C_{20}$ heteroarylene, unsubstituted biphenylene, unsubstituted fluorene, substituted 9-fluorene, substituted 9,9-fluorene, unsubstituted naphthalene, unsubstituted anthracene, unsubstituted phenanthrene, unsubstituted pyrene, unsubstituted perylene, unsubstituted unsubstituted dibenzofurane, unsubstituted dibenzothiophene, unsubstituted xanthene, unsubstituted carbazole, substituted 9-phenylcarbazole, unsubstituted azepine, unsubstituted dibenzo[b,f]azepine, unsubstituted 9,9'-spirobi[fluorene], unsubstituted spiro[fluorene-9,9'-xanthene].

Thereby, the compound of formula (II) or (III) may have a rate onset temperature suitable for mass production.

According to an embodiment wherein $T^1$, $T^2$, $T^3$, $T^4$ and $T^5$ may be independently selected from a single bond, phenylene, biphenylene or terphenylene. According to an embodiment wherein $T^1$, $T^2$, $T^3$, $T^4$ and $T^5$ may be independently selected from phenylene, biphenylene or terphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and two of $T^1$, $T^2$, $T^3$, $T^4$ and $T^5$ are a single bond.

According to an embodiment wherein $T^1$, $T^2$ and $T^3$ may be independently selected from phenylene and one of $T^1$, $T^2$ and $T^3$ are a single bond. According to an embodiment wherein $T^1$, $T^2$ and $T^3$ may be independently selected from phenylene and two of $T^1$, $T^2$ and $T^3$ are a single bond.

According to an embodiment wherein $T^6$ may be phenylene, biphenylene, terphenylene. According to an embodiment wherein $T^6$ may be phenylene. According to an embodiment wherein $T^6$ may be biphenylene. According to an embodiment wherein $T^6$ may be terphenylene.

According to an embodiment wherein $Ar^1$, $Ar^2$, $Ar^3$, Art and $Ar^5$ may be independently selected from D1 to D16:

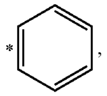

(D1)

-continued

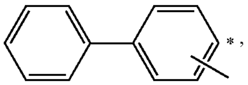

(D2)

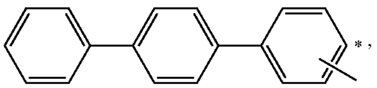

(D3)

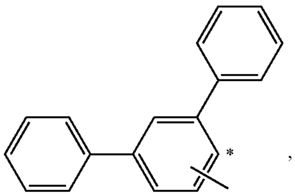

(D4)

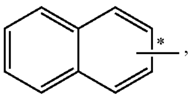

(D5)

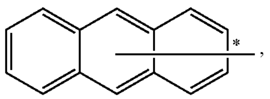

(D6)

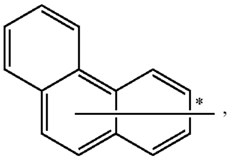

(D7)

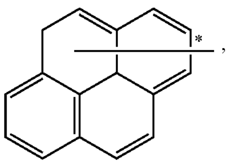

(D8)

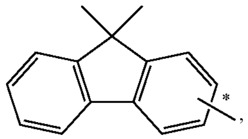

(D9)

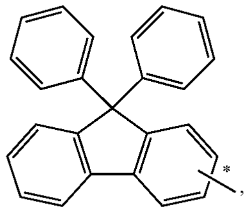

(D10)

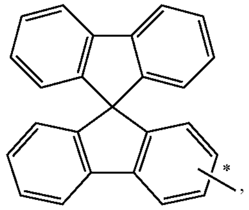

(D11)

-continued (D12)

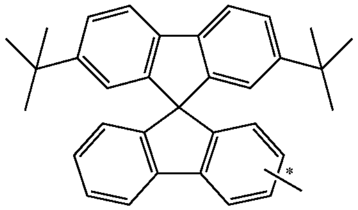

, (D13)

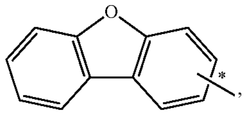

, (D14)

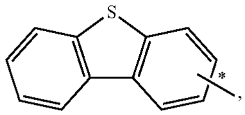

, (D15)

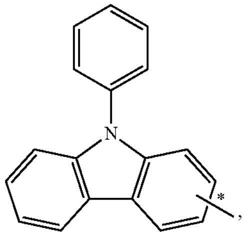

, (D16)

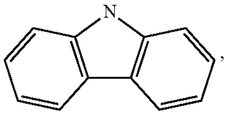

, wherein the asterix "*" denotes the binding position.

According to an embodiment, wherein $Ar^1$, $Ar^2$, $Ar^3$, $Ar^4$ and $Ar^5$ may be independently selected from D1 to D15; alternatively selected from D1 to D10 and D13 to D15.

According to an embodiment, wherein $Ar^1$, $Ar^2$, $Ar^3$, $Ar^4$ and $Ar^5$ may be independently selected from the group consisting of D1, D2, D5, D7, D9, D10, D13 to D16.

The rate onset temperature may be in a range particularly suited to mass production, when $Ar^1$, $Ar^2$, $Ar^3$, Art and $Ar^5$ are selected in this range.

The "matrix compound of formula (II) or formula (III)" may be also referred to as "hole transport compound".

According to one embodiment the matrix compound of formula (II) or formula (III) may comprises at least ≥1 to ≤6 substituted or unsubstituted aromatic fused ring systems comprising heteroaromatic rings.

According to one embodiment the matrix compound of formula (II) or formula (III) may comprises at least ≥1 to ≤6 substituted or unsubstituted aromatic fused ring systems comprising heteroaromatic rings and at least ≥1 to ≤3 substituted or unsubstituted unsaturated 5- to 7-member ring of a heterocycle, preferably ≥2 to ≤5 substituted or unsubstituted aromatic fused ring systems comprising heteroaromatic rings.

According to one embodiment the matrix compound of formula (II) or formula (III) may comprises at least ≥1 to ≤6 substituted or unsubstituted aromatic fused ring systems comprising heteroaromatic rings and at least ≥1 to ≤3 substituted or unsubstituted unsaturated 5- to 7-member ring of a heterocycle, preferably ≥2 to ≤5 substituted or unsubstituted aromatic fused ring systems comprising heteroaromatic rings, and at least ≥1 to ≤3 substituted or unsubstituted unsaturated 5- to 7-member ring of a heterocycle, further preferred 3 or 4 substituted or unsubstituted aromatic fused ring systems comprising heteroaromatic rings and optional at least ≥1 to ≤3 substituted or unsubstituted unsaturated 5- to 7-member ring of a heterocycle, and additional preferred wherein the aromatic fused ring systems comprising heteroaromatic rings are unsubstituted and optional at least ≥1 to ≤3 unsubstituted unsaturated 5- to 7-member ring of a heterocycle.

According to one embodiment the matrix compound of formula (II) or formula (III) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems.

According to one embodiment the matrix compound of formula (II) or formula (III) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings.

According to one embodiment the matrix compound of formula (II) or formula (III) may comprises at least ≥1 to ≤3 or 2 substituted or unsubstituted unsaturated 5- to 7-member ring of a heterocycle.

According to one embodiment the matrix compound of formula (II) or formula (III) may comprises at least ≥1 to ≤3 or 2 substituted or unsubstituted unsaturated 7-member ring of a heterocycle.

According to one embodiment substituted or unsubstituted aromatic fused ring systems of the matrix compound of formula (II) or formula (III) may comprises at least ≥1 to ≤3 or 2 substituted or unsubstituted unsaturated 5- to 7-member ring of a heterocycle.

According to one embodiment the substituted or unsubstituted aromatic fused ring systems of the matrix compound of formula (II) or formula (III) may comprises at least ≥1 to ≤3 or 2 substituted or unsubstituted unsaturated 7-member ring of a heterocycle.

According to one embodiment the matrix compound of formula (II) or formula (III) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, and wherein the aromatic fused ring system comprises substituted or unsubstituted unsaturated 5- to 7-member ring of a heterocycle.

According to one embodiment the matrix compound of formula (II) or formula (III) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings, and wherein the aromatic fused ring system comprises substituted or unsubstituted unsaturated 5- to 7-member ring of a heterocycle.

According to one embodiment the matrix compound of formula (II) or formula (III) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, and wherein the aromatic fused ring system comprises at least ≥1 to ≤3 or 2 substituted or unsubstituted unsaturated 5- to 7-member ring of a heterocycle.

According to one embodiment the matrix compound of formula (II) or formula (III) may comprises at least ≥1 to ≤6 substituted or unsubstituted aromatic fused ring systems, preferably ≥2 to ≤5 substituted or unsubstituted aromatic fused ring systems, and further preferred 3 or 4 substituted or unsubstituted aromatic fused ring systems, which comprises substituted or unsubstituted heteroaromatic rings, and wherein the aromatic fused ring system comprises at least ≥1 to ≤3 or 2 substituted or unsubstituted unsaturated 5- to 7-member ring of a heterocycle.

According to one embodiment the matrix compound of formula (II) or formula (III) may comprises:

a substituted or unsubstituted aromatic fused ring systems with at least ≥2 to ≤6, preferably ≥3 to ≤5, or 4 fused aromatic rings selected from the group comprising substituted or unsubstituted non-hetero aromatic rings, substituted or unsubstituted hetero 5-member rings, substituted or unsubstituted 6-member rings and/or substituted or unsubstituted unsaturated 5- to 7-member ring of a heterocycle; or an unsubstituted aromatic fused ring systems with at least ≥2 to ≤6, preferably ≥3 to ≤5, or 4 fused aromatic rings selected from the group comprising unsubstituted non-hetero aromatic rings, unsubstituted hetero 5-member rings, unsubstituted 6-member rings and/or unsubstituted unsaturated 5- to 7-member ring of a heterocycle.

It should be noted here that the wording "aromatic fused ring system" may include at least one aromatic ring and at least one substituted or unsubstituted unsaturated 5- to 7-member ring. It should be noted here that the substituted or unsubstituted unsaturated 5- to 7-member ring may not be an aromatic ring.

According to one embodiment the matrix compound of formula (II) or formula (III) may comprises at least at least ≥1 to ≤6, preferably ≥2 to ≤5, or further preferred 3 or 4 of the substituted or unsubstituted aromatic fused ring systems with:

at least one unsaturated 5-member ring, and/or at least one unsaturated 6-member ring, and/or at least one unsaturated 7-member ring; wherein preferably at least one unsaturated 5- and/or at least one unsaturated 7-member ring comprises at least 1 to 3, preferably 1 hetero-atom.

According to one embodiment the matrix compound of formula (II) or formula (III) may comprises at least at least ≥1 to ≤6, preferably ≥2 to ≤5, or further preferred 3 or 4 of the substituted or unsubstituted aromatic fused ring systems with:

at least one aromatic 5-member ring, and/or at least one aromatic 6-member ring, and/or at least one aromatic 7-member ring; wherein preferably at least one aromatic 5- and/or at least one aromatic 7-member ring comprises at least 1 to 3, preferably 1 hetero-atom;

wherein the substituted or unsubstituted aromatic fused ring system comprises at least ≥1 to ≤3 or 2 substituted or unsubstituted unsaturated 5- to 7-member ring of a heterocycle.

According to one embodiment the matrix compound of formula (II) or formula (III) may comprises:

at least ≥6 to ≤12, preferably ≥7 to ≤11, further preferred ≥8 to ≤10 or 9 aromatic rings; and/or at least ≥4 to ≤11, preferably ≥5 to ≤10, further preferred ≥6 to ≤9 or in addition preferred 7 or 8 non-hetero aromatic rings, preferably the non-hetero aromatic rings are aromatic $C_6$ rings; and/or at least ≥1 to ≤4, preferably 2 or 3 aromatic 5-member-rings, preferably hetero aromatic 5-member-rings; and/or at least 1 or 2 unsaturated 5- to 7-member-ring of a heterocycle, preferably at least 1 or 2 unsaturated 7-member-ring of a heterocycle;

at least ≥6 to ≤12, preferably ≥7 to ≤11, further preferred ≥8 to ≤10 or 9 aromatic rings, wherein therefrom at least ≥4 to ≤11, preferably ≥5 to ≤10, further preferred ≥6 to ≤9 or in addition preferred 7 or 8 are non-hetero aromatic rings, and at least ≥1 to ≤4, preferably 2 or 3 aromatic rings are hetero aromatic rings, wherein the total number of non-hetero aromatic rings and hetero aromatic rings in total does not exceed 12 aromatic rings; and/or at least ≥6 to ≤12, preferably ≥7 to ≤11, further preferred ≥8 to ≤10 or 9 aromatic rings, wherein therefrom at least ≥4 to ≤11, preferably ≥5 to ≤10, further preferred ≥6 to ≤9 or in addition preferred 7 or 8 are non-hetero aromatic rings, and at least ≥1 to ≤4, preferably 2 or 3 aromatic rings are hetero aromatic rings, wherein the total number of non-hetero aromatic rings and hetero aromatic rings in total does not exceed 12 aromatic rings; and the hole transport compound or the hole transport compound according to formula I comprises at least ≥1 to ≤4, preferably 2 or 3 aromatic 5-member-rings, preferably hetero aromatic 5-member-rings, and/or the hole transport compound or the hole transport compound according to formula (I) comprises at least 1 or 2 unsaturated 5- to 7-member-ring of a heterocycle, preferably at least 1 or 2 unsaturated 7-member-ring of a heterocycle.

According to one embodiment the matrix compound of formula (II) or formula (III) may comprises a hetero-atom, which may be selected from the group comprising O, S, N, B or P, preferably the hetero-atom may be selected from the group comprising O, S or N.

According to one embodiment the matrix compound of formula (II) or formula (III) may comprises at least at least ≥1 to ≤6, preferably ≥2 to ≤5, or further preferred 3 or 4 of the substituted or unsubstituted aromatic fused ring systems with:

at least one aromatic 5-member ring, and/or at least one aromatic 6-member ring, and/or at least one aromatic 7-member ring; wherein preferably at least one aromatic 5- and/or at least one aromatic 7-member ring comprises at least 1 to 3, preferably 1 hetero-atom;

wherein the substituted or unsubstituted aromatic fused ring system optional comprises at least ≥1 to ≤3 or 2 substituted or unsubstituted unsaturated 5- to 7-member ring of a heterocycle; and wherein the substituted or unsubstituted aromatic fused ring system comprises a hetero-atom, which may be selected from the group comprising O, S, N, B, P or Si, preferably the hetero-atom may be selected from the group comprising O, S or N.

According to one embodiment the matrix compound of formula (II) or formula (III) may be free of hetero-atoms which are not part of an aromatic ring and/or part of an unsaturated 7-member-ring, preferably the hole transport compound or the hole transport compound according to formula (I) may be free on N-atoms except N-atoms which are part of an aromatic ring or are part of an unsaturated 7-member-ring.

According to one embodiment, the hole transport compound comprises at least one naphthyl group, carbazole group, dibenzofurane group, dibenzothiophene group and/or substituted fluorenyl group, wherein the substituents are independently selected from methyl, phenyl or fluorenyl.

According to an embodiment of the electronic device, wherein the matrix compound of formula (II) or formula (III) are selected from F1 to F18:

(F1)

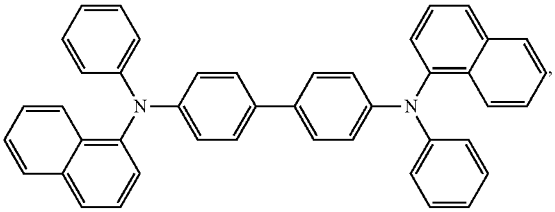

, (F2)

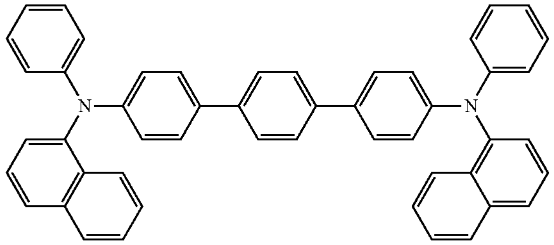

, (F3)

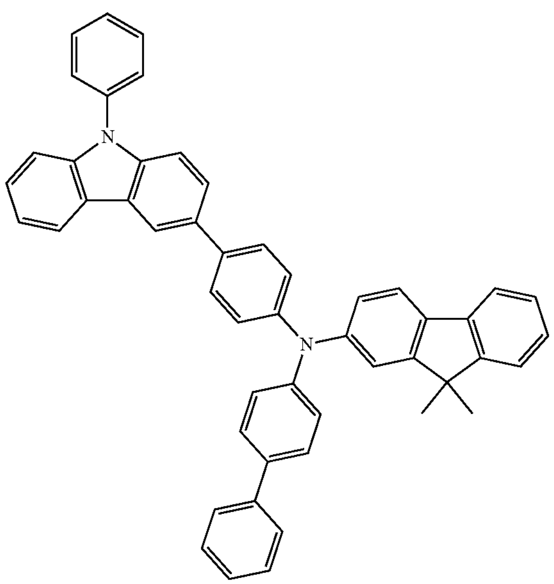

,

-continued (F4)

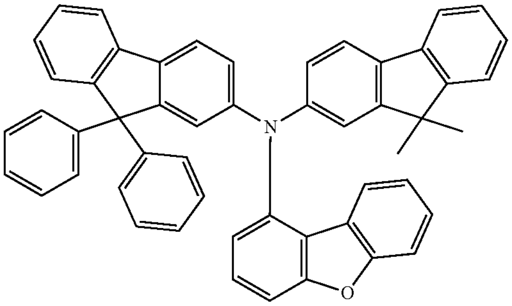

, (F5)

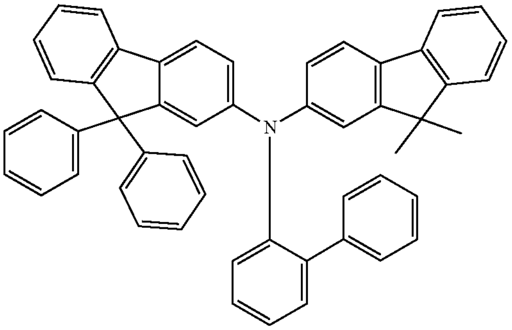

, (F6)

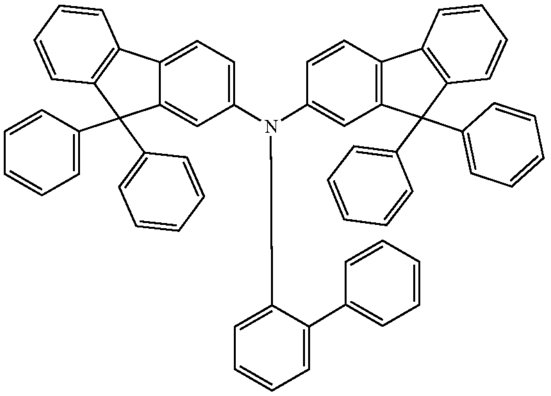

, (F7)

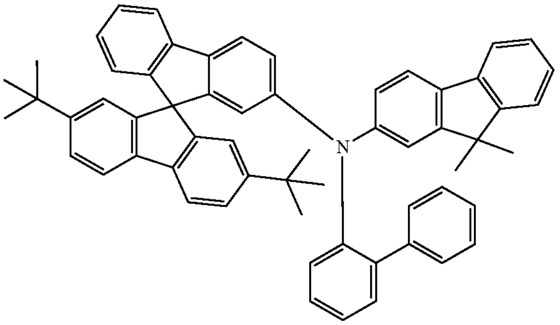

,

-continued
(F8)
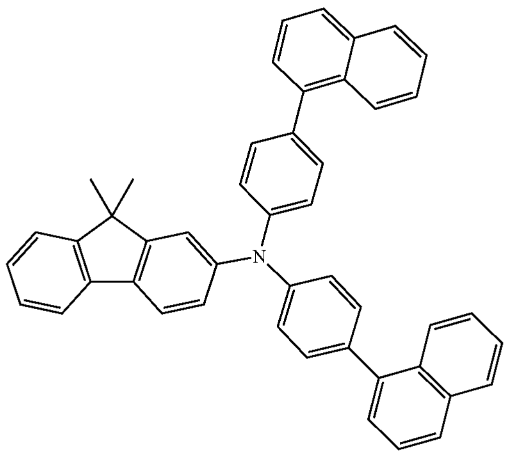
,
(F9)
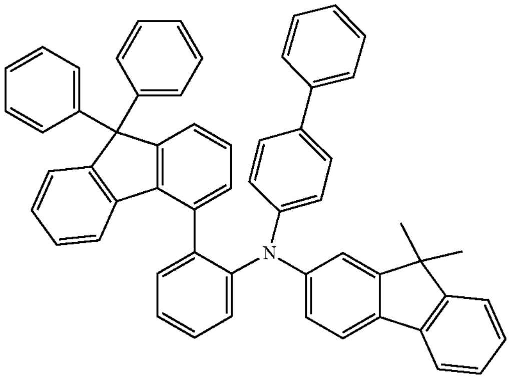
,
(F10)
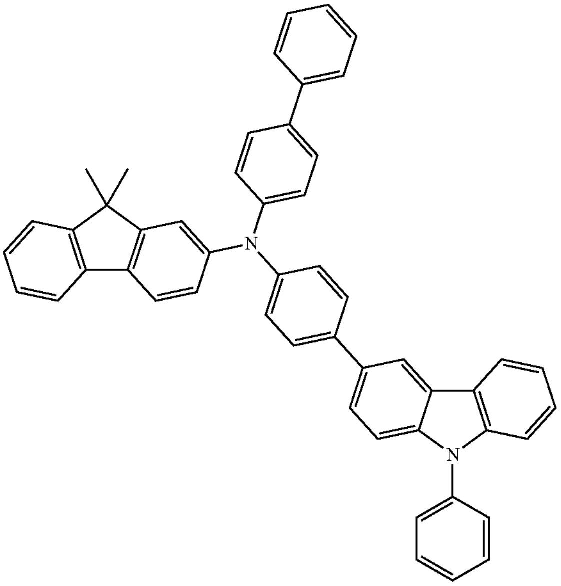
,
-continued
(F11)
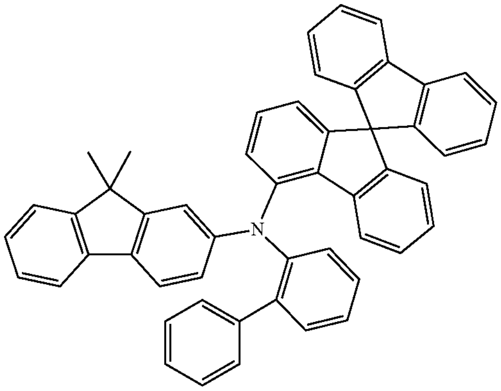
,
(F12)
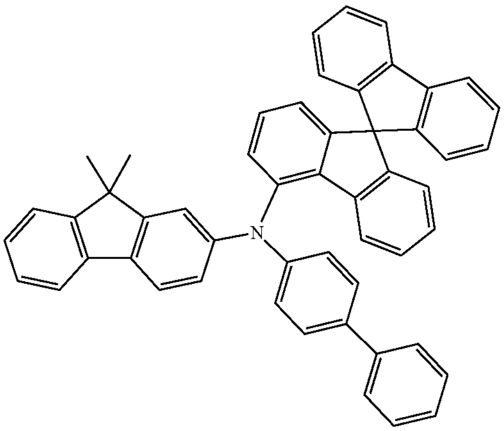
,
(F13)
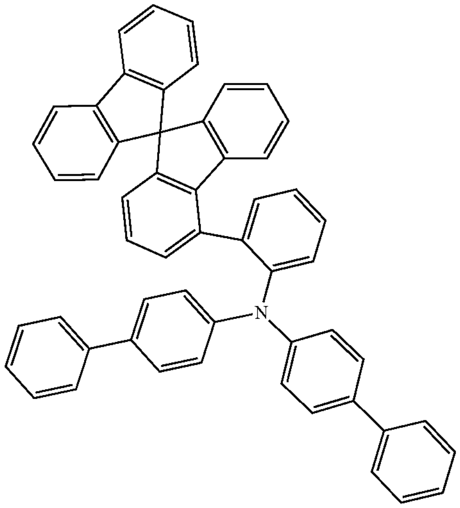
, -continued (F14)

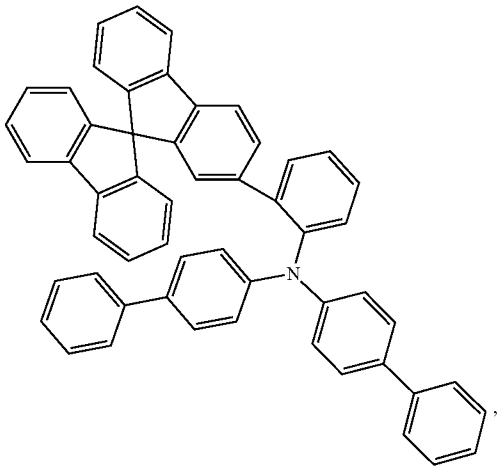

(F15)

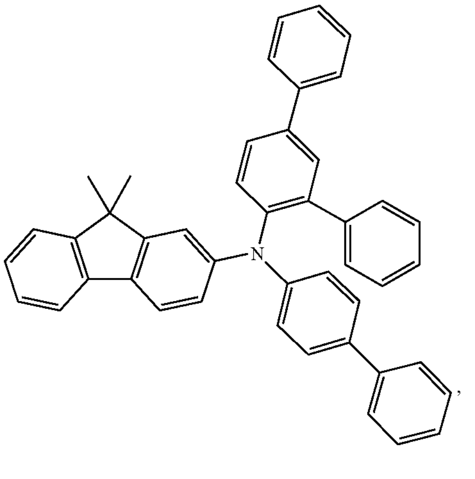

(F16)

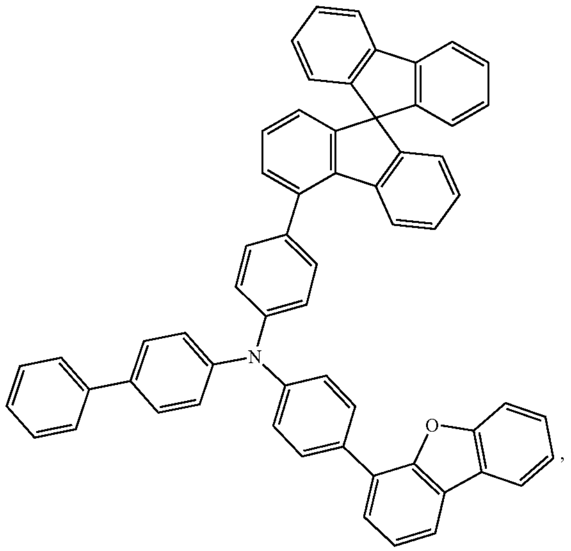

-continued (F17)

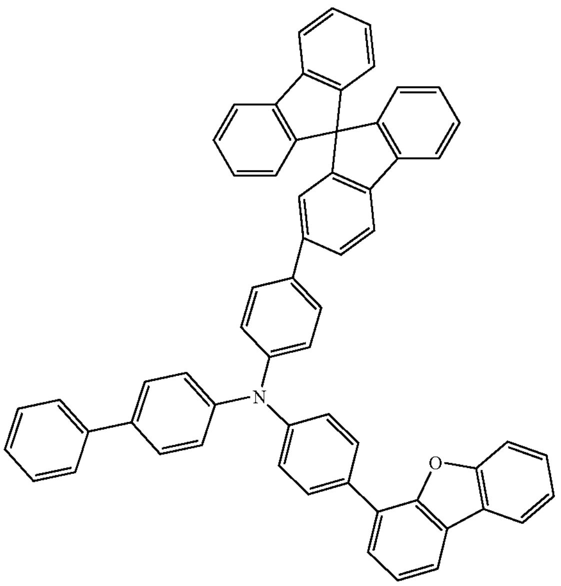

(F18)

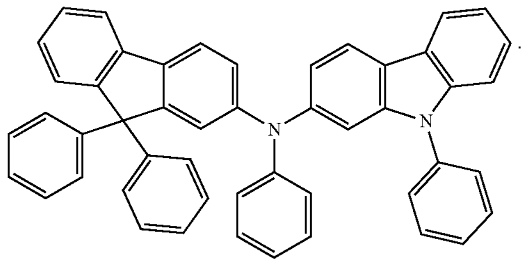

The matrix compound of the hole injection layer may be free of HTM014, HTM081, HTM163, HTM222, EL-301, HTM226, HTM355, HTM133, HTM334, HTM604 and EL-22T. The abbreviations denote the manufacturers' names, for example, of Merck or Lumtec.

Hole Injection Layer

The hole injection layer (HIL) may be formed on the anode layer by vacuum deposition, spin coating, printing, casting, slot-die coating, Langmuir-Blodgett (LB) deposition, or the like. When the HIL is formed using vacuum deposition, the deposition conditions may vary according to the hole transport compound that is used to form the HIL, and the desired structure and thermal properties of the HIL. In general, however, conditions for vacuum deposition may include a deposition temperature of 100° C. to 350° C., a pressure of 10-8 to 10-3 Torr (1 Torr equals 133.322 Pa), and a deposition rate of 0.1 to 10 nm/sec.

When the HIL is formed using spin coating or printing, coating conditions may vary according to the hole transport compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed of a metal complex of formula (I) or formulae (Ia) to (Id) and optionally of any compound of formulae (II) or (III).

The thickness of the HIL may be in the range from about 1 nm to about 15 nm, and for example, from about 2 nm to about 15 nm, alternatively about 2 nm to about 12 nm.

When the thickness of the HIL is within this range, the HIL may have excellent hole injecting characteristics, without a substantial penalty in driving voltage.

According to one embodiment of the present invention, the hole injection layer may comprise:

at least about ≥0.5 wt.-% to about ≤30 wt.-%, preferably about ≥0.5 wt.-% to about ≤20 wt.-%, and more preferred about ≥15 wt.-% to about ≤1 wt.-% of a metal complex of formula (I) or formulae (Ia) to (Id), and at least about ≥70 wt.-% to about ≤99.5 wt.-%, preferably about ≥80 wt.-% to about ≤99.5 wt.-%, and more preferred about ≥85 wt.-% to about ≤99 wt.-% of a matrix compound and/or compound of formulae (II) or (III); preferably the wt.-% of the metal complex of formula (I) or formulae (Ia) to (Id) is lower than the wt.-% of the matrix compound or compound according to formulae (II) or (III); wherein the weight-% of the components are based on the total weight of the hole injection layer.

Preferably, the hole injection layer is free of ionic liquids, metal phthalocyanine, CuPc, HAT-CN, Pyrazino[2,3-f][1,10]phenanthroline-2,3-dicarbonitrile, $F_4TCNQ$, metal fluoride and/or metal oxides, wherein the metal in the metal oxide is selected from Re and/or Mo. Thereby, the hole injection layer can be deposited under conditions suitable for mass production.

According to an embodiment of the organic electronic device, wherein the hole injection layer is non-emissive.

It is to be understood that the hole injection layer is not part of the anode layer.

Further Layers

In accordance with the invention, the organic electronic device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate, a silicon substrate or a transistor backplane. Preferably, the substrate is a silicon substrate or transistor backplane.

Hole Transport Layer

According to one embodiment of the organic electronic device, wherein the organic electronic device further comprises a hole transport layer, wherein the hole transport layer is arranged between the hole injection layer and the at least one first emission layer.

The hole transport layer may comprises a substantially covalent matrix compound. According to one embodiment the substantially covalent matrix compound of the hole transport layer may be selected from at least one organic compound. The substantially covalent matrix may consists substantially from covalently bound C, H, O, N, S, which optionally comprise in addition covalently bound B, P, As and/or Se.

According to one embodiment of the organic electronic device, the hole transport layer comprises a matrix compound, wherein the matrix compound of the hole transport layer may be selected from organic compounds consisting substantially from covalently bound C, H, O, N, S, which optionally comprise in addition covalently bound B, P, As and/or Se.

According to one embodiment, the substantially covalent matrix compound of the hole transport layer may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

Preferably, the matrix compound of the hole injection layer and the matrix compound of the hole transport layer are selected the same.

According to one embodiment of the organic electronic device, wherein the hole transport layer of the organic electronic device comprises a matrix compound according to formulae (II) or (III), preferably the matrix compound in the hole injection layer and hole transport layer are selected the same.

The hole transport layer may be free of HTM014, HTM081, HTM163, HTM222, EL-301, HTM226. HTM355, HTM133, HTM334, HTM604 and EL-22T. The abbreviations denote the manufacturers' names, for example, of Merck or Lumtec.

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the hole transport compound that is used to form the HTL.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 200 nm, further about 100 nm to about 180 nm, further about 110 nm to about 140 nm.

When the thickness of the HTL is within this range, the HTL may have excellent hole transporting characteristics, without a substantial penalty in driving voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime may be improved. Typically, the electron blocking layer comprises a triarylamine compound.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer may be selected from triarylamine compounds with a triplet level above the triplet level of the phosphorescent emitter in the adjacent emission layer.

The thickness of the electron blocking layer may be selected between 2 and 20 nm.

Emission Layer (EML)

The at least one first emission layer (EML), also referred to as first emission layer may be formed on the HTL or EBL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

According to the present invention it is preferred that the organic electronic device comprises one emission layer that is named “first emission layer”. However the organic electronic device optionally comprises two emission layers, wherein the first layer is named first emission layer and second layer is named second emission layer.

It may be provided that the at least one emission layer also referred to as first emission layer is free of the matrix compound of the hole injection layer.

It may be provided that the at least one emission layer does not comprise the compound of Formulae (II) or (III).

The at least one emission layer (EML) may be formed of a combination of a host and an emitter dopant. Example of the host are Alq3, 4,4'-N,N'-dicarbazole-biphenyl (HTC-10), poly(n-vinyl carbazole) (PVK), 9,10-di(naphthalene-2-yl) anthracene (ADN), 4,4',4"-tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzo-thiazolate)zinc (Zn(BTZ)2).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2lr(acac), but are not limited thereto. These compounds are phosphorescent emitters, however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, $(F2ppy)_2Ir(tmd)$ and Ir(dfppz)3 and ter-fluorene. 4,4'-bis(4-diphenyl amiostyryl)biphenyl (DPAVBi), 2,5,8,11-tetra-tert-butyl perylene (TBPe) are examples of fluorescent blue emitter dopants.

The amount of the emitter dopant may be in the range from about 0.01 to about 50 parts by weight, based on 100 parts by weight of the host. Alternatively, the at least one emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent emitter dopant, the HBL may have also a triplet exciton blocking function.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, phenanthroline derivatives and triazine derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The organic electronic device according to the present invention may further comprise an electron transport layer (ETL).

According to another embodiment of the present invention, the electron transport layer may further comprise an azine compound, preferably a triazine compound.

In one embodiment, the electron transport layer may further comprise a dopant selected from an alkali organic complex, preferably LiQ The thickness of the ETL may be in the range from about 15 nm to about 50 nm, for example, in the range from about 20 nm to about 40 nm. When the thickness of the EIL is within this range, the ETL may have satisfactory electron-injecting properties, without a substantial penalty in driving voltage.

According to another embodiment of the present invention, the organic electronic device may further comprise a hole blocking layer and an electron transport layer, wherein the hole blocking layer and the electron transport layer comprise an azine compound. Preferably, the azine compound is a triazine compound.

Electron injection layer (EIL)

An optional EIL, which may facilitates injection of electrons from the cathode, may be formed on the ETL, preferably directly on the electron transport layer. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Layer

The cathode layer is formed on the ETL or optional EIL. The cathode layer may be formed of a metal, an alloy, an electrically conductive compound, or a mixture thereof. The cathode layer may have a low work function. For example, the cathode layer may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode layer may be formed of a transparent conductive oxide, such as ITO or IZO.

The thickness of the cathode layer may be in the range from about 5 nm to about 1000 nm, for example, in the range from about 10 nm to about 100 nm. When the thickness of the cathode layer is in the range from about 5 nm to about 50 nm, the cathode layer may be transparent or semitransparent even if formed from a metal or metal alloy.

It is to be understood that the cathode layer is not part of an electron injection layer or the electron transport layer.

Organic Electronic Device

According to one embodiment of the organic electronic device, wherein the hole injection layer may comprise a first hole injection sub-layer comprising the metal complex of formula (I) and a second hole injection sub-layer comprising a matrix compound, wherein the first hole injection sub-layer is arranged closer to the anode layer and the second hole injection sub-layer is arranged closer to the at least one emission layer; preferably the matrix compound consists of a substantially covalent matrix compound.

According to one embodiment of the organic electronic device, wherein the hole injection layer may comprise a first hole injection sub-layer comprising the metal complex of formula (I) and a second hole injection sub-layer comprising a matrix compound, wherein the first hole injection sub-layer is arranged closer to the anode layer comprising a first anode sub-layer and a second anode sub-layer and the second hole injection sub-layer is arranged closer to the at least one emission layer; preferably the matrix compound consists of a substantially covalent matrix compound.

According to one embodiment of the organic electronic device, wherein the hole injection layer may comprise a first hole injection sub-layer comprising the metal complex of formula (I) and a second hole injection sub-layer comprising a matrix compound comprising of at least one arylamine compound, diarylamine compound, triarylamine compound and/or compound of formulae (II) or (III), wherein the first hole injection sub-layer is arranged closer to the anode layer and the second hole injection sub-layer is arranged closer to the at least one emission layer.

According to one embodiment of the organic electronic device, wherein the hole injection layer may comprise a first hole injection sub-layer comprising the metal complex of formula (I) and a second hole injection sub-layer comprising the matrix compound comprising of at least one arylamine compound, diarylamine compound, triarylamine compound and/or compound of formulae (II) or (III), wherein the first hole injection sub-layer is arranged closer to the anode layer comprising a first anode sub-layer and a second anode sub-layer and the second hole injection sub-layer is arranged closer to the at least one emission layer.

According to one embodiment of the organic electronic device, the hole injection layer may comprise a first hole injection sub-layer consisting essentially of the metal complex of formula (I) or formulae (Ia) to (Id) and a second hole injection sub-layer comprising a matrix compound, wherein the first hole injection sub-layer is arranged closer to the anode layer comprising at least a first anode sub-layer and a second anode sub-layer and the second hole injection sub-layer is arranged closer to the at least one emission layer; preferably the matrix compound consists of a substantially covalent matrix compound.

According to one embodiment of the organic electronic device, the hole injection layer may comprise a first hole injection sub-layer consisting essentially of the metal complex of formula (I) or formulae (Ia) to (Id) and a second hole injection sub-layer comprising a matrix compound comprising of at least one arylamine compound, diarylamine compound, triarylamine compound and/or compound of formulae (II) or (III), wherein the first hole injection sub-layer is arranged closer to the anode layer comprising at least a first anode sub-layer and a second anode sub-layer and the second hole injection sub-layer is arranged closer to the at least one emission layer.

In the context of the present specification the term "consisting essentially of" especially means and/or includes a concentration of ≥90% (vol/vol) more preferred ≥95% (vol/vol) and most preferred ≥99% (vol/vol).

According to one embodiment of the organic electronic device, wherein the hole injection layer may be arranged in direct contact with the anode layer comprising at least a first anode sub-layer and a second anode sub-layer.

According to one embodiment of the present invention, wherein the organic electronic device may comprise the hole injection layer comprising the metal complex of formula (I) or formulae (Ia) to (Id) and the matrix compound comprising at least one arylamine compound, diarylamine compound, triarylamine compound and/or a compound of formulae (II) or (III), wherein in formula (I) or formulae (Ia) to (Id) M is selected from Li, Na, K, Cs, Mg, Mn, Cu, Zn, Ag, Bi and Mo, alternatively Mg, Mn, Cu, Zn, Ag, Bi and Mo, alternatively Cu, Zn, Ag or Bi.

According to another embodiment, wherein the organic electronic device can be a light emitting device or a display device.

According to one aspect of the present invention, there is provided an organic electronic device comprising: a substrate; an anode layer comprising at least two anode sublayers or more comprises at least a first anode sub-layer and a second anode sub-layer formed on the substrate; a hole injection layer comprising a metal complex of formula (I), a hole transport layer, at least a first emission layer, an electron transport layer and a cathode layer.

According to another aspect of the present invention, there is provided an organic electronic device comprising: a substrate; an anode layer comprising at least two anode sublayers or more comprises a first anode sub-layer and a second anode sub-layer formed on the substrate, a hole injection of the present invention comprising a first and a second hole injection sub-layer, a hole transport layer, at least a first emission layer, an optional hole blocking layer, an electron transport layer, an optional electron injection layer, and a cathode layer, wherein the first hole injection sub-layer is arranged adjacent to the anode layer and the second hole injection sub-layer arranged adjacent to the hole transport layer, and wherein the first hole injection sub-layer comprises or consists of the metal complex of formula (I) or formulae (Ia) to (Id) and the second sub-layer comprises or consists of a matrix compound or compound of formulae (II) or (III).

According to another aspect of the present invention, there is provided an organic electronic device comprising: a substrate; an anode layer comprising at least two anode sublayers or more comprises a first anode sub-layer and a second anode sub-layer formed on the substrate; a hole injection layer comprising a matrix compound or a compound of formulae (II) or (III) and a metal complex of formula (I) or formulae (Ia) to (Id), a hole transport layer, an electron blocking layer, at least a first emission layer, a hole blocking layer, an electron transport layer and a cathode layer.

According to another aspect of the present invention, there is provided an organic electronic device comprising: a substrate; an anode layer comprising at least two anode sublayers or more comprises a first anode sub-layer and a second anode sub-layer formed on the substrate, a hole injection of the present invention comprising a first hole injection and a second hole injection sub-layer, a hole transport layer, an electron-blocking layer, at least a first emission layer, a hole blocking layer, an electron transport layer, an optional electron injection layer, and a cathode layer, wherein the first hole injection sub-layer is arranged adjacent to the anode layer comprising at least a first anode sub-layer and a second anode sub-layer and the second hole injection sub-layer is arranged adjacent to the hole transport layer, and wherein the first hole injection sub-layer comprises or consists of the metal complex of formula (I) or formulae (Ia) to (Id) and the second sub-layer comprises or consists of a matrix compound or a compound of formulae (II) or (III).

According to another aspect of the present invention, there is provided an organic electronic device comprising: a substrate; an anode layer comprising at least two anode sublayers or more comprises a first anode sub-layer and a second anode sub-layer formed on the substrate, a hole injection layer comprising a matrix compound or a compound of formulae (II) or (III) and a metal complex of formula (I) or formulae (Ia) to (Id), a hole transport layer, an electron blocking layer, at least a first emission layer, a hole blocking layer, an electron transport layer, an optional electron injection layer, and a cathode layer.

According to another aspect of the present invention, there is provided an OLED comprising: a substrate; an anode layer comprising a first anode sub-layer and a second anode sub-layer formed on the substrate, a hole injection of the present invention comprising a first hole injection and a second hole injection sub-layer, a hole transport layer, an electron blocking layer, at least a first emission layer, a hole blocking layer, an electron transport layer, an optional electron injection layer, and a cathode layer, wherein the first hole injection sub-layer is arranged adjacent to the anode layer comprising at least a first anode sub-layer and a second anode sub-layer and the second hole injection sub-layer is arranged adjacent to the hole transport layer, and wherein the first hole injection sub-layer comprises or consists of the metal complex of formula (I) or formulae (Ia) to (Id) and the second hole injection sub-layer comprises or consists of a matrix compound or a compound of formulae (II) or (III).

According to various embodiments of the present invention, there may be provided further layers arranged between the above mentioned layers, on the substrate or on the top electrode.

For example, the organic electronic device according to FIG. 5 may be formed by a process, wherein on a substrate (110), an anode layer (120) comprising at least a first anode sub-layer (121) and a second anode sub-layer (122), a hole injection layer (130) comprising a matrix compound of formulae (II) or (III) and metal complex of formula (I) or formulae (Ia) to (Id), a hole transport layer (140), a first emission layer (150), a hole blocking layer (155), an electron transport layer (160), and a cathode layer (190) are subsequently formed in that order.

Method of Manufacturing

According to another aspect of the present invention, there is provided a method of manufacturing an organic electronic device, the method using:

at least one deposition source, preferably two deposition sources and more preferred at least three deposition sources.

The methods for deposition that can be suitable comprise:

deposition via vacuum thermal evaporation;

deposition via solution processing, preferably the processing may be selected from spin-coating, printing, casting; and/or slot-die coating.

According to various embodiments of the present invention, there is provided a method using:

a first deposition source to release the matrix compound according to the invention, and a second deposition source to release the metal complex of formula (I) or formulae (Ia) to (Id).

The method comprising the steps of forming the hole injection layer; whereby for an organic electronic device:

the hole injection layer is formed by releasing the matrix compound according to the invention from the first deposition source and the metal complex of formula (I) or formulae (Ia) to (Id) from the second deposition source.

According to various embodiments of the present invention, the method may further include forming the layers in the following order on the hole injection layer, at least one layer selected from the group consisting of forming a hole transport layer, forming a hole blocking layer, forming a first emission layer, forming a hole blocking layer, forming an electron transporting layer and/or forming an electron injection layer and/or forming a cathode layer.

According to various embodiments of the present invention, the method may further include the steps for forming an organic electronic device, wherein on a substrate an anode layer comprising at least a first anode sub-layer and a second anode sub-layer is formed, on the anode layer comprising at least a first anode sub-layer and a second anode sub-layer a hole injection layer, which comprises a matrix compound according to invention and a metal complex of formula (I) or formulae (Ia) to (Id) is formed, on the hole injection layer, which comprises a matrix compound and a metal complex of formula (I) or formulae (Ia) to (Id), a hole transport layer is formed, on the hole transport layer at least a first emission layer is formed, on the emission layer an electron transport layer is formed, optionally a hole blocking layer and/or an electron transport layer are formed on the emission layer, and finally a cathode layer is formed, optional an electron blocking layer is formed in that order between the hole transport layer and the emission layer, optional an electron injection layer is formed between the electron transport layer and the cathode layer.

According to various embodiments, the organic electronic device may have the following layer structure, wherein the layers having the following order:

an anode layer comprising at least a first anode sub-layer and a second anode sub-layer, a hole injection layer comprising a matrix compound according to the invention and a metal complex of formula (I) or formulae (Ia) to (Id), a hole transport layer, optional an electron blocking layer, at least a first emission layer, optional a hole blocking layer, an electron transport layer, optional an electron injection layer, and a cathode layer.

According to one embodiment, the organic electronic device of the present invention is formed by deposition of the hole injection layer in vacuum.

According to another aspect, it is provided an electronic device comprising at least one organic light emitting device according to any embodiment described throughout this application, preferably, the electronic device comprises the organic light emitting diode in one of embodiments described throughout this application. More preferably, the organic electronic device is a display device.

Hereinafter, the embodiments are illustrated in more detail with reference to examples. However, the present disclosure is not limited to the following examples. Reference will now be made in detail to the exemplary aspects.

DESCRIPTION OF THE DRAWINGS

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object are disclosed in the dependent claims and the following description of the respective figures which in an exemplary fashion show preferred embodiments according to the invention. Any embodiment does not necessarily represent the full scope, however, and reference is made therefore to the claims and herein for interpreting the scope. It is to be understood that both the foregoing general description and the following detailed description are exemplary and explanatory only and are intended to provide further explanation of the present invention as claimed.

FIG. 1 is a schematic sectional view of an organic electronic device, according to an exemplary embodiment of the present invention;

FIG. 2 is a schematic sectional view of an organic electronic device, according to an exemplary embodiment of the present invention;

FIG. 3 is a schematic sectional view of an organic electronic device, according to an exemplary embodiment of the present invention.

FIG. 4 is a schematic sectional view of an organic electronic device, according to an exemplary embodiment of the present invention;

FIG. 5 is a schematic sectional view of an organic electronic device, according to an exemplary embodiment of the present invention;

FIG. 6 is a schematic sectional view of an organic electronic device, according to an exemplary embodiment of the present invention;

FIG. 7 is a schematic sectional view of an organic electronic device, according to an exemplary embodiment of the present invention;

FIG. 8 is a schematic sectional view of an organic electronic device, according to an exemplary embodiment of the present invention;

FIG. 9 is a schematic sectional view of an organic electronic device, according to an exemplary embodiment of the present invention.

Hereinafter, the FIGS. 1 to 9 are illustrated in more detail with reference to examples. However, the present disclosure is not limited to the following figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

Figure 1:
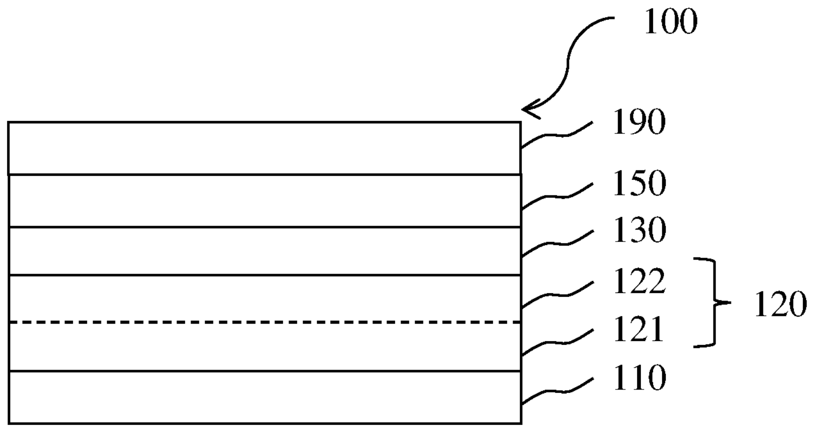
FIGS. 1 to 9

FIG. 1 is a schematic sectional view of an organic electronic device (100), according to an exemplary embodiment of the present invention. The organic electronic device (100) includes a substrate (110), an anode layer (120) that comprises a first anode sub-layer (121) and a second anode sub-layer (122) and a hole injection layer (HIL) (130). The HIL (130) is disposed on the anode layer (120). Onto the HIL (130), a first emission layer (EML) (150), and a cathode layer (190) are disposed.

Figure 2:
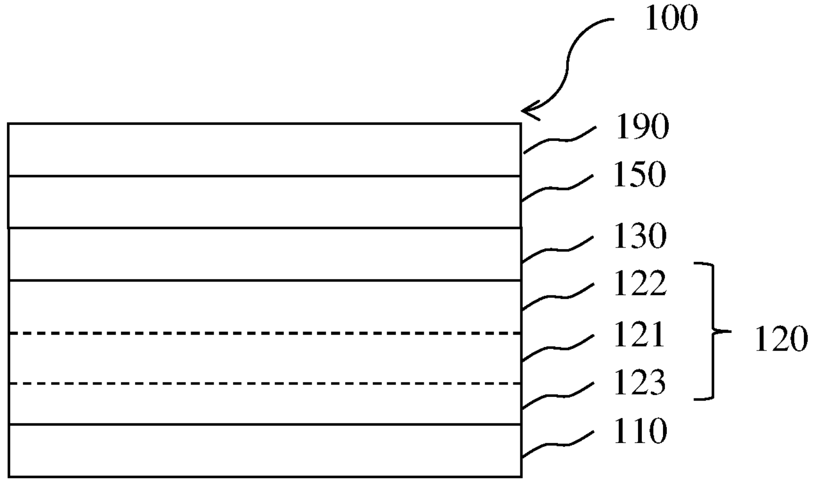

FIG. 2 is a schematic sectional view of an organic electronic device (100), according to an exemplary embodiment of the present invention. The organic electronic device (100) includes a substrate (110), an anode layer (120) that comprises a first anode sub-layer (121), a second anode sub-layer (122) and a third anode sub-layer (123), and a hole injection layer (HIL) (130). The HIL (130) is disposed on the anode layer (120) comprising a first anode sub-layer (121), a second anode sub-layer (122) and a third anode sub-layer (123). Onto the HIL (130), a first emission layer (EML) (150), and a cathode layer (190) are disposed.

Figure 3:
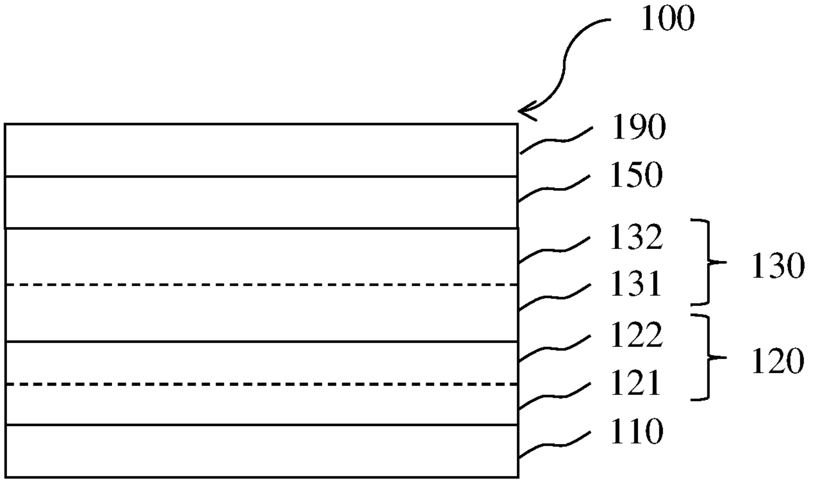

FIG. 3 is a schematic sectional view of an organic electronic device (100), according to an exemplary embodiment of the present invention. The organic electronic device (100) includes a substrate (110), an anode layer (120) that comprises a first anode sub-layer (121) and a second anode sub-layer (122), and a hole injection layer (HIL) (130) comprising a first hole injection sub-layer (131) and a second hole injection sub-layer (132). The HIL (130) comprising a first hole injection sub-layer (131) and a second hole injection sub-layer (132) is disposed on the anode layer (120). Onto the HIL (130), a first emission layer (EML) (150), and a cathode layer (190) are disposed.

Figure 4:
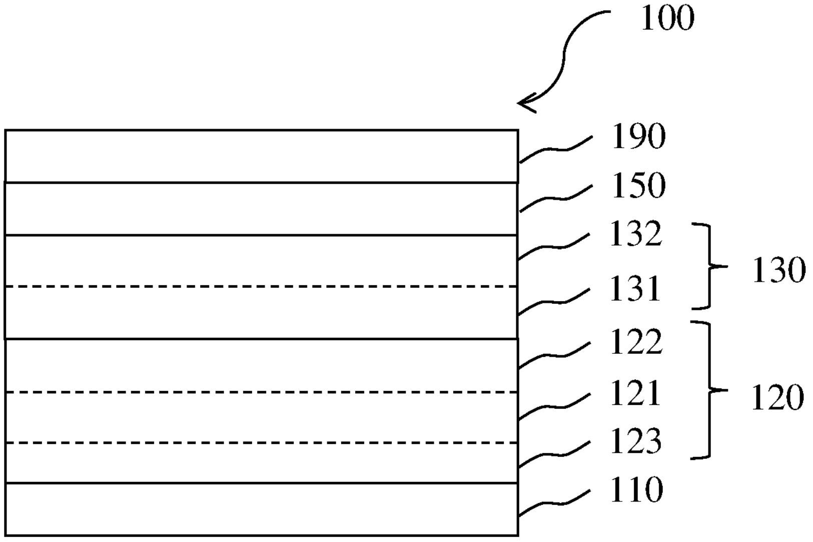

FIG. 4 is a schematic sectional view of an organic electronic device (100), according to an exemplary embodiment of the present invention. The organic electronic device (100) includes a substrate (110), an anode layer (120) that comprises a first anode sub-layer (121) a second anode sub-layer (122) and a third anode sub-layer (123), and a hole injection layer (HIL) (130) comprising a first hole injection sub-layer (131) and a second hole injection sub-layer (132). The HIL (130) comprising a first hole injection sub-layer (131) and a second hole injection sub-layer (132) is disposed on the anode layer (120). Onto the HIL (130), a first emission layer (EML) (150), and a cathode layer (190) are disposed.

Figure 5:
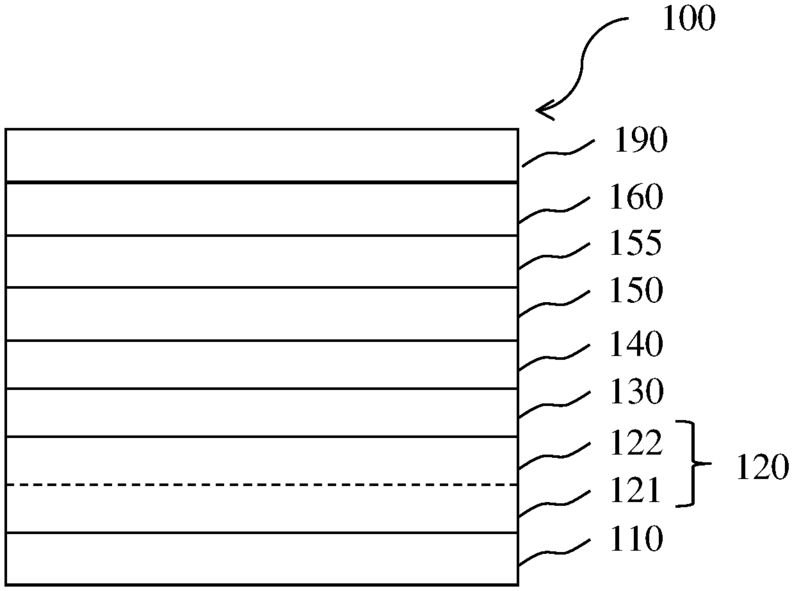

FIG. 5 is a schematic sectional view of an organic electronic device (100), according to an exemplary embodiment of the present invention. The organic electronic device (100) includes a substrate (110), an anode layer (120) that comprises a first anode sub-layer (121) and a second anode sub-layer (122), and a hole injection layer (HIL) (130). The HIL (130) is disposed on the anode layer (120). Onto the HIL (130), an hole transport layer (HTL) (140), a first emission layer (EML) (150), a hole blocking layer (BL) (155), an electron transport layer (ETL) (160), and a cathode layer (190) are disposed.

Figure 6:
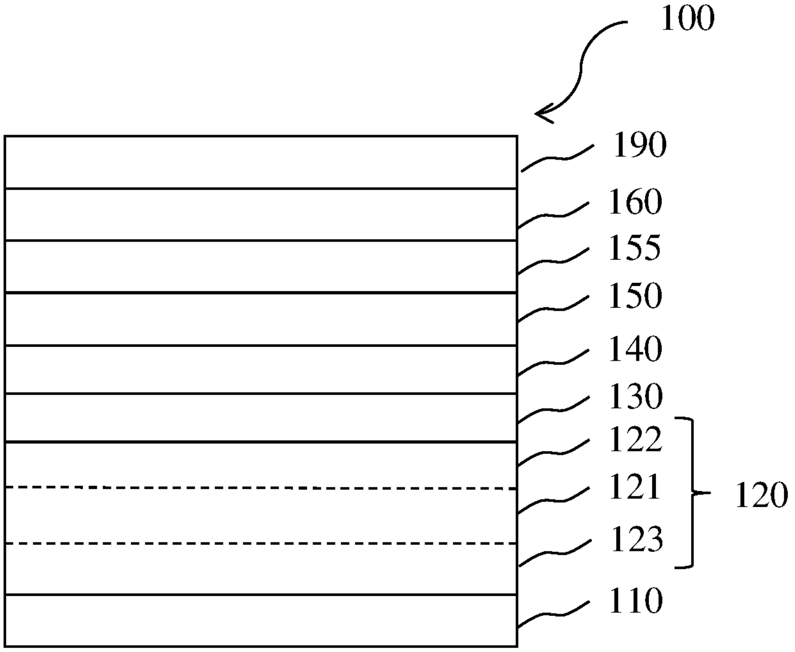

FIG. 6 is a schematic sectional view of an organic electronic device (100), according to an exemplary embodiment of the present invention. The organic electronic device (100) includes a substrate (110), an anode layer (120) that comprises a first anode sub-layer (121), a second anode sub-layer (122) and a third anode sub-layer (123), and a hole injection layer (HIL) (130). The HIL (130) is disposed on the anode layer (120). Onto the HIL (130), an hole transport layer (HTL) (140), a first emission layer (EML) (150), a hole blocking layer (HBL) (155), an electron transport layer (ETL) (160), and a cathode layer (190) are disposed.

Figure 7:
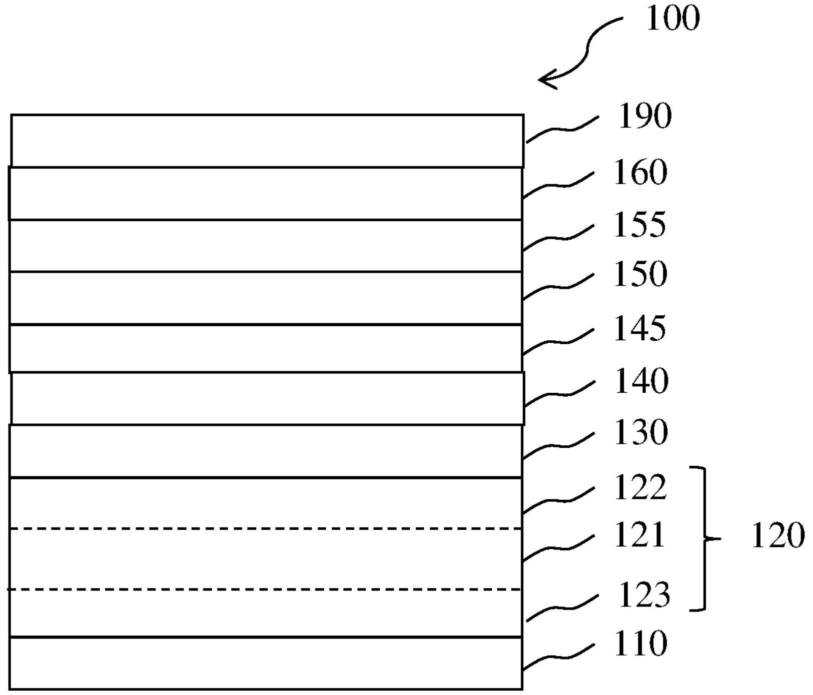

FIG. 7 is a schematic sectional view of an organic electronic device (100), according to an exemplary embodiment of the present invention. The organic electronic device (100) includes a substrate (110), an anode layer (120) that comprises a first anode sub-layer (121) and a second anode sub-layer (122) and a hole injection layer (HIL) (130). The HIL (130) is disposed on the anode layer (120). Onto the HIL (130), a hole transport layer (HTL) (140), an electron blocking layer (EBL) (145), a first emission layer (EML) (150), a hole blocking layer (HBL) (155), an electron transport layer (ETL) (160), and a cathode layer (190) are disposed.

Figure 8:
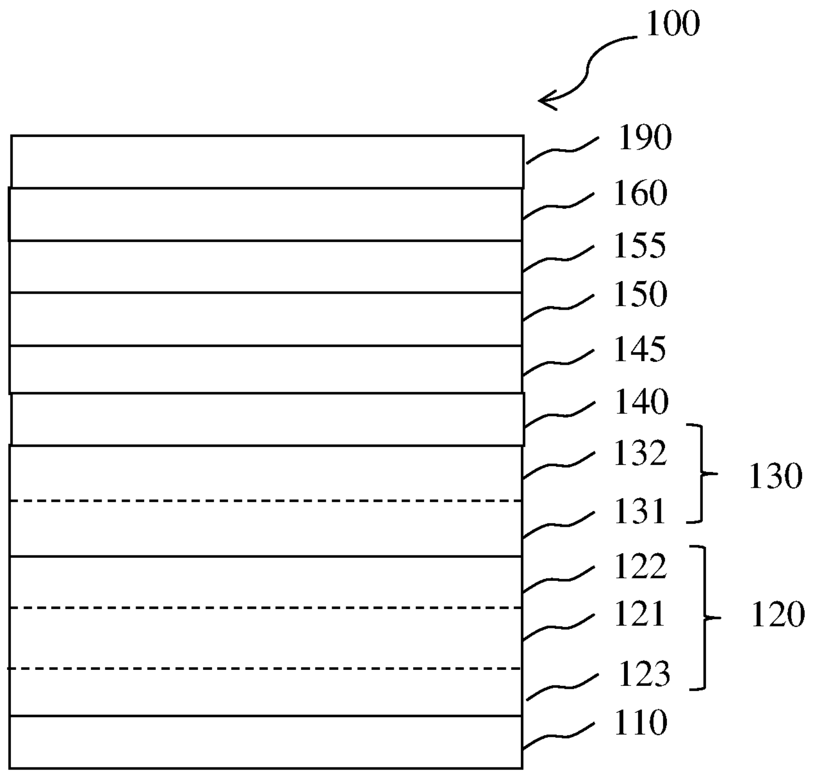

FIG. 8 is a schematic sectional view of an organic electronic device (100), according to an exemplary embodiment of the present invention. The organic electronic device (100) includes a substrate (110), an anode layer (120) that comprises a first anode sub-layer (121) and a second anode sub-layer (122) and a hole injection layer (HIL) (130). The HIL (130) comprises a first hole injection sub-layer (131) and a second hole injection sub-layer (132), wherein the first hole injection sub-layer (131) is disposed on the second anode sub-layer (122) and the second hole injection sub-layer (132) is disposed on the first hole injection sub-layer (131). Onto the HIL (130), a hole transport layer (HTL) (140), an electron blocking layer (EBL) (145), a first emission layer (EML) (150), a hole blocking layer (HBL) (155), an electron transport layer (ETL) (160), and a cathode layer (190) are disposed.

Figure 9:
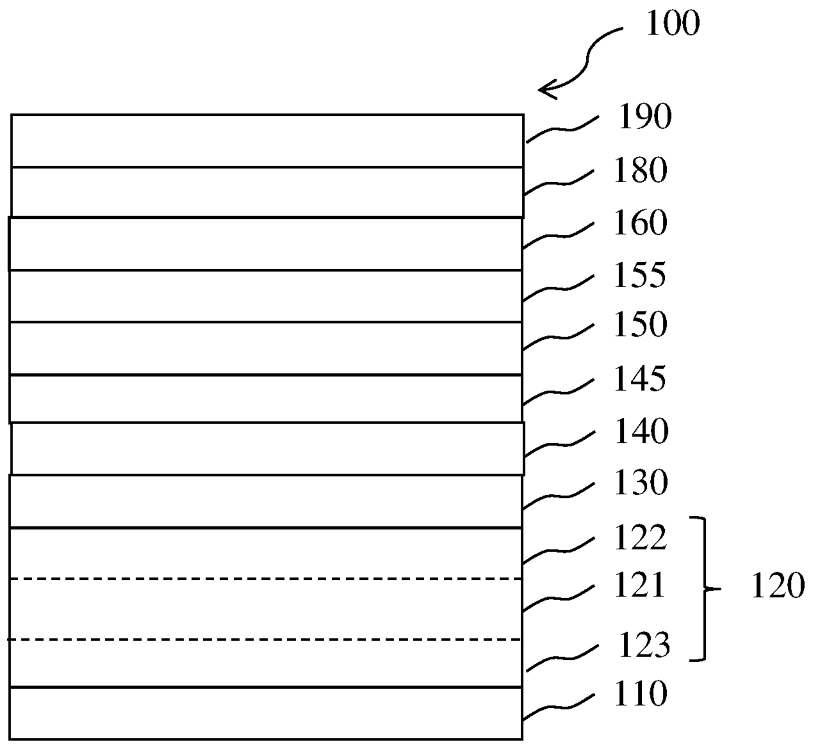

FIG. 9 is a schematic sectional view of an organic electronic device (100), according to an exemplary embodiment of the present invention. The organic electronic device (100) includes a substrate (110), an anode layer (120) that comprises a first anode sub-layer (121), a second anode sub-layer (122) and a third anode sub-layer (123), and a hole injection layer (HIL) (130). The HIL (130) is disposed on the anode layer (120). Onto the HIL (130), a hole transport layer (HTL) (140), an electron blocking layer (EBL) (145), a first emission layer (EML) (150), a hole blocking layer (HBL) (155), an electron transport layer (ETL) (160), an electron injection layer (EIL) (180) and a cathode layer (190) are disposed.

While not shown in FIG. 1 to FIG. 9, a capping and/or a sealing layer may further be formed on the cathode layer 190, in order to seal the organic electronic device 100. In addition, various other modifications may be applied thereto.

Hereinafter, the embodiments are illustrated in more detail with reference to examples. However, the present disclosure is not limited to the following examples.

DETAILED DESCRIPTION

The invention is furthermore illustrated by the following examples which are illustrative only and non-binding.

The compound of formulae (II) and (III) and metal complexes of formula (I) or formulae (Ia) to (Id) may be prepared as described in the literature.

Rate Onset Temperature

The rate onset temperature (TRO) is determined by loading 100 mg compound into a VTE source. As VTE source a point source for organic materials may be used as supplied by Kurt J. Lesker Company (www.lesker.com) or CreaPhys GmbH (http://www.creaphys.com). The VTE source is heated at a constant rate of 15 K/min at a pressure of less than 105 mbar and the temperature inside the source measured with a thermocouple. Evaporation of the compound is detected with a QCM detector which detects deposition of the compound on the quartz crystal of the detector. The deposition rate on the quartz crystal is measured in Ångstrom per second. To determine the rate onset temperature, the deposition rate is plotted against the VTE source temperature. The rate onset is the temperature at which noticeable deposition on the QCM detector occurs. For accurate results, the VTE source is heated and cooled three time and only results from the second and third run are used to determine the rate onset temperature.

To achieve good control over the evaporation rate of an organic compound, the rate onset temperature may be in the range of 200 to 255° C. If the rate onset temperature is below 200° C. the evaporation may be too rapid and therefore difficult to control. If the rate onset temperature is above 255° C. the evaporation rate may be too low which may result in low tact time and decomposition of the organic compound in VTE source may occur due to prolonged exposure to elevated temperatures.

The rate onset temperature is an indirect measure of the volatility of a compound. The higher the rate onset temperature the lower is the volatility of a compound.

In Table 1 are shown rate onset temperatures TRO for metal complexes of formula (I) and formulae (Ia) to (Id).

TABLE 1

| Metal complexes of formula (I) and formulae (Ia) to (Id) | | |
|---|---|---|
| Name | Chemical formula | $T_{RO}$ (° C.) |
| MC-1 | Li TFSI | 222 |
| MC-2 | K TFSI | 236 |
| MC-3 | Cs TFSI | 224 |
| MC-4 | Ag TFSI | 258 |
| MC-5 | Mg $(TFSI)_2$ | 243 |
| MC-6 | Mn $(TFSI)_2$ | 229 |
| MC-7 | Sc $(TFSI)_3$ | 258 |
| MC-8 | Mg $[N(SO_2{}^iC_3F_7)_2]_2$ | 166 |
| MC-9 | Zn $[N(SO_2{}^iC_3F_7)_2]_2$ | 118 |
| MC-10 | Ag $[N(SO_2{}^iC_3F_7)_2]$ | 232 |
| MC-11 | Ag $[N(SO_2C_3F_7)_2]$ | 254 |
| MC-12 | Ag $[N(SO_2C_4F_9)_2]$ | 262 |
| MC-13 | Ag $[N(SO_2CF_3)(SO_2C_4F_9)]$ | 230 |
| MC-14 | Cs $[N(SO_2C_4F_9)_2]$ | 245 |
| MC-15 | Mg $[N(SO_2C_4F_9)_2]_2$ | 219 |
| MC-16 | Ca $[N(SO_2C_4F_9)_2]_2$ | 278 |
| MC-17 | Ag $[N(SO_2C_4F_9)_2]$ | 232 |
| MC-18 | Cu $[N(SO_2{}^iC_3F_7)_2]_2$ | 101 |
| MC-19 | Cu $[N(SO_2C_3F_7)_2]_2$ | 118 |
| MC-20 | Cu $[N(SO_2CF_3)\ (SO_2C_4F_9)]_2$ | 113 |
| MC-21 | Mg $[N(SO_2CF_3)\ (SO_2C_4F_9)]_2$ | 124 |
| MC-22 | Mn $[N(SO_2CF_3)\ (SO_2C_4F_9)]_2$ | 202 |

TABLE 1-continued
| Metal complexes of formula (I) and formulae (Ia) to (Id) | | |
|---|---|---|
| Name | Chemical formula | $T_{RO}$ (° C.) |
| MC-21 | Cu $[N(SO_2CH_3)(SO_2C_4F_9)]_2$ | 179 |
| MC-22 | Ag $[N(SO_2CH_3)(SO_2C_4F_9)]$ | — |
| MC-23 | 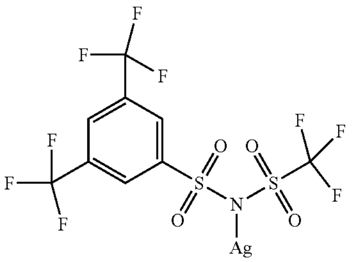 | 254 |
| MC-24 | 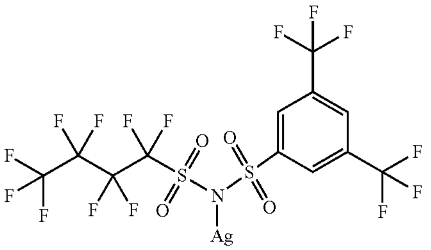 | 238 |
| MC-25 | 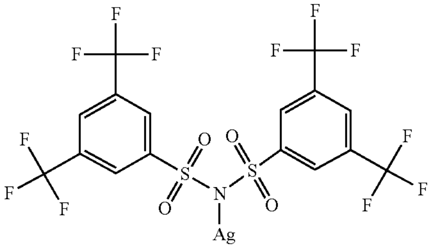 | 262 |
| MC-23 | 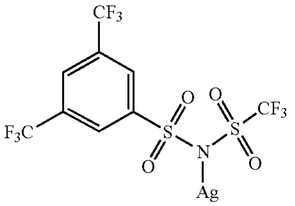 | 254 |
| MC-26 | 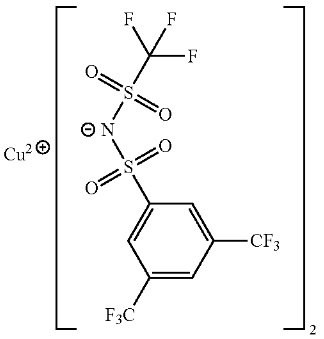 | 180 |

TABLE 1-continued
| Metal complexes of formula (I) and formulae (Ia) to (Id) | | |
|---|---|---|
| Name | Chemical formula | $T_{RO}$ (° C.) |
| MC-27 | 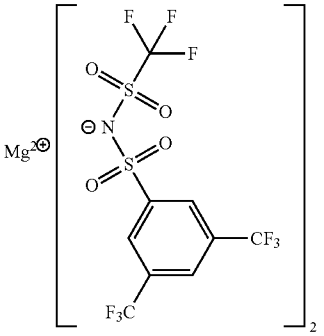 | — |
| MC-28 | 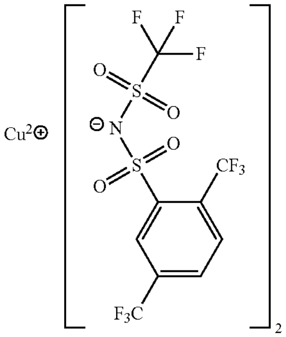 | 167 |
| MC-29 | 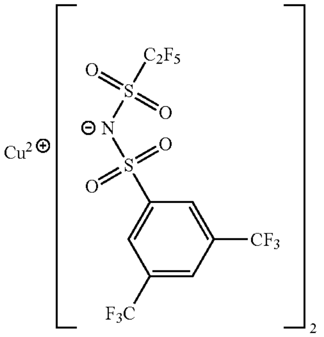 | 282 |
| MC-24 | 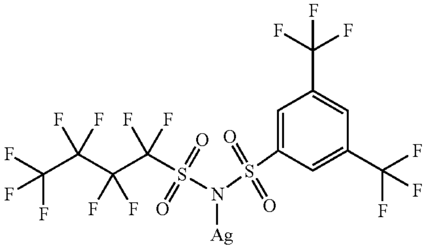 | 238 |

TABLE 1-continued
| Metal complexes of formula (I) and formulae (Ia) to (Id) | | |
|---|---|---|
| Name | Chemical formula | $T_{RO}$ (° C.) |
| MC-30 | 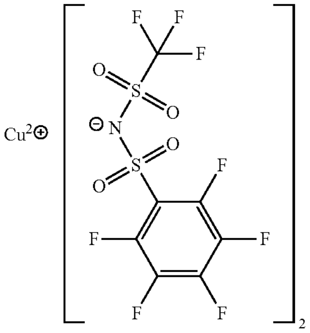 | 263 |
| MC-31 | 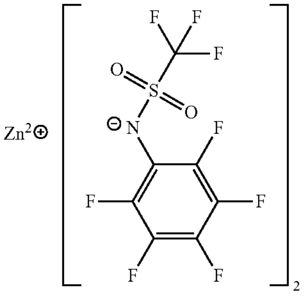 | 194 |
| MC-32 | 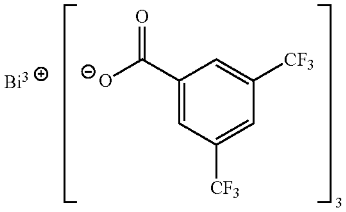 | 190 |
| MC-33 | Cu $[N(SO_2C_2H_5)\ (SO_2C_4F_9)]_2$ | 156 |
| MC-34 | Cu $[N(SO_2{}^iC_3H_7)\ (SO_2C_4F_9)]_2$ | 153 |
| MC-35 | Cu $[N(SO_2{}^iC_3F_7)\ (SO_2C_4F_9)]_2$ | 229 |
| MC-36 | 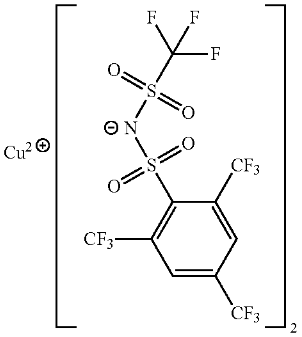 | 168 |

TABLE 1-continued

| Metal complexes of formula (I) and formulae (Ia) to (Id) | | |
|---|---|---|
| Name | Chemical formula | $T_{RO}$ (° C.) |
| MC-37 | 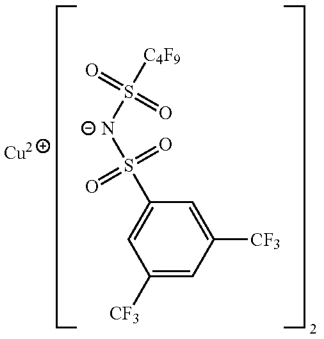 | 160 |

As can be seen in Table 1, the metal complexes of formula (I) and formulae (Ia) to (Id) have rate onset temperatures suitable for mass production of organic electronic devices.

HOMO and LUMO

The HOMO and LUMO are calculated with the program package TURBOMOLE V6.5 (TURBOMOLE GmbH, Litzenhardtstrasse 19, 76135 Karlsruhe, Germany). The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected. If calculated by this method, the HOMO level of N2,N2,N2',N2',N7,N7,N7',N7'-octakis (4-methoxyphenyl)-9,9'-spirobi[fluorene]-2,2',7,7'-tetraamine is-4.27 eV.

Matrix Compounds in the Hole Injection Layer and/or Hole Transport Layer

In Table 1 are shown the HOMO levels and rate onset temperatures TRO for matrix compounds of formula (I). HOMO levels were calculated using TURBOMOLE V6.5 (TURBOMOLE GmbH. Litzenhardtstrasse 19, 76135 Karlsruhe, Germany) by applying the hybrid functional B3LYP with a 6-31G* basis set in the gas phase.

TABLE 2

| Matrix compounds for hole injection layers | | | |
|---|---|---|---|
| Name | Structure | HOMO level (eV) | $T_{RO}$ (° C.) |
| Biphenyl-4-yl(9,9-diphenyl-9H-fluoren-2-yl)-[4-(9-phenyl-9H-carbazol-3-yl)phenyl]-amine F3 | 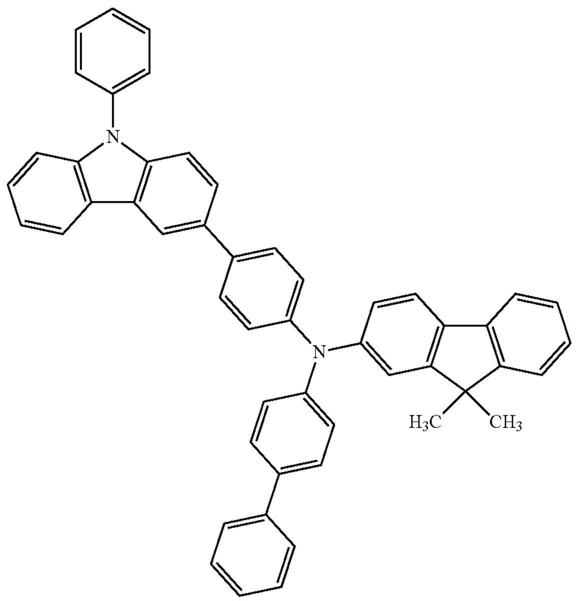 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] | −4.69 | 265 |

TABLE 2-continued
Matrix compounds for hole injection layers
| Name | Structure | HOMO level (eV) | $T_{RO}$ (° C.) |
|---|---|---|---|
| N,N'-Bis(naphthalen-1-yl)-N,N'-bis(phenyl)-benzidine F1 | 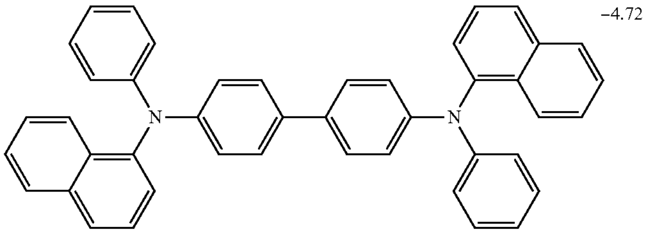 | −4.72 | 272 |
| N4,N4''-di(naphthalen-1-yl)-N4,N4''-diphenyl-[1,1':4',1''-terphenyl]-4,4''-diamine (CAS 139255-16-6) F2 | 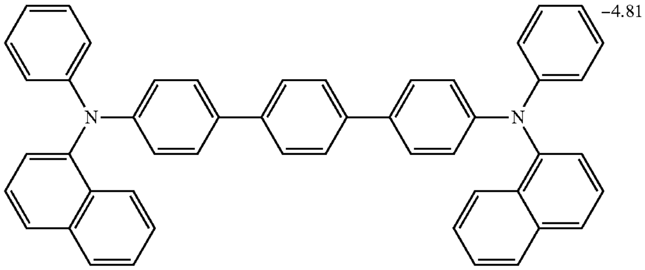 | −4.81 | 260 |
| N-(9,9-dimethyl-9H-fluoren-2-yl)-N-(9,9-diphenyl-9H-fluoren-2-yl)dibenzo[b,d]furan-1-amine F4 | 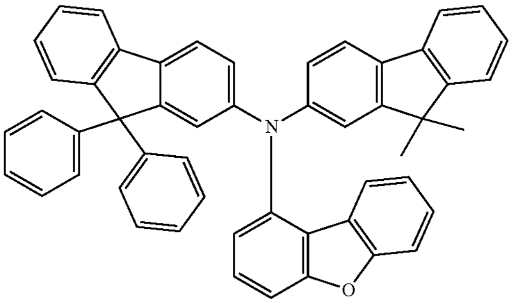 [SMILES: CC1(C)c2ccccc2-c2ccc(N(Cc3cccc4oc5ccccc5c34)c3ccc4c(c3)C(c3ccccc3)(c3ccccc3)c3ccccc3-4)cc21] | −4.82 | 219 |
| 9,9-dimethyl-N,N-bis(4-(naphthalen-1-yl)phenyl)-9H-fluoren-2-amine F8 | 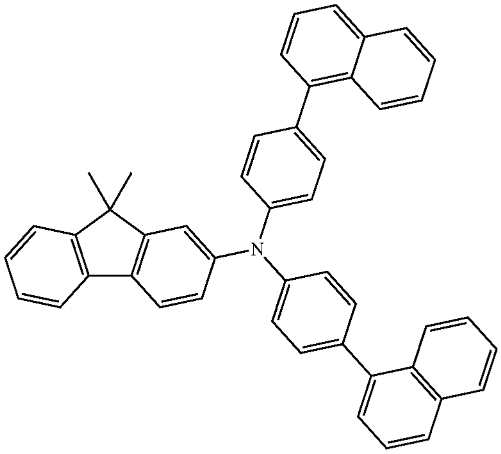 [SMILES: CC1(C)c2ccccc2-c2ccc(N(c3ccc(-c4cccc5ccccc45)cc3)c3ccc(-c4cccc5ccccc45)cc3)cc21] | −4.84 | 232 |

TABLE 2-continued

| Matrix compounds for hole injection layers | | | |
|---|---|---|---|
| Name | Structure | HOMO level (eV) | $T_{RO}$ (° C.) |
| N-([1,1'-biphenyl]-4-yl)-N-(2-(9,9-diphenyl-9H-fluoren-4-yl)phenyl)-9,9-dimethyl-9H-fluoren-2-amine F9 | 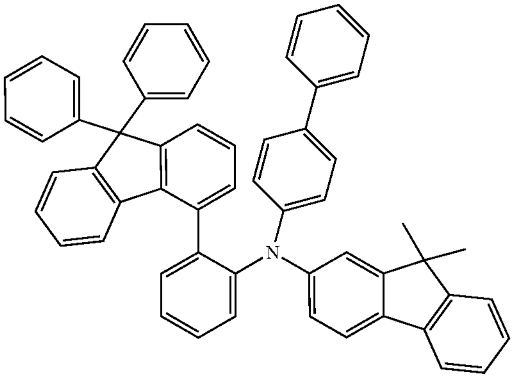 [SMILES: CC1(C)c2ccccc2-c2ccc(N(c3ccc(-c4ccccc4)cc3)c3ccccc3-c3cccc4c3-c3ccccc3C4(c3ccccc3)c3ccccc3)cc21] | −4.84 | 218 |
| N-(9,9-diphenyl-9H-fluoren-2-yl)-N,9-diphenyl-9H-carbazol-2-amine F18 | 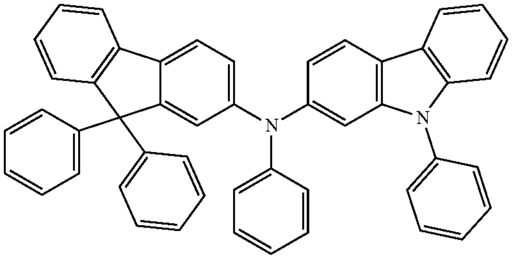 [SMILES: c1ccc(N(c2ccc3c(c2)C(c2ccccc2)(c2ccccc2)c2ccccc2-3)c2ccc3c4ccccc4n(-c4ccccc4)c3c2)cc1] | −4.73 | 216 |

As can be seen in Table 2, the matrix compound of formula (II) or (III) have rate onset temperatures suitable for mass production of organic electronic devices.

General Procedure for Fabrication of Organic Electronic Devices Comprising a Hole Injection Layer Comprising a Metal Complex and a Matrix Compound For Examples 1 to 25 and Examples 36 to 79 in Table 3, 4 and 5, a glass substrate with an anode layer comprising a first anode sub-layer of 120 nm Ag, a second anode sub-layer of 8 nm ITO and a third anode sub-layer of 10 nm ITO was cut to a size of 50 mm×50 mm×0.7 mm, ultrasonically washed with water for 60 minutes and then with isopropanol for 20 minutes. The liquid film was removed in a nitrogen stream, followed by plasma treatment, see Table 3, 4 and 5, to prepare the anode layer. The plasma treatment was performed in nitrogen atmosphere or in an atmosphere comprising 97.6 vol.-% nitrogen and 2.4 vol.-% oxygen, see Table 3, 4 and 5.

Then, the matrix compound and the metal complex were co-deposited in vacuum on the anode layer, to form a hole injection layer (HIL) having a thickness of 10 nm. The composition of the hole injection layer can be seen in Table 3, 4 and 5.

Then, the matrix compound was vacuum deposited on the HIL, to form a HTL having a thickness of 123 nm. The matrix compound in the HTL is selected the same as the matrix compound in the HIL. The matrix compound can be seen in Table 3, 4 and 5.

Then N-(4-(dibenzo[b,d]furan-4-yl)phenyl)-N-(4-(9-phenyl-9H-fluoren-9-yl)phenyl)-[1,1'-biphenyl]-4-amine (CAS 1824678-59-2) was vacuum deposited on the HTL, to form an electron blocking layer (EBL) having a thickness of 5 nm.

Then 97 vol.-% H09 as EML host and 3 vol.-% BD200 (Sun Fine Chemicals, Korea) as fluorescent blue emitter dopant were deposited on the EBL, to form a blue-emitting first emission layer (EML) with a thickness of 20 nm.

Then a hole blocking layer was formed with a thickness of 5 nm by depositing 2-(3'-(9,9-dimethyl-9H-fluoren-2-yl)-[1,1'-biphenyl]-3-yl)-4,6-diphenyl-1,3,5-triazine on the emission layer EML.

Then the electron transporting layer having a thickness of 31 nm was formed on the hole blocking layer by depositing 50 wt.-% 4'-(4-(4-(4,6-diphenyl-1,3,5-triazin-2-yl)phenyl)naphthalen-1-yl)-[1,1'-biphenyl]-4-carbonitrile and 50 wt.-% of LiQ.

Then Ag:Mg (90:10 vol.-%) was evaporated at a rate of 0.01 to 1 Å/s at 10-7 mbar to form a cathode layer with a thickness of 13 nm on the electron transporting layer.

Then, F3 was deposited on the cathode layer to form a capping layer with a thickness of 75 nm.

Comparative Example 1

For comparative example 1 in Table 3, a 15Ω/cm$^2$ glass substrate with 90 nm ITO (available from Corning Co.) was cut to a size of 50 mm×50 mm×0.7 mm, ultrasonically washed with water for 60 minutes and then with isopropanol for 20 minutes. The liquid film was removed in a nitrogen stream, followed by plasma treatment in nitrogen atmosphere at a power of 100 W for 75 seconds to prepare the anode layer.

Then, 99 wt.-% F3 and 1 wt.-% MC-11 were co-deposited in vacuum on the anode layer, to form a hole injection layer (HIL) having a thickness of 10 nm.

Then, F3 was vacuum deposited on the HIL, to form a HTL having a thickness of 123 nm.

Then, the EBL, EML, HBL and ETL are deposited in this order on the HTL, as described for example 1 above.

Then $A^1$ was evaporated at a rate of 0.01 to 1 Å/s at 10-7 mbar to form a cathode layer with a thickness of 100 nm on the electron transporting layer.

Comparative Example 2

For comparative example 2 in Table 3, a glass substrate was cut to a size of 50 mm×50 mm×0.7 mm, ultrasonically washed with water for 60 minutes and then with isopropanol for 20 minutes. The liquid film was removed in a nitrogen stream, followed by plasma treatment in nitrogen atmosphere at a power of 100 W for 75 seconds, to prepare the substrate.

Then, 100 nm Ag was deposited in vacuum on the substrate to form the anode layer.

Then, 99 wt.-% F3 and 1 wt.-% MC-11 were co-deposited in vacuum on the anode layer, to form a hole injection layer (HIL) having a thickness of 10 nm.

Then, F3 was vacuum deposited on the HIL, to form a HTL having a thickness of 123 nm.

Then, the EBL, EML, HBL and ETL, cathode layer and capping layer are deposited in this order on the HTL, as described for example 1 above.

Comparative Example 3

Comparative example 3 in Table 4 was prepared as example 12 but without the hole injection layer (HIL). In comparative example 3, the hole transport layer (HTL) was deposited directly on the anode layer.

Comparative Example 4

Comparative example 4 in Table 3 was prepared as Example 40. In comparative example 4, the hole injection layer comprises metal complex CuPc. CuPc may also be named copper (II) phthalocyanine.

Comparative Example 5

Comparative example 5 in Table 3 was prepared as in Example 40 but without the metal complex MC-26. In comparative example 5, the hole injection layer consisting of F3 was deposited directly on the anode layer. Then, the hole transport layer was deposited directly on the hole injection layer, as described for Example 40 above.

Comparative Example 6

Comparative example 6 in Table 5 was prepared as Example 79. In comparative example 4, the hole injection layer comprises metal complex CuPc.

Comparative Example 7

Comparative example 7 in Table 5 was prepared as Example 79 but without the metal complex MC-26. In comparative example 7, the hole injection layer consisting of F1 was deposited directly on the anode layer. Then, the hole transport layer was deposited directly on the hole injection layer, as described for Example 79 above.

General Procedure for Fabrication of Organic Electronic Devices Comprising a Hole Injection Layer Comprising a First Sub-Layer and a Second Sub-Layer For Examples 26 to 35 and Examples 80 and 81 in Table 6, a glass substrate with an anode layer comprising a first anode sub-layer of 120 nm Ag, a second anode sub-layer of 8 nm ITO and a third anode sub-layer of 10 nm ITO was cut to a size of 50 mm×50 mm×0.7 mm, ultrasonically washed with water for 60 minutes and then with isopropanol for 20 minutes. The liquid film was removed in a nitrogen stream, followed by plasma treatment in an atmosphere comprising 97.6 vol.-% nitrogen and 2.4 vol.-% oxygen at a power of 75 W for 35 seconds, to prepare the anode layer.

Then, the metal complex was deposited in vacuum on the anode layer to form a first hole injection sub-layer. The composition and thickness of the first hole injection sub-layer can be seen in Table 6.

Then, the matrix compound was deposited in vacuum on the first hole injection sub-layer to form a second hole-injection sub-layer. The composition and thickness of the second hole injection sub-layer can be seen in Table 6.

Then, the matrix compound was vacuum deposited on the second hole injection sub-layer to form a HTL with a thickness of 123 nm. The matrix compound in the HTL is selected the same as the matrix compound in the second hole injection sub-layer. The matrix compound can be seen in Table 6.

Then, the EBL, EML, HBL and ETL, cathode layer and capping layer are deposited in this order on the HTL, as described for examples 1 to 25 above.

Comparative Example 8

Comparative example 8 in Table 6 was prepared as Example 81. In comparative example 8, the first hole injection sub-layer comprises metal complex CuPc.

Comparative Example 9

Comparative example 9 in Table 6 was prepared as Example 81 but without the metal complex MC-26. In comparative example 9, the first hole injection sub-layer consisting of F1 was deposited directly on the anode layer. Then, the second hole injection sub-layer was deposited directly on the hole injection layer, as described for Example 81 above.

Comparative Example 10

Comparative example 10 in Table 6 was prepared as Example 80 but without the metal complex MC-26. In comparative example 8, the first hole injection sub-layer consisting of F3 was deposited directly on the anode layer. Then, the second hole injection sub-layer was deposited directly on the hole injection layer, as described for Example 80 above.

The organic electronic device was protected from ambient conditions by encapsulation of the device with a glass slide. Thereby, a cavity is formed, which includes a getter material for further protection.

To assess the performance of the inventive examples compared to the prior art, the current efficiency is measured at 20° C. The current-voltage characteristic is determined using a Keithley 2635 source measure unit, by sourcing an operating voltage U in V and measuring the current in mA flowing through the device under test. The voltage applied to the device is varied in steps of 0.1V in the range between 0 V and 10 V.

Technical Effect

In Table 3 are shown data for organic electronic devices comprising a hole injection layer comprising F3 as matrix compound and a variety of metal complexes of formula (I) and formulae (Ia) to (Id). F3 has a HOMO level of −4.69 eV.

In comparative example 1, the anode layer consists of ITO. The anode layer is treated with nitrogen plasma for 75 s at a power of 100 W. The hole injection layer comprises 1 wt.-% metal complex MC-11. The operating voltage is 4.89 V.

In comparative example 2, the anode layer consists of Ag. The same plasma treatment was applied to the substrate as above. The hole injection layer has the same composition as in comparative example 1. The operating voltage is >10 V.

In example 1, the anode layer consists of a first anode sub-layer consisting of Ag and a second and third anode sub-layer consisting of ITO. The same plasma treatment was applied as above. The hole injection layer has the same composition as in comparative examples 1 and 2. The operating voltage is improved to 4.65 V.

In example 2, the anode layer is the same as in example 1. The anode layer is treated with a nitrogen oxygen plasma (97.6 vol.-% nitrogen and 2.4 vol.-% oxygen) for 60 s at a power of 100 W. The hole injection layer has the same composition as in comparative examples 1 and 2 and example 1. The operating voltage is further improved to 4.52 V.

In example 3, the anode layer and the hole injection layer are the same as in example 2. The anode layer is treated with a nitrogen oxygen plasma (97.6 vol.-% nitrogen and 2.4 vol.-% oxygen) for 30 s at a power of 75 W. The operating voltage is comparable to example 2. In summary, the plasma treatment does not have a substantial impact on operating voltage.

In example 4, the anode layer and plasma treatment are the same as in example 3. The hole injection layer comprises 1 wt.-% metal complex MC-10. The operating voltage is in a similar range to example 3.

In example 5, the anode layer and plasma treatment are the same as in example 4. The hole injection layer comprises 1 wt.-% metal complex MC-13. The operating voltage is in a similar range to example 4.

In example 6, the anode layer is the same as in example 5. The anode layer is treated with a nitrogen oxygen plasma (97.6 vol.-% nitrogen and 2.4 vol.-% oxygen) for 35 s at a power of 75 W. The hole injection layer comprises 1 wt.-% metal complex MC-14. MC-14 comprises Cs cation instead of Ag cation. The operating voltage is improved to 4.17 V.

In example 7, the anode layer and plasma treatment are the same as in example 6. The hole injection layer comprises 1 wt.-% metal complex MC-15. MC-15 comprises a Mg cation instead of a Cs cation. The operating voltage is in a similar range to example 6.

In example 8, the anode layer and plasma treatment are the same as in example 4. The hole injection layer comprises 1 wt.-% metal complex MC-16. MC-16 comprises a Ca cation instead of a Mg cation. The operating voltage is 4.58 V, and thereby still substantially improved over comparative examples 1 and 2.

In example 9 and 10, the hole injection layer comprises two further metal complexes, namely Li TFSI and Cu $(TFSI)_2$. Again the operating voltage is improved over comparative examples 1 and 2.

In example 11, the anode layer and plasma treatment are the same as in example 5. The hole injection layer comprises 1 wt.-% MC-32. MC-32 comprises a Bi cation and a ligand of formula (Ic). The operating voltage is improved over comparative examples 1 and 2.

In examples 36 to 69, the anode layer and plasma treatment are the same as in example 3. The hole injection layer comprises a range of metal complexes at a range of concentrations. The operating voltage is improved over comparative examples 1 2, 3 and 4.

In comparative example 4, the hole injection layer comprises metal complex CuPc. CuPc comprises a Cu(II) cation and a phthalocyanine ligand. The phthalocyanine ligand has two negative charges. Compared to Example 40, the operating voltage is increased from 4.47 to 5.06 V.

In comparative example 5, the hole injection layer is free of metal complex. Compared to example 40, the operating voltage is increased from 4.47 to 4.83 V.

In Table 4 are shown data for organic electronic devices comprising an anode layer consisting of a first anode sub-layer consisting of Ag and a second and third anode sub-layer consisting of ITO. The anode layer was treated with a nitrogen oxygen plasma (97.6 vol.-% nitrogen and 2.4 vol.-% oxygen) for 35 s at a power of 75 W. In comparative example 3, the organic electronic device is free of a hole injection layer. The operating voltage is very high at 7.17 V.

In examples 12 to 21, the hole injection layer comprises matrix compound F2. F2 has a HOMO level of −4.81 eV.

In example 12, the hole injection layer further comprises 2 wt.-% metal complex MC-10. The operating voltage is improved to 4.45 V.

In examples 13 and 14, the concentration of metal complex is increased to 3 and 5 wt.-% respectively. The operating voltage is further improved to 4.32 and 4.12 V, respectively.

In examples 15 to 18, the hole injection layer further comprises 2 to 10 wt.-% metal complex MC-17. The operating voltage is improved to 4.3 to 4.14 V.

In examples 19 to 21, the hole injection layer further comprises 2 to 5 wt.-% metal complex MC-26. MC-26 comprises a Cu cation instead of a Ag cation. The operating voltage is further improved to 4.18 to 4.1 V.

In summary, a substantial improvement in performance can be obtained, in particular if the concentration of metal complex is 3 wt.-% or higher.

In Table 5, data are shown for organic electronic devices comprising an anode layer consisting of a first anode sub-layer consisting of Ag and a second and third anode sub-layer consisting of ITO. The anode layer was treated with a nitrogen oxygen plasma (97.6 vol.-% nitrogen and 2.4 vol.-% oxygen) for 35 s at a power of 75 W.

In example 22, the hole injection layer comprises 97 wt.-% matrix compound F4 and 3 wt.-% metal complex MC-5. F4 has a HOMO level of −4.82 eV. The operating voltage is improved for 4.17 V.

In example 23, the hole injection layer comprises 97 wt.-% matrix compound F9 and 3 wt.-% metal complex MC-5. F9 has a HOMO level of −4.84 eV. The operating voltage is still within an acceptable range at 4.42 V.

In example 24, the hole injection layer comprises 97 wt.-% matrix compound F4 and 3 wt.-% metal complex MC-32. MC-32 comprises a Bi cation and a ligand of formula (Ic). The operating voltage is improved to 4.27 V.

In example 25, the hole injection layer comprises 97 wt.-% matrix compound F4 and 3 wt.-% metal complex MC-31. MC-31 comprises a Zn cation and a ligand of formula (Ib). The operating voltage is improved to 4.41 V.

In example 70 to 79, the hole injection layer comprises a range of matrix compounds and a range of metal complexes. The operating voltage is improved compared to comparative examples 6 and 7.

In comparative example 6, the hole injection layer comprises metal complex CuPc. Compared to example 79, the operating voltage is increased from 4.82 to 6.08 V.

In comparative example 7, the hole injection layer consists of matrix compound F1. Compared to example 79, the operating voltage is increased from 4.82 to 5.57 V.

In summary, even if the HOMO level of the matrix compound further away vacuum level the performance of organic electronic devices is improved.

In Table 6 are shown data for an organic electronic device comprising an anode layer consisting of a first anode sub-layer consisting of Ag and a second and third anode sub-layer consisting of ITO. The anode layer was treated with a nitrogen oxygen plasma (97.6 vol.-% nitrogen and 2.4 vol.-% oxygen) for 35 s at a power of 75 W. The hole injection layer comprises of a first hole injection sub-layer comprising a metal complex of formula (I) and formulae (Ia) to (Id) and a second hole injection sub-layer comprising of matrix compound.

In example 26, the first hole injection sub-layer comprises of metal complex MC-14 and the second hole injection sub-layer comprises of matrix compound F3. The first hole injection sub-layer has a thickness of 2 nm. The operating voltage is 4.5 V, and thereby substantially improved over comparative examples 1 and 2, see Table 3.

In examples 27 and 28, the thickness of the first hole injection sub-layer is increased to 3 and 5 nm, respectively. The operating voltage is comparable to example 26.

In examples 29 to 31, the first hole injection sub-layer comprises of metal complex MC-32 with a thickness of 2 to 5 nm. The second hole injection sub-layer comprises matrix compound F3. The operating voltage is substantially improved to comparative examples 1 and 2.

In example 32, the second hole injection sub-layer comprises matrix compound F4. F4 has a HOMO level of −4.82 eV. The HOMO level is further away from vacuum level than the HOMO level of F3, see Table 6. The operating voltage is improved to 4.12 V.

In example 33, the second hole injection sub-layer comprises matrix compound F9. F9 has a HOMO level of −4.84 eV. Thereby the HOMO level is even further away from vacuum level compared to F3. The operating voltage is improved to 4.25 V.

In example 34, the first hole injection sub-layer comprises metal complex MC-31. The second hole injection sub-layer comprises matrix compound F4. F4 has a HOMO level of −4.82 eV. The operating voltage is improved to 4.14 V.

In example 35, the second hole injection sub-layer comprises matrix compound F9. F9 has a HOMO level of −4.84 eV. The operating voltage is improved to 4.32 V.

In examples 80 and 81, the first hole injection sub-layer comprises metal complex MC-26. The second hole injection sub-layer comprises matrix compounds F3 and F1, respectively. The HOMO level of F3 and F1 can be seen in Table 6. The operating voltage is in a range comparable to Examples 29 and 30.

In comparative example 8, the first hole-injection sub-layer comprises metal complex CuPc. The second hole injection sub-layer comprises matrix compound F1. Compared to Example 81, the operating voltage is increased from 4.62 V to >10 V.

In comparative examples 9 and 10, the first hole injection sub-layer and the second hole injection sub-layer consist of matrix compounds F1 (comparative example 9) and F3 (comparative example 10), respectively. The HOMO level of F1 and F3 can be seen in Table 6. The operating voltage is substantially increased compared to Examples 26 to 35 and Examples 80 and 81.

In summary, a substantial improvement in performance, in particular operating voltage, may be achieved in organic electronic devices according to invention.

A reduction in operating voltage is beneficial for reduced power consumption and improved battery life, in particular in mobile devices.

TABLE 3

Organic electronic devices comprising a hole injection layer comprising a metal complex and a matrix compound

| | Anode | Gas | P [W] | t [s] | Matrix compound | Concentration matrix compound [wt.-%] | Metal complex | Concentration of metal complex [wt %] | U At 50 mA/cm$^2$ [V] |
|---|---|---|---|---|---|---|---|---|---|
| Comparative example 1 | ITO | N2 | 100 | 75 | F3 | 99 | MC-11 | 1 | 4.89 |
| Comparative example 2 | Ag | N2 | 100 | 75 | F3 | 99 | MC-11 | 1 | >10 |
| Example 1 | ITO/Ag/ITO | N2 | 100 | 75 | F3 | 99 | MC-11 | 1 | 4.65 |
| Example 2 | ITO/Ag/ITO | $N_2$:$O_2$ | 100 | 60 | F3 | 99 | MC-11 | 1 | 4.52 |
| Example 3 | ITO/Ag/ITO | $N_2$:$O_2$ | 75 | 30 | F3 | 99 | MC-11 | 1 | 4.56 |
| Example 4 | ITO/Ag/ITO | $N_2$:$O_2$ | 75 | 30 | F3 | 99 | MC-10 | 1 | 4.64 |
| Example 5 | ITO/Ag/ITO | $N_2$:$O_2$ | 75 | 30 | F3 | 99 | MC-13 | 1 | 4.60 |
| Example 6 | ITO/Ag/ITO | $N_2$:$O_2$ | 75 | 35 | F3 | 99 | MC-14 | 1 | 4.17 |
| Example 7 | ITO/Ag/ITO | $N_2$:$O_2$ | 75 | 35 | F3 | 99 | MC-15 | 1 | 4.16 |
| Example 8 | ITO/Ag/ITO | $N_2$:$O_2$ | 75 | 35 | F3 | 99 | MC-16 | 1 | 4.58 |
| Example 9 | ITO/Ag/ITO | $N_2$:$O_2$ | 75 | 35 | F3 | 99 | Li TFSI | 1 | 4.58 |
| Example 10 | ITO/Ag/ITO | $N_2$:$O_2$ | 75 | 35 | F3 | 99 | Cu $(TFSI)_2$ | 1 | 3.91 |
| Example 11 | ITO/Ag/ITO | $N_2$:$O_2$ | 75 | 30 | F3 | 99 | MC-32 | 1 | 4.53 |
| Example 36 | ITO/Ag/ITO | $N_2$:$O_2$ | 75 | 30 | F3 | 99 | MC-25 | 1 | 4.54 |
| Example 37 | ITO/Ag/ITO | $N_2$:$O_2$ | 75 | 30 | F3 | 97 | MC-25 | 3 | 4.5 |
| Example 38 | ITO/Ag/ITO | $N_2$:$O_2$ | 75 | 30 | F3 | 95 | MC-25 | 5 | 4.49 |
| Example 39 | ITO/Ag/ITO | $N_2$:$O_2$ | 75 | 30 | F3 | 92 | MC-25 | 8 | 4.48 |
| Example 40 | ITO/Ag/ITO | $N_2$:$O_2$ | 75 | 30 | F3 | 99 | MC-26 | 1 | 4.47 |
| Example 41 | ITO/Ag/ITO | $N_2$:$O_2$ | 75 | 30 | F3 | 99 | MC-30 | 1 | 4.56 |
| Example 42 | ITO/Ag/ITO | $N_2$:$O_2$ | 75 | 30 | F3 | 97 | MC-30 | 3 | 4.48 |
| Example 43 | ITO/Ag/ITO | $N_2$:$O_2$ | 75 | 30 | F3 | 95 | MC-30 | 5 | 4.51 |
| Example 44 | ITO/Ag/ITO | $N_2$:$O_2$ | 75 | 30 | F3 | 90 | MC-30 | 10 | 4.50 |
| Example 45 | ITO/Ag/ITO | $N_2$:$O_2$ | 75 | 30 | F3 | 99 | MC-33 | 1 | 4.48 |
| Example 46 | ITO/Ag/ITO | $N_2$:$O_2$ | 75 | 30 | F3 | 98 | MC-33 | 2 | 4.43 |
| Example 47 | ITO/Ag/ITO | $N_2$:$O_2$ | 75 | 30 | F3 | 97 | MC-33 | 3 | 4.42 |
| Example 48 | ITO/Ag/ITO | $N_2$:$O_2$ | 75 | 30 | F3 | 95 | MC-33 | 5 | 4.41 |

TABLE 3-continued

Organic electronic devices comprising a hole injection layer comprising a metal complex and a matrix compound

| | Anode | Gas | P [W] | t [s] | Matrix compound | Concentration matrix compound [wt.-%] | Metal complex | Concentration of metal complex [wt %] | U At 50 mA/cm$^2$ [V] |
|---|---|---|---|---|---|---|---|---|---|
| Example 49 | ITO/Ag/ITO | $N_2$:$O_2$ | 75 | 30 | F3 | 93 | MC-33 | 7 | 4.41 |
| Example 50 | ITO/Ag/ITO | $N_2$:$O_2$ | 75 | 30 | F3 | 90 | MC-33 | 10 | 4.41 |
| Example 51 | ITO/Ag/ITO | $N_2$:$O_2$ | 75 | 30 | F3 | 99 | MC-34 | 1 | 4.52 |
| Example 52 | ITO/Ag/ITO | $N_2$:$O_2$ | 75 | 30 | F3 | 98 | MC-34 | 2 | 4.44 |
| Example 53 | ITO/Ag/ITO | $N_2$:$O_2$ | 75 | 30 | F3 | 97 | MC-34 | 3 | 4.45 |
| Example 54 | ITO/Ag/ITO | $N_2$:$O_2$ | 75 | 30 | F3 | 95 | MC-34 | 5 | 4.42 |
| Example 55 | ITO/Ag/ITO | $N_2$:$O_2$ | 75 | 30 | F3 | 93 | MC-34 | 7 | 4.45 |
| Example 56 | ITO/Ag/ITO | $N_2$:$O_2$ | 75 | 30 | F3 | 90 | MC-34 | 10 | 4.47 |
| Example 57 | ITO/Ag/ITO | $N_2$:$O_2$ | 75 | 30 | F3 | 99 | MC-35 | 1 | 4.6 |
| Example 58 | ITO/Ag/ITO | $N_2$:$O_2$ | 75 | 30 | F3 | 98 | MC-35 | 2 | 4.51 |
| Example 59 | ITO/Ag/ITO | $N_2$:$O_2$ | 75 | 30 | F3 | 96 | MC-35 | 4 | 4.48 |
| Example 60 | ITO/Ag/ITO | $N_2$:$O_2$ | 75 | 30 | F3 | 99 | MC-36 | 1 | 4.57 |
| Example 61 | ITO/Ag/ITO | $N_2$:$O_2$ | 75 | 30 | F3 | 95 | MC-36 | 5 | 4.48 |
| Example 62 | ITO/Ag/ITO | $N_2$:$O_2$ | 75 | 30 | F3 | 92 | MC-36 | 8 | 4.48 |
| Example 63 | ITO/Ag/ITO | $N_2$:$O_2$ | 75 | 30 | F3 | 90 | MC-36 | 10 | 4.50 |
| Example 64 | ITO/Ag/ITO | $N_2$:$O_2$ | 75 | 30 | F3 | 99 | MC-37 | 1 | 4.45 |
| Example 65 | ITO/Ag/ITO | $N_2$:$O_2$ | 75 | 30 | F3 | 98 | MC-37 | 2 | 4.41 |
| Example 66 | ITO/Ag/ITO | $N_2$:$O_2$ | 75 | 30 | F3 | 97 | MC-37 | 3 | 4.40 |
| Example 67 | ITO/Ag/ITO | $N_2$:$O_2$ | 75 | 30 | F3 | 95 | MC-37 | 5 | 4.40 |
| Example 68 | ITO/Ag/ITO | $N_2$:$O_2$ | 75 | 30 | F3 | 93 | MC-37 | 7 | 4.40 |
| Example 69 | ITO/Ag/ITO | $N_2$:$O_2$ | 75 | 30 | F3 | 90 | MC-37 | 10 | 4.41 |
| Comparative example 4 | ITO/Ag/ITO | $N_2$:$O_2$ | 75 | 30 | F3 | 99 | CuPc | 1 | 5.06 |
| Comparative example 5 | ITO/Ag/ITO | $N_2$:$O_2$ | 75 | 30 | F3 | 100 | — | 0 | 4.83 |

TABLE 4

Organic electronic devices comprising a hole injection layer comprising a metal complex and a matrix compound

| | Anode | Gas | P [W] | t [s] | Matrix compound | Concentration matrix compound [wt.-%] | Metal complex | Concentration of metal complex [wt %] | U At 50 mA/cm$^2$ [V] |
|---|---|---|---|---|---|---|---|---|---|
| Comparative example 3 | ITO/Ag/ITO | $N_2$:$O_2$ | 75 | 35 | — | — | — | — | 7.17 |
| Example 12 | ITO/Ag/ITO | $N_2$:$O_2$ | 75 | 35 | F2 | 98 | MC-10 | 2 | 4.45 |
| Example 13 | ITO/Ag/ITO | $N_2$:$O_2$ | 75 | 35 | F2 | 97 | MC-10 | 3 | 4.32 |
| Example 14 | ITO/Ag/ITO | $N_2$:$O_2$ | 75 | 35 | F2 | 95 | MC-10 | 5 | 4.12 |
| Example 15 | ITO/Ag/ITO | $N_2$:$O_2$ | 75 | 35 | F2 | 97 | MC-17 | 3 | 4.30 |
| Example 16 | ITO/Ag/ITO | $N_2$:$O_2$ | 75 | 35 | F2 | 95 | MC-17 | 5 | 4.21 |
| Example 17 | ITO/Ag/ITO | $N_2$:$O_2$ | 75 | 35 | F2 | 93 | MC-17 | 7 | 4.17 |
| Example 18 | ITO/Ag/ITO | $N_2$:$O_2$ | 75 | 35 | F2 | 90 | MC-17 | 10 | 4.14 |
| Example 19 | ITO/Ag/ITO | $N_2$:$O_2$ | 75 | 35 | F2 | 98 | MC-26 | 2 | 4.18 |
| Example 20 | ITO/Ag/ITO | $N_2$:$O_2$ | 75 | 35 | F2 | 97 | MC-26 | 3 | 4.13 |
| Example 21 | ITO/Ag/ITO | $N_2$:$O_2$ | 75 | 35 | F2 | 95 | MC-26 | 5 | 4.10 |

TABLE 5

Organic electronic devices comprising a hole injection layer comprising a metal complex and a matrix compound

| | Anode | Gas | P [W] | t [s] | Matrix com-pound | HOMO level of matrix compound [eV] | Concentration matrix compound [wt.-%] | Metal complex | Concentration of metal complex [wt %] | U At 50 mA/cm$^2$ [V] |
|---|---|---|---|---|---|---|---|---|---|---|
| Example 22 | ITO/Ag/ITO | $N_2$:$O_2$ | 75 | 35 | F4 | −4.82 | 97 | MC-5 | 3 | 4.17 |
| Example 23 | ITO/Ag/ITO | $N_2$:$O_2$ | 75 | 35 | F9 | −4.84 | 97 | MC-5 | 3 | 4.42 |
| Example 24 | ITO/Ag/ITO | $N_2$:$O_2$ | 75 | 35 | F4 | −4.82 | 97 | MC-32 | 3 | 4.27 |
| Example 25 | ITO/Ag/ITO | $N_2$:$O_2$ | 75 | 35 | F4 | −4.82 | 97 | MC-31 | 3 | 4.41 |
| Example 70 | ITO/Ag/ITO | $N_2$:$O_2$ | 75 | 30 | F4 | −4.82 | 95 | MC-25 | 5 | 4.31 |
| Example 71 | ITO/Ag/ITO | $N_2$:$O_2$ | 75 | 30 | F4 | −4.82 | 90 | MC-25 | 10 | 4.28 |
| Example 72 | ITO/Ag/ITO | $N_2$:$O_2$ | 75 | 30 | F4 | −4.82 | 85 | MC-25 | 15 | 4.29 |

TABLE 5-continued

Organic electronic devices comprising a hole injection layer comprising a metal complex and a matrix compound

| | Anode | Gas | P [W] | t [s] | Matrix compound | HOMO level of matrix compound [eV] | Concentration matrix compound [wt.-%] | Metal complex | Concentration of metal complex [wt %] | U At 50 $mA/cm^2$ [V] |
|---|---|---|---|---|---|---|---|---|---|---|
| Example 73 | ITO/Ag/ITO | $N_2:O_2$ | 75 | 30 | F2 | −4.81 | 95 | MC-25 | 5 | 4.17 |
| Example 74 | ITO/Ag/ITO | $N_2:O_2$ | 75 | 30 | F2 | −4.81 | 90 | MC-25 | 10 | 4.16 |
| Example 75 | ITO/Ag/ITO | $N_2:O_2$ | 75 | 30 | F2 | −4.81 | 85 | MC-25 | 15 | 4.15 |
| Example 76 | ITO/Ag/ITO | $N_2:O_2$ | 75 | 30 | F18 | −4.73 | 98 | MC-35 | 2 | 4.58 |
| Example 77 | ITO/Ag/ITO | $N_2:O_2$ | 75 | 30 | F18 | −4.73 | 94 | MC-35 | 6 | 4.44 |
| Example 78 | ITO/Ag/ITO | $N_2:O_2$ | 75 | 30 | F18 | −4.73 | 90 | MC-35 | 10 | 4.42 |
| Example 79 | ITO/Ag/ITO | $N_2:O_2$ | 75 | 30 | F1 | −4.72 | 99 | MC-26 | 1 | 4.82 |
| Comparative example 6 | ITO/Ag/ITO | $N_2:O_2$ | 75 | 30 | F1 | −4.72 | 99 | CuPc | 1 | 6.08 |
| Comparative example 7 | ITO/Ag/ITO | $N_2:O_2$ | 75 | 30 | F1 | −4.72 | 100 | — | 0 | 5.57 |

TABLE 6

Organic electronic device comprising a hole injection layer comprising a first hole injection sub-layer (“first sub-layer”) and a second hole injection sub-layer (“second sub-layer”)

| | Anode | Gas | P [W] | t [s] | Composition of first sub-layer | Thickness of first sub-layer [nm] | Composition of second sub-layer | Thickness of second sub-layer [nm] | HOMO level of compound in second sub-layer [eV] | U At 50 $mA/cm^2$ [V] |
|---|---|---|---|---|---|---|---|---|---|---|
| Example 26 | ITO/Ag/ITO | $N_2:O_2$ | 75 | 35 | MC-14 | 2 | F3 | 8 | -4.69 | 4.50 |
| Example 27 | ITO/Ag/ITO | $N_2:O_2$ | 75 | 35 | MC-14 | 3 | F3 | 7 | -4.69 | 4.54 |
| Example 28 | ITO/Ag/ITO | $N_2:O_2$ | 75 | 35 | MC-14 | 5 | F3 | 5 | -4.69 | 4.55 |
| Example 29 | ITO/Ag/ITO | $N_2:O_2$ | 75 | 35 | MC-32 | 2 | F3 | 8 | -4.69 | 4.68 |
| Example 30 | ITO/Ag/ITO | $N_2:O_2$ | 75 | 35 | MC-32 | 3 | F3 | 7 | -4.69 | 4.63 |
| Example 31 | ITO/Ag/ITO | $N_2:O_2$ | 75 | 35 | MC-32 | 5 | F3 | 5 | -4.69 | 4.55 |
| Example 32 | ITO/Ag/ITO | $N_2:O_2$ | 75 | 35 | MC-32 | 3 | F4 | 7 | -4.82 | 4.12 |
| Example 33 | ITO/Ag/ITO | $N_2:O_2$ | 75 | 35 | MC-32 | 3 | F9 | 7 | -4.84 | 4.25 |
| Example 34 | ITO/Ag/ITO | $N_2:O_2$ | 75 | 35 | MC-31 | 3 | F4 | 7 | -4.82 | 4.14 |
| Example 35 | ITO/Ag/ITO | $N_2:O_2$ | 75 | 35 | MC-31 | 3 | F9 | 7 | -4.84 | 4.32 |
| Example 80 | ITO/Ag/ITO | $N_2:O_2$ | 75 | 35 | MC-26 | 5 | F3 | 3 | -4.69 | 4.66 |
| Example 81 | ITO/Ag/ITO | $N_2:O_2$ | 75 | 35 | MC-26 | 5 | F1 | 4 | -4.72 | 4.62 |
| Comparative example 8 | ITO/Ag/ITO | $N_2:O_2$ | 75 | 35 | CuPc | 5 | F1 | 4 | -4.72 | >10 |
| Comparative example 9 | ITO/Ag/ITO | $N_2:O_2$ | 75 | 35 | F3 | 5 | F1 | 3 | -4.72 | 6.08 |
| Comparative example 10 | ITO/Ag/ITO | $N_2:O_2$ | 75 | 35 | F3 | 5 | F3 | 3 | -4.69 | 5.11 |

Comparative examples 4, 6 and 8 are examples of the invention with increased operating voltage.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word “comprising” does not exclude other elements or steps, and the indefinite article “a” or “an” does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

The invention claimed is:

1. An organic electronic device comprising a substrate, an anode layer, a cathode layer, at least one first emission layer, and a hole injection layer, wherein the hole injection layer comprises a metal complex, wherein the metal complex has the formula (I)—

$$M^{n}(L^{\ominus})_{n} \quad (I),$$

wherein

M is a metal ion, n is the valency of M,

L is a ligand comprising at least 4 covalently bound atoms, wherein the at least 4 covalently bound atoms comprise (i) at least three carbon atoms or at least four carbon atoms, (ii) at least two oxygen atoms or one oxygen and one nitrogen atom, two to four oxygen atoms, or two to four oxygen atoms and zero to two nitrogen atoms, (iii) at least one or more groups selected from halogen, CN, substituted or unsubstituted $C_1$ to $C_6$ alkyl, or substituted or unsubstituted $C_1$ to $C_6$ alkoxy, two or more groups selected from halogen, CN, substituted or unsubstituted $C_1$ to $C_6$ alkyl, or substituted or unsubstituted $C_1$ to $C_6$ alkoxy, at least one or more groups selected from halogen, CN, substituted $C_1$ to $C_6$ alkyl, or substituted $C_1$ to $C_6$ alkoxy, two or more groups selected from halogen, CN, perfluorinated $C_1$ to $C_6$ alkyl, or perfluorinated $C_1$ to $C_6$ alkoxy, or one or more groups selected from substituted or unsubstituted $C_1$ to $C_6$ alkyl, substituted or unsubstituted $C_6$ to $C_{12}$ aryl, or substituted or unsubstituted $C_3$ to $C_{12}$ heteroaryl, or (iv) a combination thereof, wherein the substituents are selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^3$, $COOR^3$, halogen, CN, or a combination thereof; wherein $R^3$ is selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, or a combination thereof, n is an integer from 1 to 4, and wherein the charge neutral form of M has an electro-negativity value according to Allen of less than 2.4;

the anode layer comprises a first anode sub-layer and a second anode sub-layer, wherein the first anode sub-layer comprises a first metal having a work function in the range of ≥4 and ≤6 eV, and the second anode sub-layer comprises a transparent conductive oxide;

wherein the hole injection layer is arranged between the first emission layer and the anode layer, the first anode sub-layer is arranged closer to the substrate, and the second anode sub-layer is arranged closer to the hole injection layer.

2. The organic electronic device according to claim 1, wherein the hole injection layer is free of ionic liquids, metal phthalocyanine, CuPc, HAT-CN, Pyrazino[2,3-f][1,10]phenanthroline-2,3-dicarbonitrile, $F_4TCNQ$, metal fluoride and/or metal oxides, wherein the metal in the metal oxide is selected from Re and/or Mo.

3. The organic electronic device according to claim 1, wherein M of the metal complex of formula (I) is selected from (i) a metal ion wherein the corresponding metal has an electronegativity value according to Allen of less than 2.4, (ii) an alkali, alkaline earth, rare earth, transition metal, or group III or V metal, (iii) a metal with an atomic mass ≥24 Da, or (iv) a metal with an atomic mass ≥24 Da and having an oxidation number ≥2.

4. The organic electronic device according to claim 1, wherein the metal complex of formula (I) has a molecular weight Mw of ≥287 and ≤2000 g/mol.

5. The organic electronic device according to claim 1, wherein the anode layer of the organic electronic device comprises in addition a third anode sub-layer.

6. The organic electronic device according to claim 1, wherein the transparent conductive oxide is selected from the group comprising indium tin oxide or indium zinc oxide.

7. The organic electronic device according to claim 1, wherein the first metal of the first anode sub-layer is selected from the group comprising Ag, Mg, Al, Cr, Pt, Au, Pd, Ni, Nd, or Ir.

8. The organic electronic device according to claim 1, wherein the hole injection layer further comprises a matrix compound.

9. The organic electronic device according to claim 8, wherein the matrix compound of the hole injection layer has a molecular weight Mw of ≥400 and ≤2000 g/mol.

10. The organic electronic device according to claim 8, wherein the HOMO level of the matrix compound of the hole injection layer is further away from vacuum level than the HOMO level of N2,N2,N2',N2',N7,N7,N7',N7'-octakis(4-methoxyphenyl)-9,9'-spirobi[fluorene]-2,2',7,7'-tetraamine when determined under the same conditions.

11. The organic electronic device according to claim 8, wherein the matrix compound of the hole injection layer comprises at least one arylamine compound, diarylamine compound, triarylamine compound, a compound of formula (II) or a compound of formula (III):

(II)

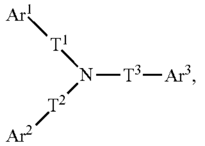

(III)

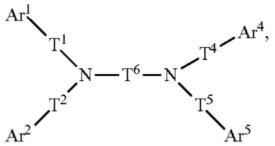

wherein:

$T^1$, $T^2$, $T^3$, $T^4$ and $T^5$ are independently selected from a single bond, phenylene, biphenylene, terphenylene or naphthenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, Art and $Ar^5$ are selected the same or different from the group comprising H, D, F, C(—O)$R^2$, CN, $Si(R^2)_3$, P(—O)$(R^2)_2$, $OR^2$, S(—O)$R^2$, S(—O)$_2R^2$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R^2$ is selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl.

12. The organic electronic device according to claim 11, wherein $T^1$, $T^2$, $T^3$, $T^4$ and $T^5$ are independently selected from a single bond, phenylene, biphenylene, terphenylene or naphthenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, straight-chain alkyl having 1 to 20 carbon atoms, branched alkyl having 1 to 20 carbon atoms, cyclic alkyl having 3 to 20 carbon atoms, alkenyl or alkynyl groups having 2 to 20 carbon atoms, alkoxy groups having 1 to 20 carbon atoms, $C_6$ to $C_{18}$ aryl, $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle.

13. The organic electronic device according to claim 11, wherein $Ar^1$, $Ar^2$, $Ar^3$, $Ar^4$ and $Ar^5$ are independently selected from D1 to D16:

(D1)

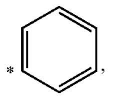

(D2)

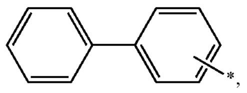

(D3)

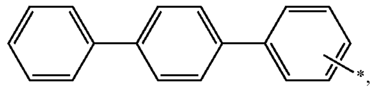

(D4)

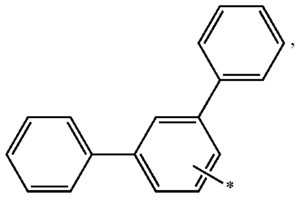

(D5)

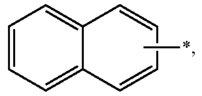

(D6)

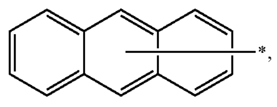

(D7)

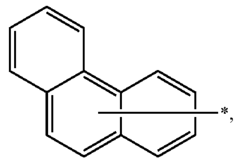

-continued
(D8)
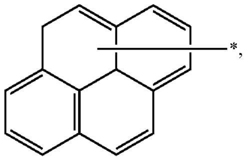
(D9)
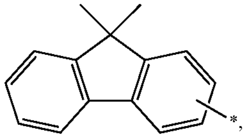
(D10)
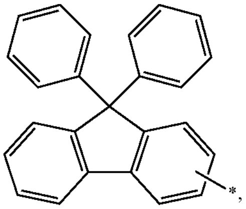
(D11)
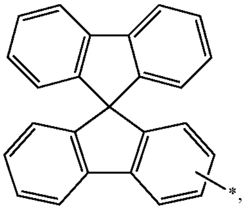
(D12)
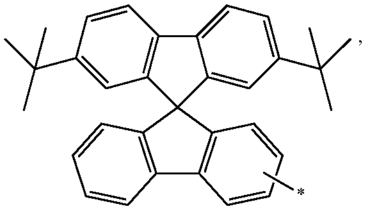
(D13)
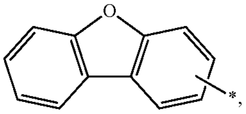
(D14)
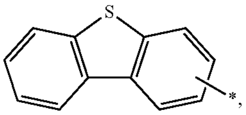
(D15)
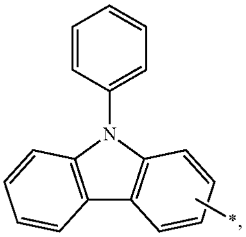
-continued
(D16)
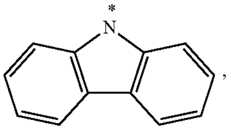
wherein the asterix "*" denotes the binding position.
14. The organic electronic device according to claim 11, wherein the matrix compound of formula (II) or formula (III) are selected from F1 to F18:
(F1)
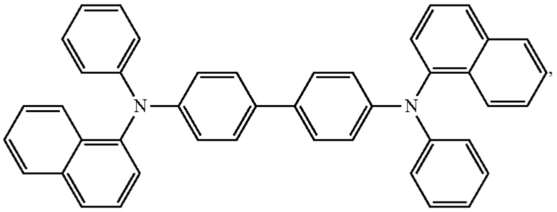
(F2)
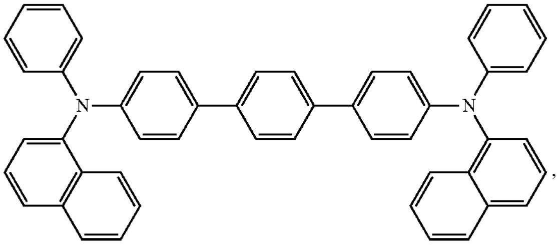
(F3)
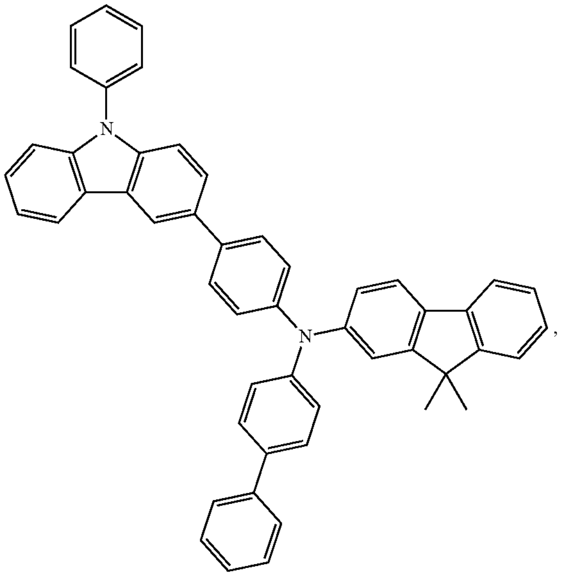

-continued
(F4)
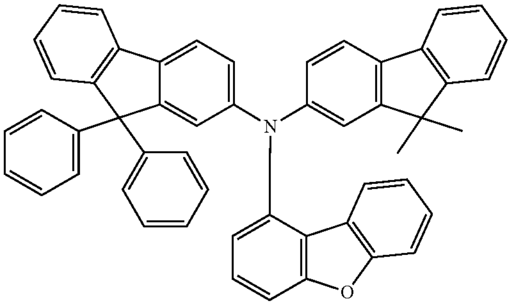
,
(F5)
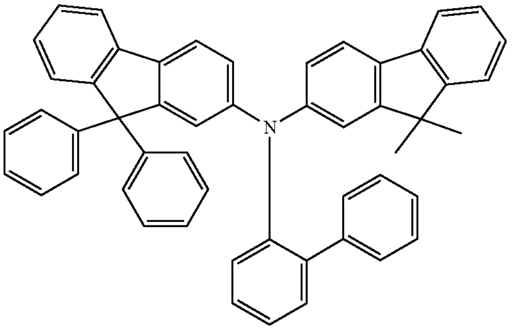
,
(F6)
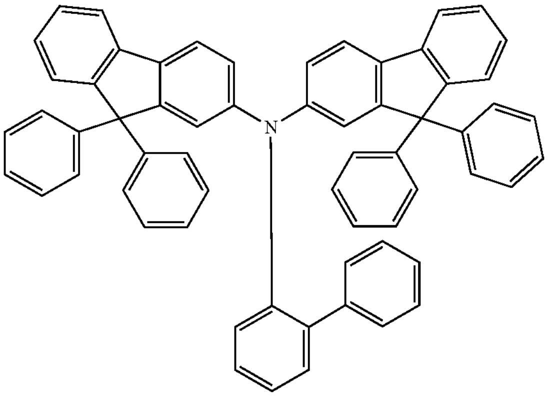
,
(F7)
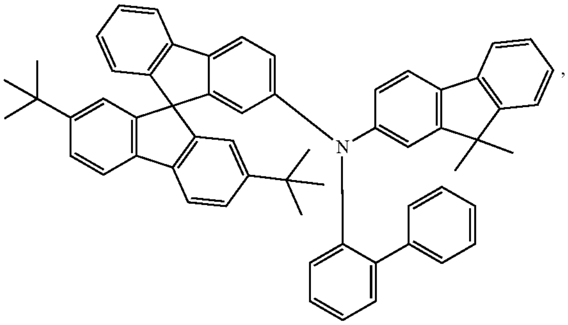
,
-continued
(F8)
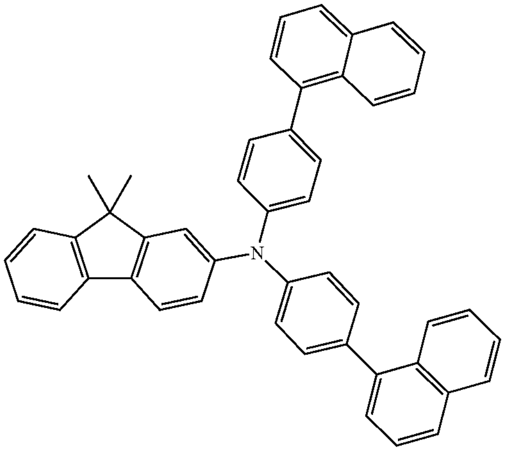
,
(F9)
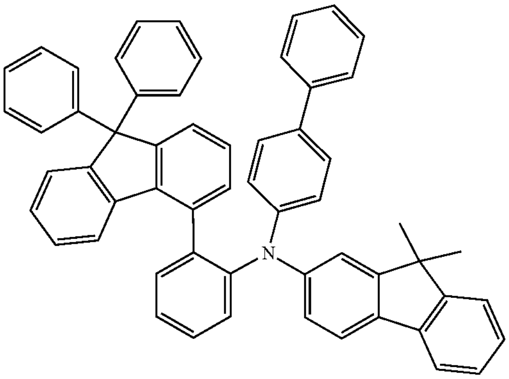
,
(F10)
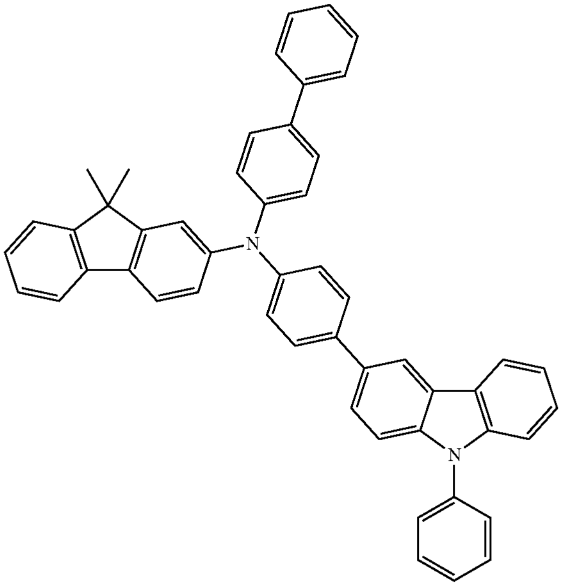
, -continued
(F11)
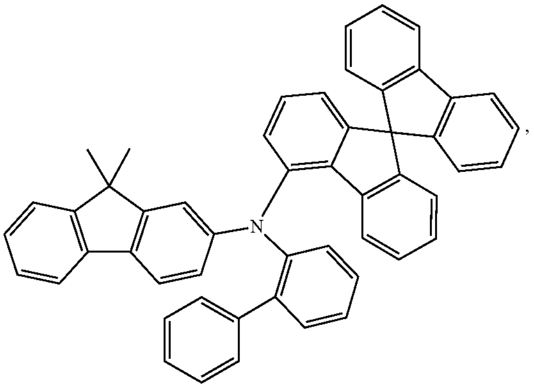
(F12)
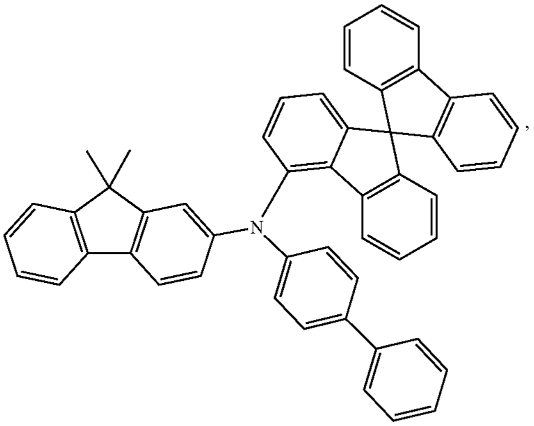
(F13)
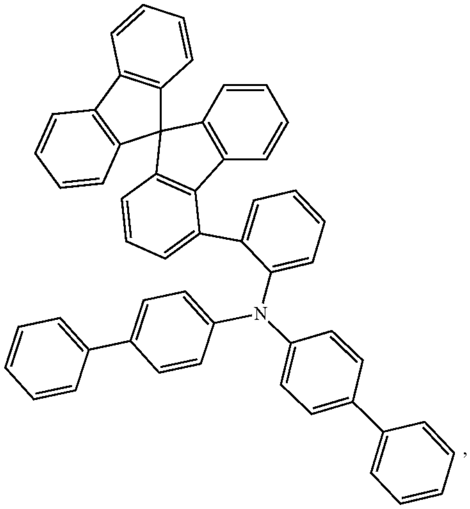
-continued
(F14)
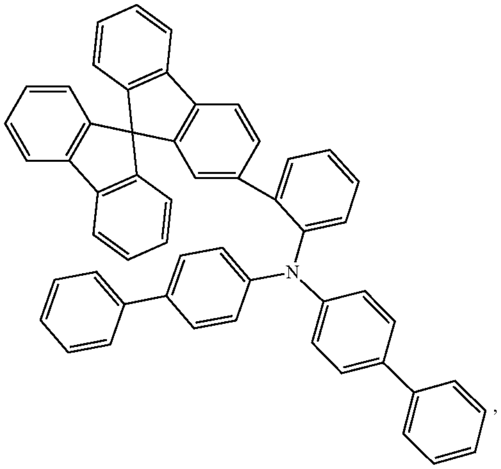
(F15)
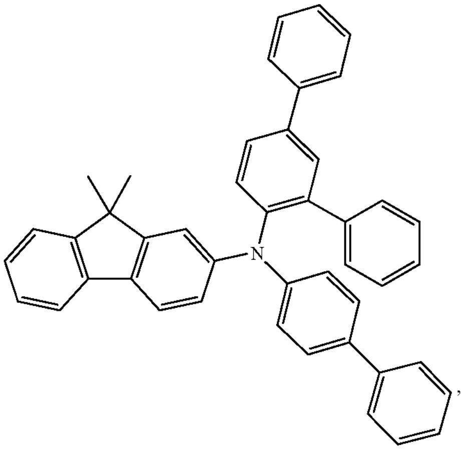
(F16)
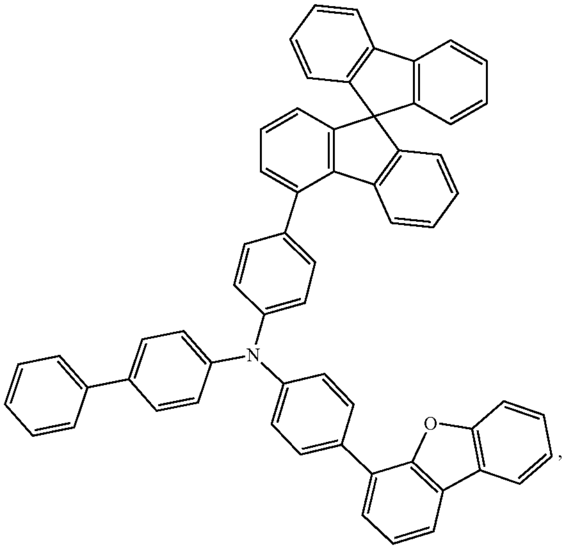

-continued (F17)

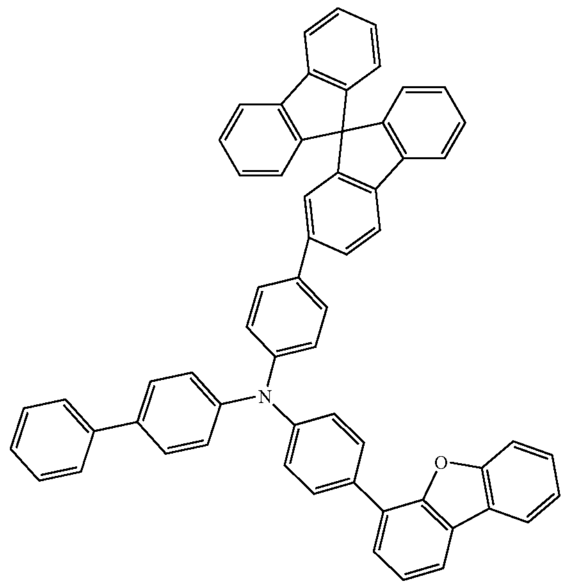

(F18)

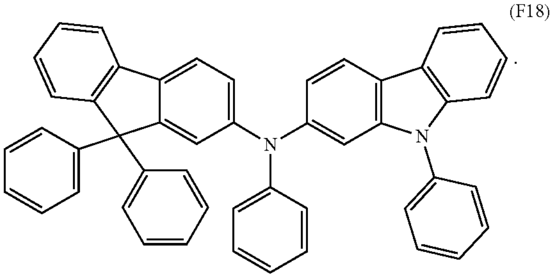

15. The organic electronic device according to claim 1, wherein n in formula (I) is an integer from 2 to 4.

16. The organic electronic device according to claim 1, wherein the metal complex is selected from the following formulas (Ia) to (Id):

(Ia)

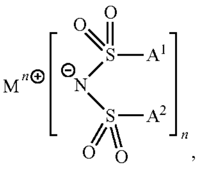

(Ib)

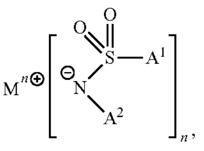

(Ic)

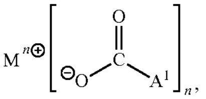

(Id)

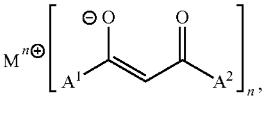

wherein

M is a metal ion;

n is the valency of M;

$A^1$ and $A^2$ are independently selected from substituted or unsubstituted Cito $C_{12}$ alkyl, substituted or unsubstituted $C_6$ to $C_{12}$ aryl, substituted or unsubstituted $C_3$ to $C_{12}$ heteroaryl;

wherein the substituents of $A^1$ and $A^2$ are independently selected from D, $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy, $COR^1$, $COOR^1$, halogen, or CN, wherein $R^1$ is selected from $C_6$ aryl, $C_3$ to $C_9$ heteroaryl, $C_1$ to $C_6$ alkyl, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkyl, partially or perdeuterated $C_1$ to $C_6$ alkoxy.

17. The organic electronic device according to claim 16, wherein at least one of $A^1$ and $A^2$ comprises a substituent, wherein at least one of the substituents of $A^1$ and $A^2$ is independently selected from $C_3$ to $C_9$ heteroaryl, $C_1$ to $C_6$ alkoxy, $C_3$ to $C_6$ branched alkoxy, $C_3$ to $C_6$ cyclic alkoxy, partially or perfluorinated $C_1$ to $C_{16}$ alkyl, partially or perfluorinated $C_1$ to $C_{16}$ alkoxy, partially or perdeuterated $C_1$ to $C_6$ alkoxy, $COR^1$, $COOR^1$, halogen, or CN.

18. The organic electronic device according to claim 1, wherein the ligand L is independently selected from G1 to G66:

(G1)

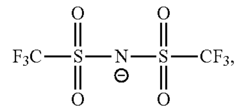

(G2)

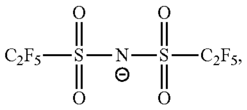

(G3)

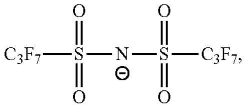

(G4)

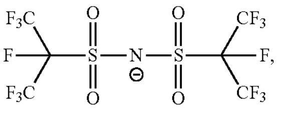

(G5)

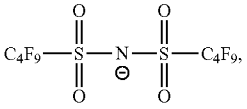

(G6)

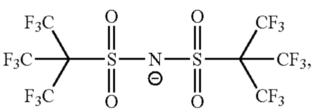

-continued
(G7)
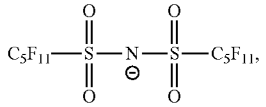
(G8)
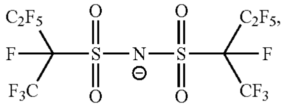
(G9)
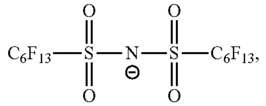
(G10)
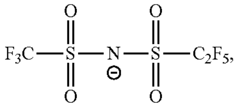
(G11)
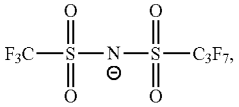
(G12)
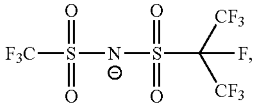
(G13)
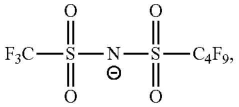
(G14)
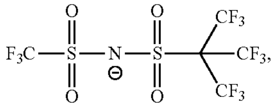
(G15)
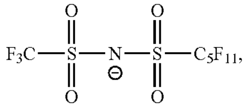
(G16)
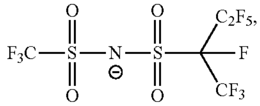
(G17)
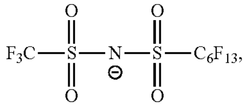
(G18)
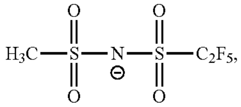
(G19)
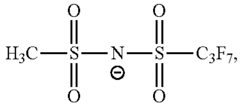
-continued
(G20)
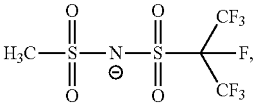
(G21)
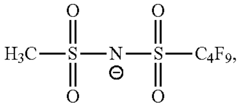
(G22)
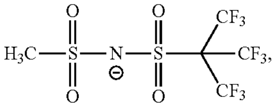
(G23)
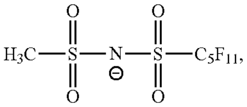
(G24)
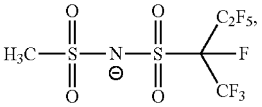
(G25)
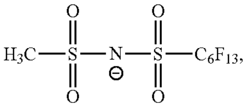
(G26)
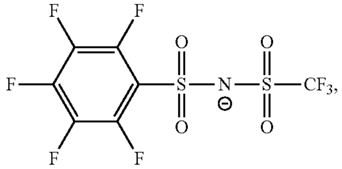
(G27)
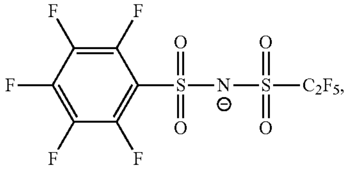
(G28)
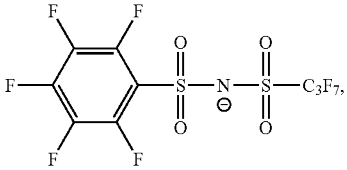
(G29)
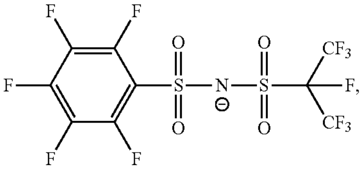
(G30)
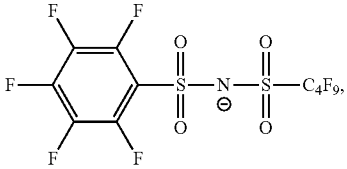

-continued
(G31)
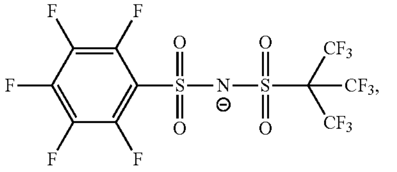
(G32)
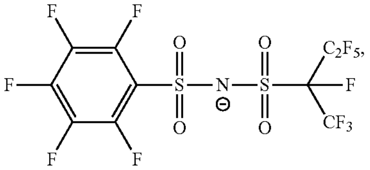
(G33)
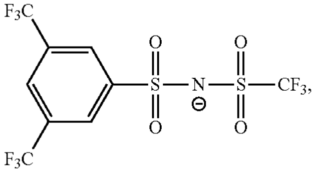
(G34)
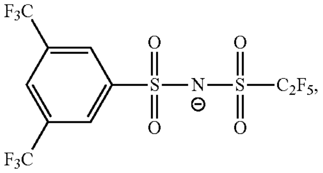
(G35)
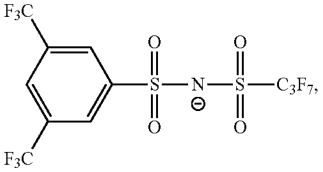
(G36)
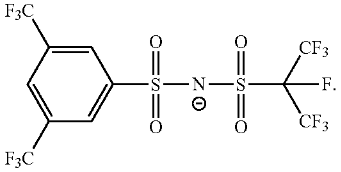
(G37)
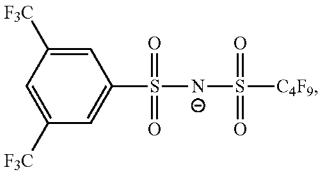
(G38)
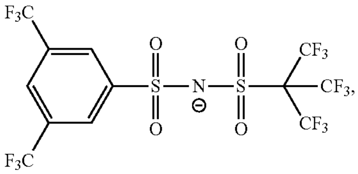
-continued
(G39)
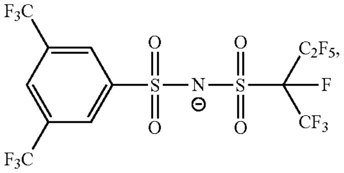
(G40)
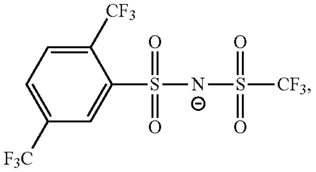
(G41)
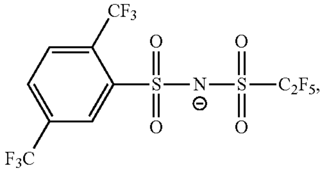
(G42)
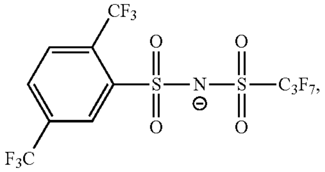
(G43)
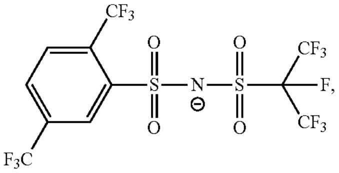
(G44)
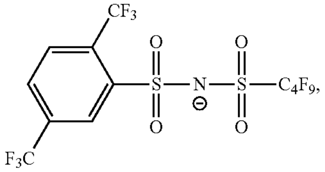
(G45)
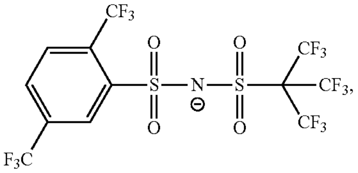
(G46)
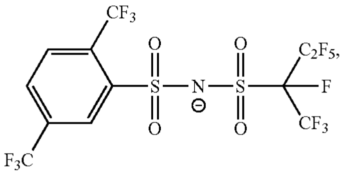

-continued
(G47)
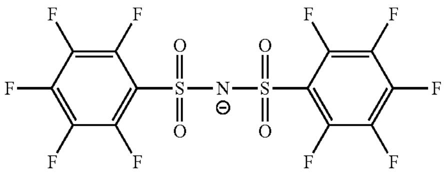
(G48)
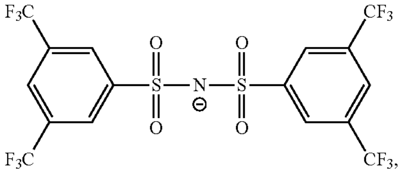
(G49)
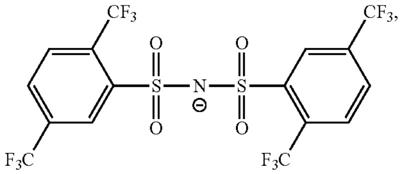
(G50)
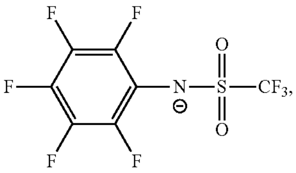
(G51)
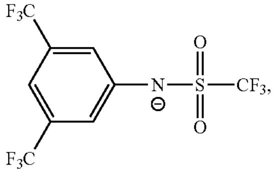
(G52)
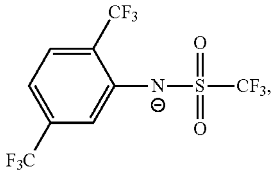
(G53)
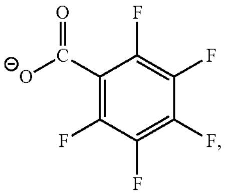
(G54)
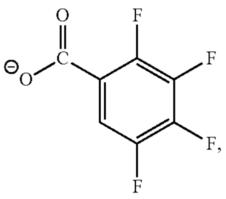
-continued
(G55)
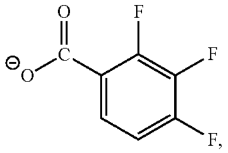
(G56)
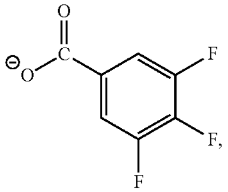
(G57)
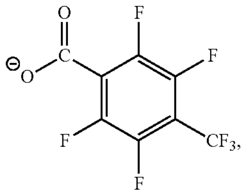
(G58)
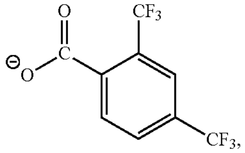
(G59)
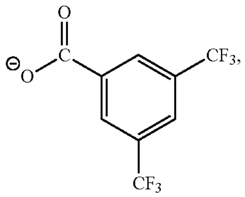
(G60)
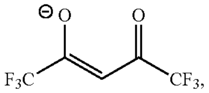
(G61)
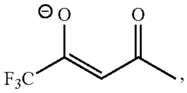
(G62)
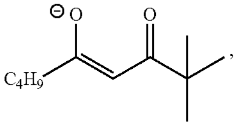
(G63)
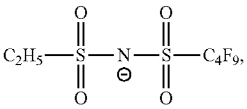
(G64)
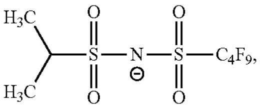

-continued (G65)

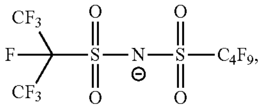

(G66)

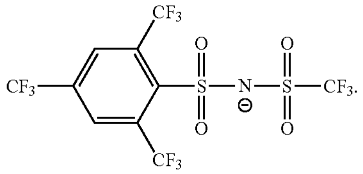

19. The organic electronic device according to claim 1, wherein metal complex is selected from:

Li TFSI, K TFSI, Cs TFSI, Ag TFSI, $Mg(TFSI)_2$, $Mn(TFSI)_2$, $Sc(TFSI)_3$, $Mg[N(SO_2{}^iC_3F_7)_2]_2$, $Zn[N(SO_2{}^iC_3F_7)_2]_2$, $Ag[N(SO_2{}^iC_3F_7)_2]$, $Ag[N(SO_2C_3F_7)_2]$, $Ag[N(SO_2C_4F_9)_2]$, $Ag[N(SO_2CF_3)(SO_2C_4F_9)]$, $Cs[N(SO_2C_4F_9)_2]$, $Mg[N(SO_2C_4F_9)_2]_2$, $Ca[N(SO_2C_4F_9)_2]_2$, $Ag[N(SO_2C_4F_9)_2]$, $Cu[N(SO_2{}^iC_3F_7)_2]_2$, $Cu[N(SO_2C_3F_7)_2]_2$, $Cu[N(SO_2CF_3)(SO_2C_4F_9)]_2$, $Mg[N(SO_2CF_3)(SO_2C_4F_9)]_2$, $Mn[N(SO_2CF_3)(SO_2C_4F_9)]_2$, $Cu[N(SO_2CH_3)(SO_2C_4F_9)]_2$, $Ag[N(SO_2CH_3)(SO_2C_4F_9)]$,

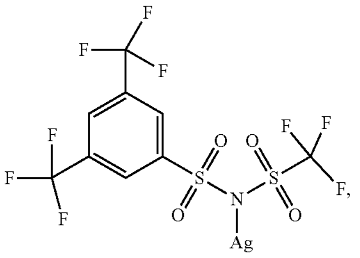

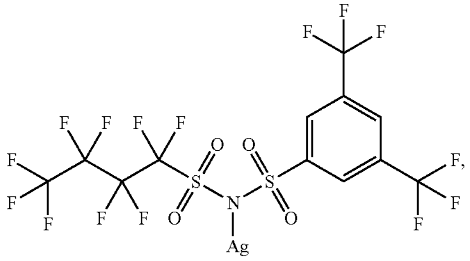

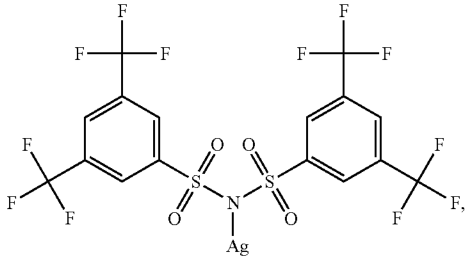

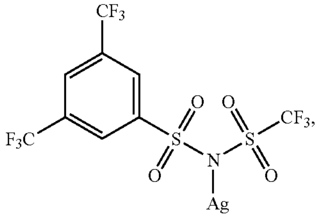

-continued

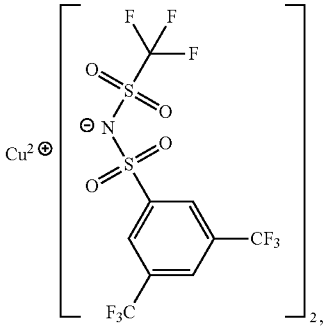

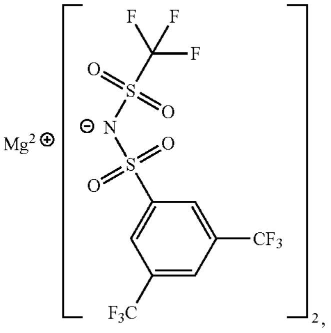

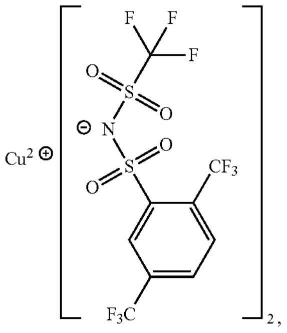

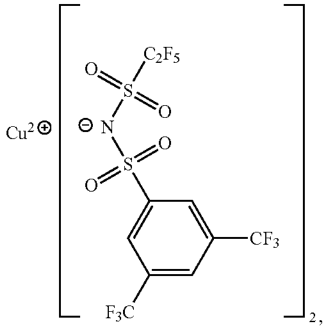

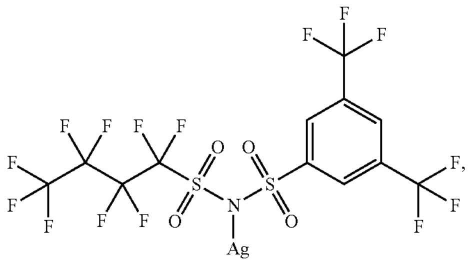

-continued

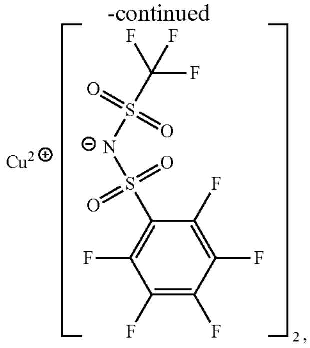

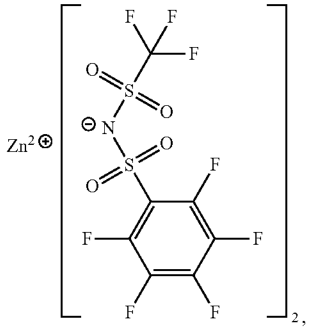

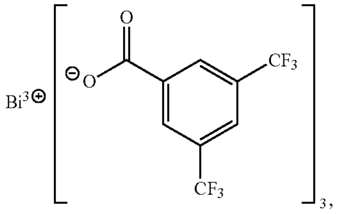

$Cu[N(SO_2C_2H_5)(SO_2C_4F_9)]_2$, $Cu[N(SO_2{}^iC_3H_7)(SO_2C_4F_9)]_2$, $Cu[N(SO_2{}^iC_3F_7)(SO_2C_4F_9)]_2$,

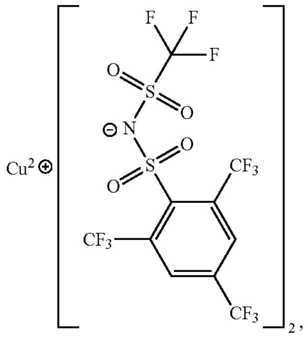

-continued

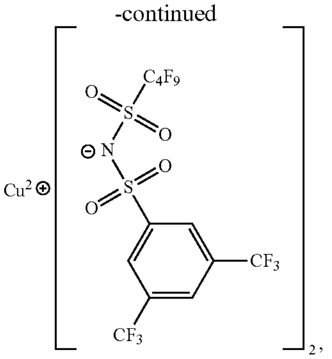

wherein "$^i$" denotes "iso".

20. The organic electronic device according to claim 1, wherein the hole injection layer comprises a first hole injection sub-layer comprising the metal complex of formula (I) and a second hole injection sub-layer comprising a matrix compound, wherein the first hole injection sub-layer is arranged closer to the anode layer and the second hole injection sub-layer is arranged closer to the at least one emission layer.

21. The organic electronic device according to claim 1, wherein the hole injection layer comprises a first hole injection sub-layer consists of the metal complex of formula (I) and a second hole injection sub-layer comprising a matrix compound, wherein the first hole injection sub-layer is arranged closer to the anode layer and the second hole injection sub-layer is arranged closer to the at least one emission layer.

22. The organic electronic device according to claim 1, wherein the organic electronic device further comprises a hole transport layer, wherein the hole transport layer is arranged between the hole injection layer and the at least one emission layer.

23. The organic electronic device according to claim 22, wherein the hole transport layer comprises a matrix compound, or a matrix compound that is in the hole injection layer and hole transport layer are the same.

24. The organic electronic device according to claim 1, wherein the organic electronic device is a light emitting device or a display device.

25. The organic electronic device according to claim 1, wherein halogen is F.

26. The organic electronic device according to claim 16, wherein halogen is F.

27. The organic electronic device according to claim 17, wherein halogen is F.

* * * * *